(12) United States Patent
Lee et al.

(10) Patent No.: US 9,437,483 B2
(45) Date of Patent: Sep. 6, 2016

(54) METHODS FOR FORMING ETCH STOP LAYERS, SEMICONDUCTOR DEVICES HAVING THE SAME, AND METHODS FOR FABRICATING SEMICONDUCTOR DEVICES

(71) Applicant: Samsung Electronics Co., Ltd., Suwon-si (KR)

(72) Inventors: Jaegoo Lee, Suwon-si (KR); Youngwoo Park, Seoul (KR)

(73) Assignee: Samsung Electronics Co., Ltd. (KR)

(*) Notice: Subject to any disclaimer, the term of this patent is extended or adjusted under 35 U.S.C. 154(b) by 45 days.

(21) Appl. No.: 14/218,091

(22) Filed: Mar. 18, 2014

(65) Prior Publication Data

US 2014/0197470 A1    Jul. 17, 2014

Related U.S. Application Data

(62) Division of application No. 13/238,319, filed on Sep. 21, 2011, now Pat. No. 8,704,288.

(30) Foreign Application Priority Data

Nov. 17, 2010  (KR) .................. 10-2010-0114548

(51) Int. Cl.
  *H01L 21/4763*  (2006.01)
  *H01L 21/768*   (2006.01)
  *H01L 27/115*   (2006.01)

(52) U.S. Cl.
  CPC ... *H01L 21/76832* (2013.01); *H01L 27/11519* (2013.01); *H01L 27/11548* (2013.01);
  (Continued)

(58) Field of Classification Search
  CPC ................................ H01L 21/76832

USPC ......................................... 438/634
See application file for complete search history.

(56) References Cited

U.S. PATENT DOCUMENTS 7,539,056 B2    5/2009   Katsumata et al.
7,821,058 B2   10/2010   Kidoh et al.
(Continued)

FOREIGN PATENT DOCUMENTS

CN        101055875      10/2007
JP          6338602      12/1994
(Continued)

OTHER PUBLICATIONS

"Methods for Forming Etch Stop Layers, Semiconductor Devices Having the same, and Methods for Fabricating Semiconductor Devices" Specification, Drawing, Claims and Prosecution History of U.S. Appl. No. 13/238,319, filed Sep. 21, 2011 by Jaegoo Lee et al.

*Primary Examiner* — Matthew Landau
*Assistant Examiner* — Igwe U Anya
(74) *Attorney, Agent, or Firm* — Onello & Mello, LLP

(57) ABSTRACT

A plurality of vertical channels of semiconductor material are formed to extend in a vertical direction through the plurality of insulation layers and the plurality of conductive patterns, a gate insulating layer between the conductive pattern and the vertical channels that insulates the conductive pattern from the vertical channels. Conductive contact regions of the at least two of the conductive patterns are in a stepped configuration. An etch stop layer is positioned on the conductive contact regions, wherein the etch stop layer has a first portion on a first one of the plurality of conductive patterns and has a second portion on a second one of the plurality of conductive patterns, wherein the first portion is of a thickness that is greater than a thickness of the second portion.

23 Claims, 57 Drawing Sheets

(52) U.S. Cl.
CPC ... *H01L27/11551* (2013.01); *H01L 27/11556* (2013.01); *H01L 27/11565* (2013.01); *H01L 27/11575* (2013.01); *H01L 27/11578* (2013.01); *H01L 27/11582* (2013.01)

(56) References Cited

U.S. PATENT DOCUMENTS

| | | | |
|---|---|---|---|
| 7,847,342 | B2 | 12/2010 | Fukuzumi et al. |
| 7,936,004 | B2 | 5/2011 | Kito et al. |
| 8,198,672 | B2 | 6/2012 | Alsmeier |
| 8,551,838 | B2 | 10/2013 | Kito et al. |
| 8,564,050 | B2 | 10/2013 | Park et al. |
| 2007/0252201 | A1 | 11/2007 | Kito et al. |
| 2008/0173932 | A1 | 7/2008 | Kidoh et al. |
| 2008/0175032 | A1* | 7/2008 | Tanaka ............... G11C 5/025 365/51 |
| 2008/0180994 | A1 | 7/2008 | Katsumata et al. |
| 2009/0020744 | A1 | 1/2009 | Mizukami et al. |
| 2009/0146206 | A1 | 6/2009 | Fukuzumi et al. |
| 2009/0242967 | A1 | 10/2009 | Katsumata et al. |
| 2010/0039865 | A1* | 2/2010 | Kidoh ............... H01L 21/8221 365/185.23 |
| 2011/0062510 | A1* | 3/2011 | Joo ............... H01L 27/11578 257/324 |
| 2011/0121403 | A1* | 5/2011 | Lee ............... H01L 27/11526 257/390 |
| 2011/0199813 | A1* | 8/2011 | Yoo ............... G11C 5/02 365/148 |
| 2011/0284947 | A1 | 11/2011 | Kito et al. |
| 2011/0287597 | A1 | 11/2011 | Kito et al. |

FOREIGN PATENT DOCUMENTS

| | | |
|---|---|---|
| JP | 2008171918 | 7/2008 |
| JP | 2009135324 | 6/2009 |

* cited by examiner

METHODS FOR FORMING ETCH STOP LAYERS, SEMICONDUCTOR DEVICES HAVING THE SAME, AND METHODS FOR FABRICATING SEMICONDUCTOR DEVICES

CROSS-REFERENCE TO RELATED APPLICATIONS

This application is a divisional application of U.S. patent application Ser. No. 13/238,319, filed on Sep. 21, 2011, which claims the benefit of Korean patent application number 10-2010-0114548, filed on Nov. 17, 2010, in the Korean Intellectual Property Office, the contents of which applications are incorporated herein in their entirety by reference.

BACKGROUND

The present disclosure herein relates to a semiconductor device, and more particularly, to a method for forming an etch stop layer, a semiconductor device having the same, and a method for fabricating a semiconductor device.

Higher integration of semiconductor devices is needed for satisfying consumer demands for superior performance and cost reduction. In the case of semiconductor memory devices, heightened integration is especially important, since integration is an important factor in determining product price. In the case of typical two-dimensional, or planar, memory semiconductor devices, since their integration is primarily determined by the circuit area occupied by a unit memory cell, integration is greatly influenced by the ability to form fine patterns. However, since extremely expensive semiconductor equipment is required for further advancement of pattern fineness, further integration of two-dimensional memory devices is impractical. As an alternative to address the limitations associated with two-dimensional devices, three-dimensional semiconductor memory devices have been proposed.

SUMMARY

In one aspect a memory device comprises: a substrate extending in a horizontal direction; a plurality of insulation layers on the substrate; a plurality of conductive patterns, each of at least two of the conductive patterns between a neighboring lower insulation layer and a neighboring upper insulation layer; a plurality of vertical channels of semiconductor material extending in a vertical direction through the plurality of insulation layers and the plurality of conductive patterns, a gate insulating layer between the conductive pattern and the vertical channels that insulates the conductive pattern from the vertical channels; the at least two of the conductive patterns having a conductive contact region, conductive contact regions of the at least two of the conductive patterns being in a stepped configuration so that a contact region of a neighboring lower conductive pattern extends in the horizontal direction beyond a contact region of a neighboring upper conductive pattern; and an etch stop layer on the conductive contact regions, wherein the etch stop layer has a first portion on a first one of the plurality of conductive patterns and has a second portion on a second one of the plurality of conductive patterns, wherein the first portion is of a thickness that is greater than a thickness of the second portion.

In some embodiments, the conductive patterns comprise gate patterns.

In some embodiments, the first one of the plurality of conductive patterns is at a layer above a layer of the second one of the plurality of conductive patterns.

In some embodiments, the first portion of the etch stop layer comprises multiple layers and wherein the second portion of the etch stop layer comprises one or more layers, the number of layers of the second portion being fewer in number than the number of layers of the first portion.

In some embodiments, at least two layers of the multiple layers of the etch stop layer comprise different materials.

In some embodiments, at least two layers of the multiple layers of the etch stop layer comprise a same material.

In some embodiments, the etch stop layer further has a third portion on a third one of the plurality of conductive patterns, wherein the second portion is of a thickness that is greater than a thickness of the third portion.

In some embodiments, the first one of the plurality of conductive patterns is at a layer above a layer of the second one of the plurality of conductive patterns, and wherein the second one of the plurality of conductive patterns is at a layer above a layer of the third one of the plurality of conductive patterns.

In some embodiments, the first portion of the etch stop layer comprises multiple layers, wherein the second portion of the etch stop layer comprises multiple layers, and wherein the third portion of the etch stop layer comprises one or more layers, the number of layers of the third portion being fewer in number than the number of layers of the second portion and the number of layers of the second portion being fewer in number than the number of layers of the first portion.

In some embodiments, the memory device further comprises: an upper insulator on the conductive contact regions of the conductive patterns; and a plurality of vertical interconnects, at least one of the plurality of vertical interconnects contacting one of the conductive contact regions of the conductive patterns through the upper insulator and through the etch stop layer.

In some embodiments, the plurality of vertical interconnects contact conductive interconnect lines of the memory device.

In some embodiments, one or more of the conductive interconnect lines of the memory device comprise word lines of the memory device.

In some embodiments, the conductive patterns comprise gate patterns, wherein: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate corresponding to a same vertical channel comprise control gates of memory cell transistors of a common string of the memory device; control gates of memory cell transistors sharing a same layer of the device arranged in horizontal direction of the semiconductor device are connected to provide word lines of the memory device; memory cell transistors of a common string of the memory device are coupled together in series by the vertical channel; upper-most gate patterns arranged in a first horizontal direction of the semiconductor device are connected to provide select lines of the memory device; upper portions of vertical channels arranged in a second horizontal direction of the semiconductor device are connected to provide bit lines of the memory device.

In some embodiments, a next-upper-most gate pattern below the upper-most gate pattern comprises a second upper select gate of a second upper select transistor.

In some embodiments, a next-lower-most gate pattern above the lower-most gate pattern comprises a second lower select gate of a second upper select transistor.

In some embodiments, the gate insulating layer includes a charge storage layer and wherein the memory device comprises a non-volatile memory device.

In some embodiments, the charge storage layer extends in a vertical direction between the conductive pattern and the vertical channel.

In some embodiments, the charge storage layer further extends in a horizontal direction between the conductive pattern and a neighboring upper or lower insulation layer.

In some embodiments, the charge storage layer comprises at least one type selected from the group consisting of a trap insulation layer, a floating gate, and an insulation layer including conductive nano-dots.

In some embodiments, at least one of the conductive patterns of intermediate layers between an uppermost conductive pattern of the plurality of conductive patterns and a lowermost of the plurality of conductive patterns form a continuous plate.

In some embodiments, at least one of the conductive patterns of intermediate layers between an uppermost conductive pattern of the plurality of conductive patterns and a lowermost conductive pattern of the plurality of conductive patterns includes a plurality of line portions that are connected to each other, each line portion being parallel to other line portions.

In some embodiments, the etch stop layer is positioned at a single side of the memory device.

In some embodiments, the etch stop layer is positioned at more than one side of the memory device.

In some embodiments, the vertical channels comprise a unitary conductive material.

In some embodiments, the vertical channels comprise a conductive outer layer surrounding an insulative inner core.

In some embodiments, the etch stop layer comprises a material that has a high degree of etch selectivity relative to at least one of silicon oxide, silicon nitride, polysilicon and silicided polysilicon.

In some embodiments, the etch stop layer material comprises at least one material selected from: AlO, SiC, SiOC, ZrO, $HfO_2$, BST, and BN.

In some embodiments, at least one of the conductive patterns of a portion of intermediate layers between an uppermost conductive pattern of the plurality of conductive patterns and a lowermost conductive pattern of the plurality of conductive patterns forms a continuous plate; wherein the uppermost conductive patterns include a plurality of line portions that are connected to each other, each line portion being parallel to other line portions.

In some embodiments, the gate insulating layer includes a charge storage layer and wherein the semiconductor device comprises a non-volatile memory device.

In some embodiments, the charge storage layer extends in a vertical direction between the conductive pattern and the vertical channel along a sidewall of the vertical channel.

In one aspect, a method of fabricating a memory device comprises: providing a plurality of insulation layers on a substrate extending in a horizontal direction; providing a plurality of conductive layers, each of at least two of the conductive layers between a neighboring lower insulation layer and a neighboring upper insulation layer; providing a plurality of vertical channels of semiconductor material extending in a vertical direction through the plurality of insulation layers and the plurality of conductive layers; providing a gate insulating layer between each of the at least two of the conductive layers and the vertical channels that insulates the at least two of the conductive layers from the vertical channels; etching the at least two of the conductive layers to form at least two conductive patterns and conductive contact regions of the at least two of the conductive patterns, the conductive contact regions of the at least two of the conductive patterns being in a stepped configuration so that a contact region of a neighboring lower conductive pattern extends in the horizontal direction beyond a contact region of a neighboring upper conductive pattern; and providing an etch stop layer on the conductive contact regions, the etch stop layer having a first portion on a first one of the plurality of conductive patterns and having a second portion on a second one of the plurality of conductive patterns, wherein the first portion is of a thickness that is greater than a thickness of the second portion.

In some embodiments, etching each conductive layer comprises: providing a first mask on the plurality of conductive layers and the plurality of insulation layers; first etching a first one of a plurality of the conductive layers using the first mask as an etch mask; first trimming the first mask to expose an upper portion of the first one of the plurality of the conductive layers; and second etching the first one of the plurality of the conductive layers and a second one of the plurality of the conductive layers using the trimmed first mask as an etch mask.

In some embodiments, the method further comprises repeatedly first trimming the first mask layer and second etching the first one of the plurality of conductive layers and a second one of the plurality of the conductive layers to thereby etch further conductive layers of the plurality of conductive layers lying below the first one and the second one of the conductive layers.

In some embodiments, the method further comprises: providing a first etch stop layer on a first set of the conductive layers etched by the trimming and second etching steps; providing a second mask on the first etch stop layer; third etching a third one of a plurality of the conductive layers using the second mask as an etch mask; second trimming the second mask to expose an upper portion of the third one of the plurality of the conductive layers; and fourth etching the third one of the plurality of the conductive layers and a fourth one of the plurality of the conductive layers using the trimmed first mask as an etch mask.

In some embodiments, the method further comprises repeatedly second trimming the second mask layer and fourth etching the third one of the plurality of conductive layers and a fourth one of the plurality of the conductive layers to thereby etch further conductive layers of the plurality of conductive layers lying below the third one and the fourth one of the plurality of conductive layers.

In some embodiments, the method further comprises: providing a second etch stop layer on the first etch stop layer and on a second set of the conductive layers etched by the second trimming and fourth etching steps.

In some embodiments, portions of the first etch stop layer and second etch stop layer remain on the conductive contact regions of the first set of the conductive layers to provide the first portion of the etch stop layer; and portions of the second etch stop layer remain on the conductive contact regions of the second set of the conductive layers to provide the second portion of the etch stop layer.

In some embodiments, etching each conductive layer comprises: providing a first mask on the plurality of conductive layers and the plurality of insulation layers; first etching a first one of the plurality of the conductive layers using the first mask as an etch mask; first applying a first sidewall to the first mask and the first one of the plurality of conductive layers etched by the first etching process to form a second mask; and second etching a second one of the plurality of the conductive layers lying below the first one of the plurality of conductive layers using the second mask as an etch mask.

In some embodiments, the method further comprises repeatedly applying a sidewall to a most recent mask and to a most recently etched one of the plurality of conductive layers and etching an underlying one of the plurality of conductive layers using the sidewall and the most recent mask as an etch mask.

In some embodiments, the method further comprises: providing a first etch stop layer on a first set of the conductive layers etched by the first applying and second etching steps; providing a second mask on the first etch stop layer; third etching a third one of the plurality of the conductive layers using the second mask as an etch mask; second applying a sidewall to the second mask and the third one of the plurality of conductive layers etched by the third etching process to form a third mask; and fourth etching a fourth one of the plurality of the conductive layers lying below the third one of the plurality of conductive layers using the third mask as an etch mask.

In some embodiments, the method further comprises repeatedly applying a sidewall to a most recent second mask and to a most recently etched one of the plurality of conductive layers and etching an underlying one of the plurality of conductive layers using the sidewall and the most recent second mask as an etch mask.

In some embodiments, the method further comprises: providing a second etch stop layer on the first etch stop layer and on a second set of the conductive layers etched by the second applying and fourth etching steps.

In some embodiments: portions of the first etch stop layer and second etch stop layer remain on the conductive contact regions of the first set of the conductive layers to provide the first portion of the etch stop layer; and portions of the second etch stop layer remain on the conductive contact regions of the second set of the conductive layers to provide the second portion of the etch stop layer.

In some embodiments, the first one of the plurality of conductive patterns is at a layer above a layer of the second one of the plurality of conductive patterns.

In some embodiments, providing the etch stop layer comprises providing the first portion of the etch stop layer to include multiple layers and providing the second portion of the etch stop layer to include one or more layers, the number of layers of the second portion being fewer in number than the number of layers of the first portion.

In some embodiments, the method further comprises: providing an upper insulator on the conductive contact regions of the conductive patterns; and providing a plurality of vertical interconnects, each vertical interconnect contacting one of the conductive contact regions of the conductive patterns through the upper insulator and through the etch stop layer.

In some embodiments, the plurality of vertical interconnects contact conductive interconnect lines comprising word lines of the memory device.

In some embodiments, providing a plurality of the conductive layers comprises providing the conductive patterns of intermediate layers between an uppermost conductive pattern of the plurality of conductive patterns and a lowermost conductive pattern of the plurality of conductive patterns to each form a continuous plate.

In some embodiments, providing the plurality of conductive layers comprises providing the conductive patterns of intermediate layers between an uppermost conductive pattern of the plurality of conductive patterns a lowermost conductive pattern of the plurality of conductive patterns to each include a plurality of line portions that are connected to each other, each line portion being parallel to other line portions.

In some embodiments, providing a plurality of vertical channels precedes etching each conductive layer to form the conductive patterns.

In some embodiments, providing a plurality of vertical channels is performed subsequent to etching each conductive layer to form the conductive patterns.

In some embodiments, providing a conductive insulating layer comprises: prior to providing the plurality of conductive layers: providing a plurality of sacrificial layers on the substrate, each sacrificial layer between a neighboring lower insulation layer and a neighboring upper insulation layer; providing the plurality of vertical channels extending in the vertical direction through the plurality of insulation layers and the plurality of sacrificial layers; providing the plurality of vertical openings through the insulation layers and sacrificial layers between the vertical channels; providing a first etching process to remove remaining portions of the sacrificial layers exposed by the vertical opening, the first etching process exposing portions of outer sidewalls of the plurality of vertical channels; providing the conductive insulating layer on the outer sidewalls of the vertical channel; and providing the plurality of conductive layers in the channel recesses of the vertical channel.

In some embodiments, providing the plurality of conductive layers comprises: forming the conductive patterns of intermediate layers between an uppermost conductive pattern of the plurality of conductive patterns and a lowermost conductive pattern of the plurality of conductive patterns to each form a continuous plate; and etching an uppermost conductive pattern of the plurality of conductive patterns to include a plurality of line portions that are connected to each other, each line portion being parallel to other line portions.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a substrate extending in a horizontal direction; a plurality of insulation layers on the substrate; a plurality of conductive patterns, each of at least two of the conductive patterns between a neighboring lower insulation layer and a neighboring upper insulation layer; a plurality of vertical channels of semiconductor material extending in a vertical direction through the plurality of insulation layers and the plurality of conductive patterns, a gate insulating layer between the conductive pattern and the vertical channels that insulates the conductive pattern from the vertical channels; the at least two of the conductive patterns having a conductive contact region, conductive contact regions of the plurality of the at least two conductive patterns being in a stepped configuration so that a contact region of a neighboring lower conductive pattern extends in the horizontal direction beyond a contact region of a neighboring upper conductive pattern; and an etch stop layer on the conductive contact regions, wherein the etch stop layer has a first portion on a first one of the plurality of conductive patterns and has a second portion on a second one of the plurality of conductive patterns, wherein the first portion is of a thickness that is greater than a thickness of the second portion.

In another aspect, a multiple-layered device comprises: a substrate extending in a horizontal direction; a plurality of insulation layers on the substrate; a plurality of conductive patterns, each of at least two of the conductive patterns between a neighboring lower insulation layer and a neighboring upper insulation layer; the at least two of the conductive patterns having conductive contact regions that are in a stepped configuration so that a contact region of a neighboring lower conductive pattern extends in the horizontal direction beyond a contact region of a neighboring upper conductive pattern; and an etch stop layer on the at least two of the conductive contact regions, wherein the etch stop layer has a first portion on a first one of the plurality of conductive patterns and has a second portion on a second one of the plurality of conductive patterns, wherein the first portion is of a thickness that is greater than a thickness of the second portion.

In some embodiments, the device further comprises: a plurality of vertical channels of semiconductor material extending in a vertical direction through the plurality of insulation layers and the plurality of conductive patterns; and a gate insulating layer between the conductive pattern and the vertical channels that insulates the conductive patterns from the vertical channels.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

DETAILED DESCRIPTION OF EMBODIMENTS

Figure 1A:
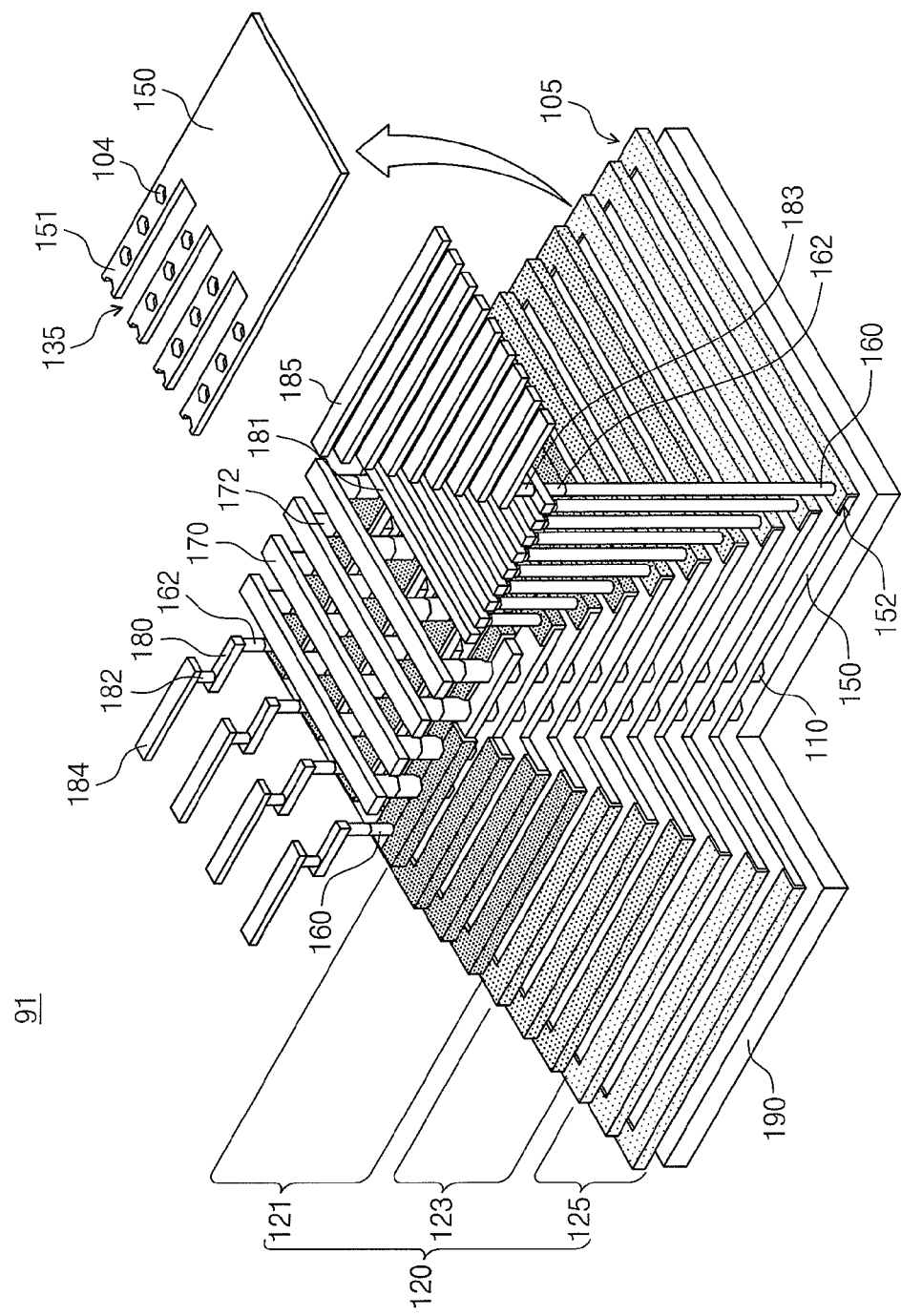
FIGS. 1A and 1B are perspective views illustrating a semiconductor device according to an embodiment of the inventive concept.

Hereinafter, a method for forming an etch stop layer, a semiconductor device including the same, and a method for fabricating a semiconductor device according to exemplary embodiments of the inventive concept will be described below in more detail with reference to the accompanying drawings.

The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

Device Embodiment 1

Figure 1B:
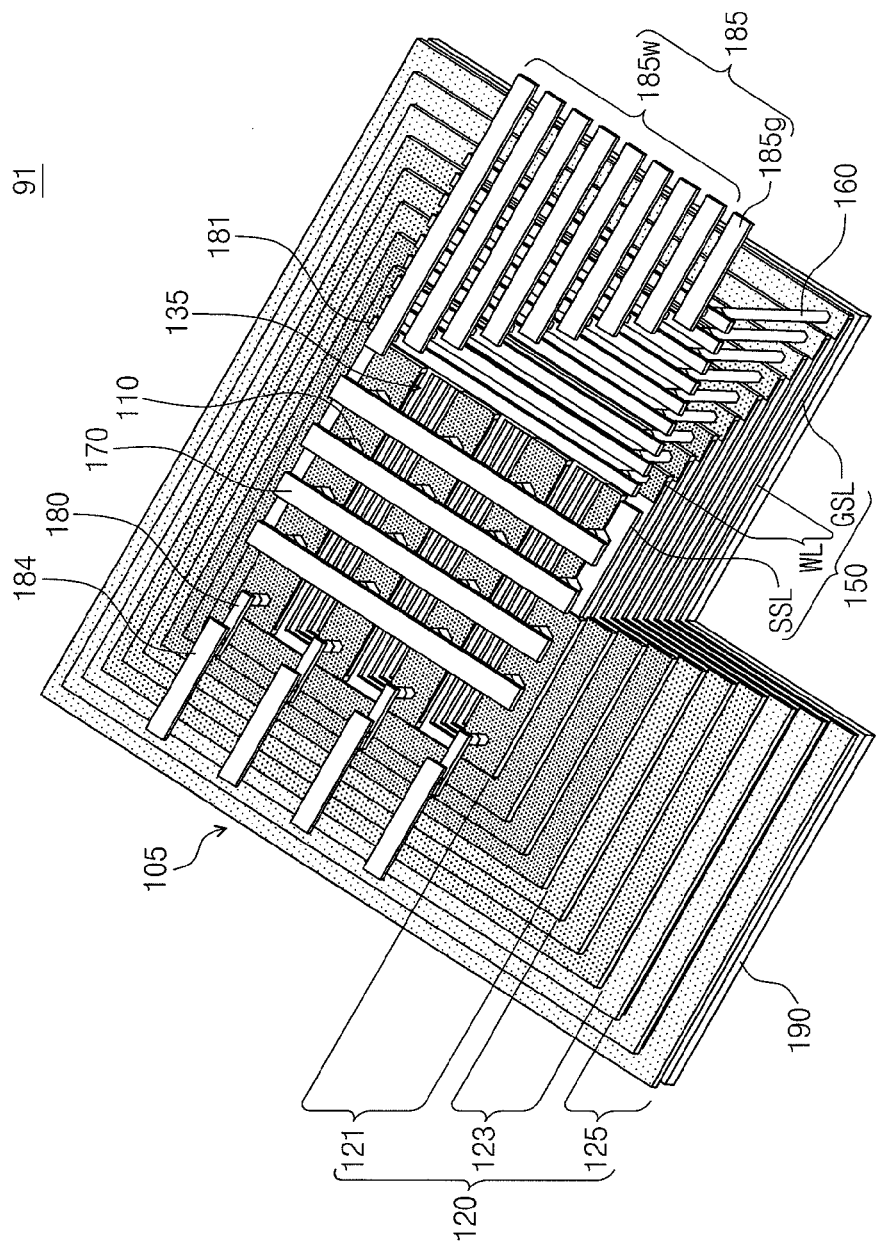

Referring to FIGS. 1A and 1B, a semiconductor device 91 may include a plurality of vertical channels 110 provided on a semiconductor substrate 190, a plurality of conductive patterns 150 stacked along the extending direction of the vertical channels 110. In this example embodiment, the conductive patterns 150 comprise gates of the device 1, and constitute word lines WL and select lines SSL and GSL of the device. Also shown are a plurality of bit lines 170 electrically connected to the vertical channels 110.

Lower portions of the vertical channels 110 may be connected to the semiconductor substrate 190, respectively. Upper portions of different groupings of the vertical channels 110 may be connected to a common bit line 170 via contact pads 172, respectively. The gates 150 of each layer of the device may collectively form a ground selection line GSL as a conductive layer nearest in proximity to the semiconductor substrate 190, a string selection line SSL as a conductive layer nearest in proximity to the bit line 170, and a plurality of word lines WL as conductive layers positioned between the layers of the ground selection line GSL and the string selection line SSL. The ground selection line GSL, the word lines WL, and the string selection line SSL are vertically spaced apart from each other along one of the vertical channels 110, and may be electrically connected in series to each other to form a cell string (see reference 72 of FIG. 1J, discussed below). In some embodiments, all of the word lines WL may be associated with the gates of memory cells. Alternatively, a subset of the word lines WL, for example those word lines closest to the selection lines SSL and GSL may be associated with dummy cells, and the other word lines WL may be associate with the gates of memory cells. In this manner, the semiconductor device 91 may comprise a flash memory device including a cell array in which a plurality of memory cells are vertically connected in series to each other. In other embodiments, the semiconductor device 91 may comprise a another type of multiple-layered device having a plurality of conductive patterns on different layers of the device.

The semiconductor device 91 may include a plurality of contact regions, or contacts 160, which connect the various lines GSL, WL and SSL of the conductive patters of the various layers to driving circuits. The contact 160 may be a plug type such as a vertical pillar. The lower portion of the contact 160 may be connected to the conductive pattern 150 at its contact region, and the upper portion thereof may be electrically connected to metal lines 184 and 185 which are in turn connected to the driving circuits. As an example, the contacts 160 may be connected to the metal lines 184 and 185 via pads 162. The metal lines 184 and 185 may include, for example, a first metal line 184 electrically connecting the string selection line SSL to a string selection line driving circuit, and a second metal line 185 connecting the word lines WL and the ground selection line GSL to a word line driving circuit and a ground selection line driving circuit, respectively. As shown in FIG. 1B, the second metal line 185 may include a metal line 185g connecting the ground selection line GSL to the ground selection line driving circuit, and metal lines 185w connecting the word lines WL to the word line driving circuit.

In addition, intermediate metal lines 180 and 181 may be further disposed between the contacts 160 and the metal lines 184 and 185. The intermediate lines 180 and 181 may function as re-distribution, or interconnect, lines. In some embodiments, the intermediate metal lines 180 and 181 may include a first intermediate metal line 180 electrically connected to the first metal line 184, and a second intermediate metal line 181 electrically connected to the second metal line 185. The first intermediate metal line 180 may be connected to the first metal line 184 via a pad 182, and the second intermediate metal line 180 may be connected to the second metal line 185 via a pad 183.

Figure 3A:
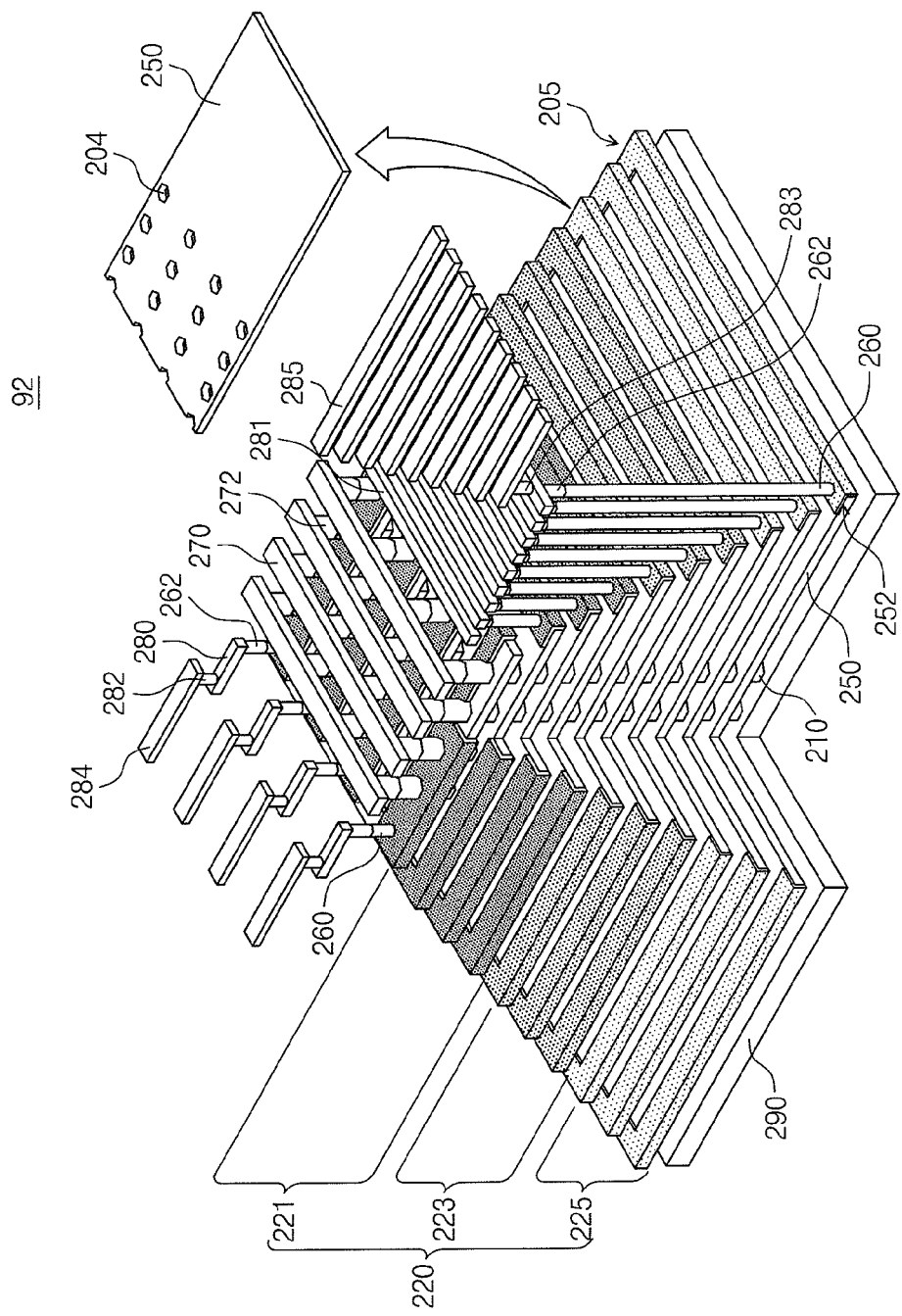
FIGS. 3A and 3B are perspective views illustrating a semiconductor device according to an embodiment of the inventive concept.

In various embodiments, one of the conductive patterns, or gates, 150 forming the ground selection line GSL and the conductive patters 150 forming the string selection line SSL may have a line shape, for example, as shown in the configuration 150 of FIG. 1A, and the other may have a plate shape, for example as shown in the configuration 250 of FIG. 3A. Alternatively, all of the conductive patterns 150 may be configured in a line shape. Similarly, the conductive patterns forming the word line WL may have a line shape or a plate shape. In the present embodiment depicted in FIGS. 1A, 1B, the conductive pattern 150 forming the string selection line SSL may have a line shape, and the conductive patterns 150 forming the word line WL ground selection line GSL may have a substantially rectangular plate shape. In some embodiments, the conductive pattern 150 forming the word line WL and the ground selection line GSL may have a rectangular plate shape including branches 151, or line portions, that are parallel to each other and spaced apart from each other by a word line cut 135. A plurality of channel holes 104 through which the vertical channels 110 pass may be formed in the branches 151 of the conductive patterns.

Figure 1C:
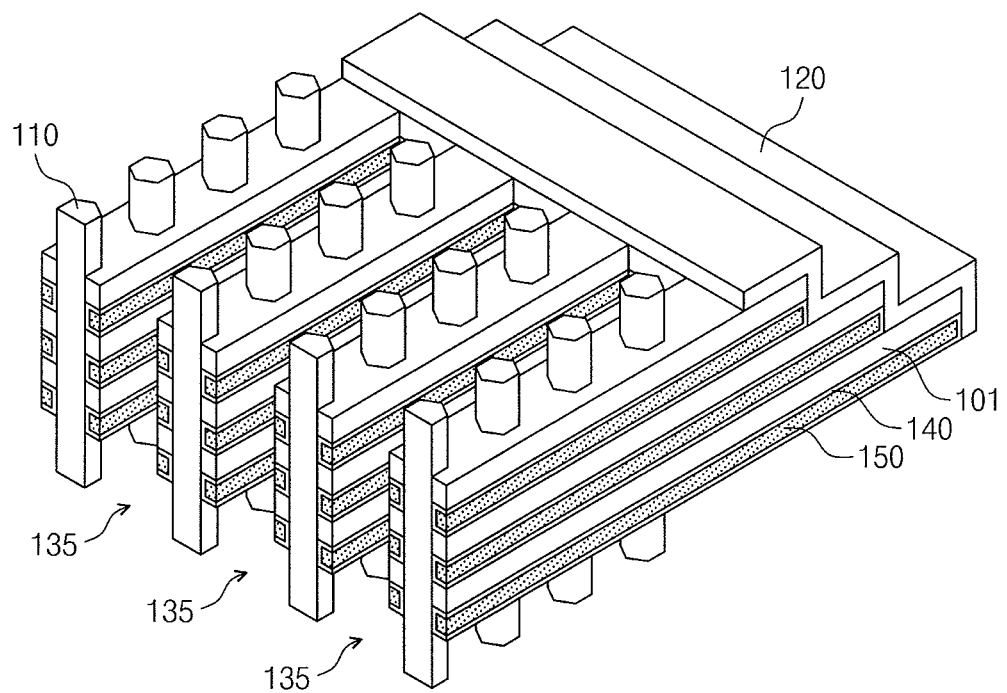
FIGS. 1C through 1G are magnified views illustrating a portion of a semiconductor device according to various embodiments of the inventive concept.

The conductive patterns 150 of the word lines WL and selection lines GSL, SSL may have the same thicknesses, or different thicknesses. In one embodiment, the conduction patterns 150 forming the word lines WL may have a first thickness, and the conduction patterns 150 forming the selection lines GSL and SSL may have a second thickness smaller than or greater than the first thickness. As one example, the second thickness may be greater than the first thickness. Insulation layers 140 may be positioned between the conductive patterns 150 as shown in FIG. 1C, and the respective insulation layers may have the same, or different thicknesses. As a result of consistency or variation in the thicknesses of the insulation layers 140, the vertical distances between the conductive patterns 150 may be equal to or different from each other. In one embodiment, the insulation layers 140 may have the same thicknesses regardless of their positions. In another embodiment, the insulation layers 140 positioned between the word lines WL may have a third thickness and the insulation layer 140 between the word line WL and the ground selection line GSL and/or the word line WL and the string selection line SSL may have a fourth thickness smaller than or greater than the third thickness. As one example, the fourth thickness can be greater than the third thickness.

The conductive patterns, or gates, 150 may form a gate stack 105 of a pyramid structure, four sides of which have a stair-type profile. In this configuration, each conductive pattern 150 is not fully covered by the conductive pattern 150 disposed thereon, but instead is partially exposed, for example at an end portion thereof. In this sense, the a lower conductive pattern can be said to extend in the horizontal direction of extension of the substrate beyond a neighboring, upper conductive pattern. The exposed portion of the conductive pattern 150 that is not covered by a neighboring, upper conductive pattern, may comprise a contact region, for example, a pad 152 to which the contact 160 is connected. As described above, since the conductive patterns 150 are stacked in a stair-shaped profile, the contact regions 152 may also have a stair-shaped profile. Accordingly, the respective heights of the contacts 160 connected to the contact regions 152 vary, depending on the position in the stack of the corresponding conductive pattern 150 and contact region 152. A conductive pattern 150 that is lower in the gate stack 105 requires a contact 160 of greater height than that required for a conductive pattern that is higher in the stack 105. As a result, during an etching process for forming contact holes (see contact holes 137 of FIG. 4J), contact regions 152 of conductive patters 150 positioned at a higher level of the gate stack may become over-etched, while forming the contact holes 137 for the contact regions 152 of the various layers. In accordance with embodiments of the present inventive concepts, the semiconductor device 91 may therefore include an etch stop layer 120 that covers the contact regions 152 to prevent over-etching during formation of the contact holes 137.

The etch stop layer 120 may be shaped, or otherwise configured, so as to cover the respective contact regions 152 and/or outer side edges of the conductive patterns 150. In one embodiment, the etch stop layer 120 that covers a conductive pattern comprising a word line WL and the ground selection line GSL having a substantially rectangular plate shape may have a shape that covers at least an outer edge upper portion of the contact region 152 and the side edge of the gates or conductive patterns 150. In addition, the etch stop layer 120 that covers the string selection lines SSL having a line shape may have a shape that surrounds the upper surface and opposite side edges of the SSL conductive patterns 150. Particularly, the etch stop layer 120 that covers the outermost string selection lines SSL may have a shape that surrounds the upper surface, opposite side edges, and outer side surfaces of the string selection lines SSL. Although it is represented in FIGS. 1A and 1B that the etch stop layer 120 is separated or partitioned in the vertical direction, in embodiments, the etch stop layer 120 may have a continuously stepped structure, as shown in the cross-sectional perspective view of FIG. 1C.

In various embodiments, the etch stop layer 120 may have a thickness that varies, depending on the layer of the conductive patterns 150 with which it corresponds, or, alternatively, may vary in thickness. In one embodiment, the etch stop layer 120 may have the substantially same thickness regardless of whether it corresponds with conductive patterns associate with the string selection line SSL, the word lines WL, or the ground selection line GSL. In another embodiment, the etch stop layer 120 may have thickness that is greatest for a first portion that covers contact regions of the upper layer or layers nearest the string selection line SSL and upper word lines WL, that is less for a second portion that covers contact regions of an intermediate layer or layers associated with intermediate word lines WL, and that is least for a third portion that covers contact regions of the lower layer or layers nearest the ground selection line GSL and lower word lines WL. In another embodiment, the etch stop layer 120 may have an incrementally reduced thickness in the order of the string selection line SSL, the word lines WL, and the ground selection line GSL, and its thickness may vary by section.

According to the present embodiment, the etch stop layer 120 may have different thicknesses in accordance with portions, or sections. For example, the etch stop layer 120 may be divided into a plurality of portions 121, 123, and 125, and its portions 121, 123 and 125 may have substantially a same thickness. In one embodiment, the etch stop layer 120 may be partitioned into a first portion 121 having a first thickness, a second portion 123 having a second thickness that is less than the first thickness, and a third section 125 having a third thickness that is less than the second thickness, in the order from upper layers to lower layers, for example in the order from the string selection line SSL to the ground selection line GSL. The first section 121 may cover the string selection line SSL or the string selection line SSL and at least one word line WL nearest the string selection line SSL with a greater first thickness. The third section 125 may cover the ground selection line GSL or the ground selection line GSL and at least one word line nearest the ground selection line GSL, with a smaller third thickness. The second section 123 may cover layers intermediate the above mentioned layers, including, for example, the other word lines WL, with a second thickness that is intermediate the first thickness and the second thickness.

According to embodiments of the present inventive concepts, the string selection line SSL may be covered with the etch stop layer 120. Particularly, the thickness of the etch stop layer 120 covering the string selection line SSL can be the thickest portion thereof. Accordingly, the string selection line SSL may be protected from damage due to etch or polishing applied to the edges and/or corners of the cell array. Accordingly, the process margin of the semiconductor device 91 can be increased, and the electrical characteristics of the semiconductor device 91 can be improved. In another embodiment, the etch stop layer 120 may include the first section 121 and the second section 123 of different thicknesses, and need not include a third section 125. In this case, for example, the ground selection line GSL, or the ground selection line GSL and at least one of the lower word lines WL thereon are not be covered with the etch stop layer 120.

The etch stop layer 120 may be configured as a mono-layer or single layer. In other embodiments, the etch stop layer 120 may be configured as a multi-layer or multiple layer. In other embodiments, the etch stop layer 120 may be configured to have portions that are a single layer and portions that are a multi-layer. According to embodiments of the present inventive concepts depicted in FIGS. 1A and 1B, the etch stop layer 120 may include a combination of a multi-layer and a mono-layer. For example, the first section 121 may be formed of a triple-layer, the second section 123 may be formed of a dual-layer, and the third second 125 may be formed of a mono-layer. An example of this multi-layer structure of the etch stop layer 120 may be understood by referring to FIGS. 5A through 5Q.

Figure 1D:
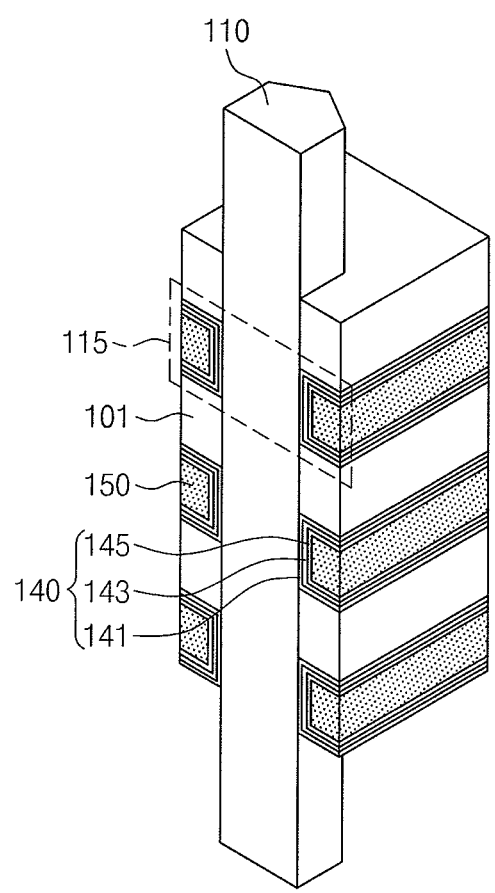

Referring to FIGS. 1C and 1D, a plurality of insulation layers 101 may be disposed between the conductive patterns 150, and a gate insulating layer, for example, an information storage layer 140 may be disposed between the vertical channels 110 and the conductive patterns 150. In this example, the conductive patterns 150 operate as gates for the semiconductor device 1, which is configured as a memory device. The information storage layer 140 may include a charge storage layer 143 surrounding an edge surface of the conductive pattern 150, between the conductive pattern and the vertical channel 110. For example, the charge storage layer 143 may be one of a trap insulation layer, a floating gate, and an insulation layer including a conductive nanodot configuration. According to an embodiment, the information storage layer 140 may further include a tunnel insulation layer 141 and a blocking insulation layer 145. The gates 150 may be vertically stacked to form a plurality of memory cells 115 that are connected in series in the direction of extension of the vertical channel 110. As described above, the etch stop layer 120 may be configured in the shape of a continuous step pattern. The etch stop layer 120 may be formed of an insulating material having an etch selectivity with respect to the insulation layers 101. When the etch stop layer 120 is formed of a multi-layer or a combination of a multi-layer or a mono-layer, a plurality of layers forming the multi-layer may include the same material or different materials.

Figure 1E:
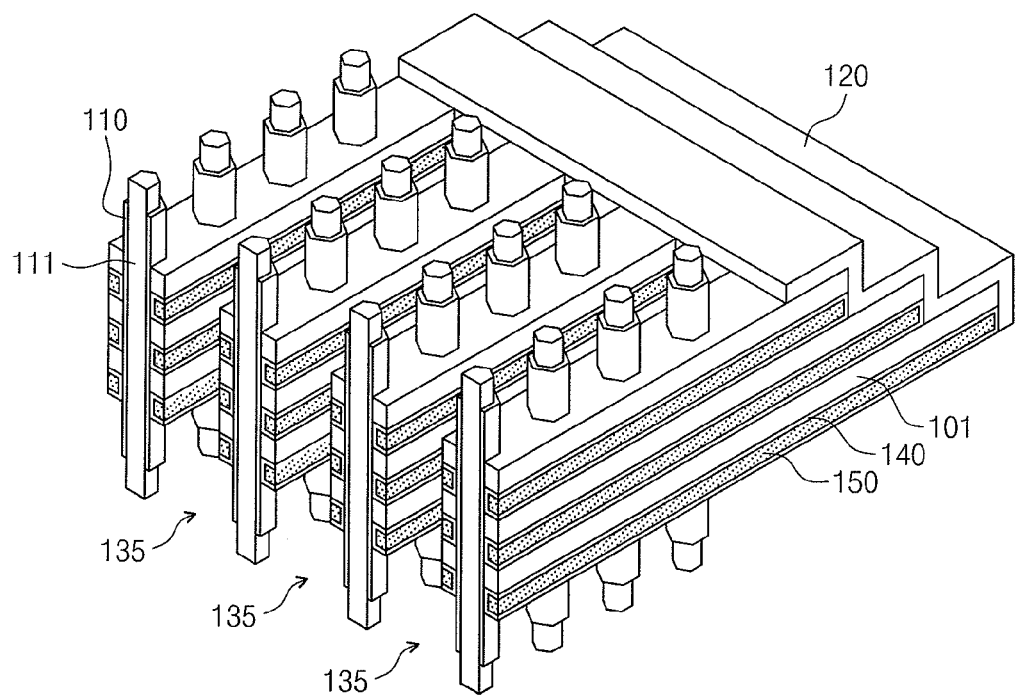

Referring to FIG. 1E, the vertical channel 110a may have a macaroni structure having an insulator 111 therein. Since the insulator 111 occupies the interior of the vertical channel 110, the vertical channel 110 may have a thickness that is reduced, relative to the thickness of the structure of the vertical channel of FIG. 1D. This reduced-thickness macaroni structure may help to reduce the trap sites of carriers, thereby improving the electrical characteristics of the resulting device.

Figure 1F:
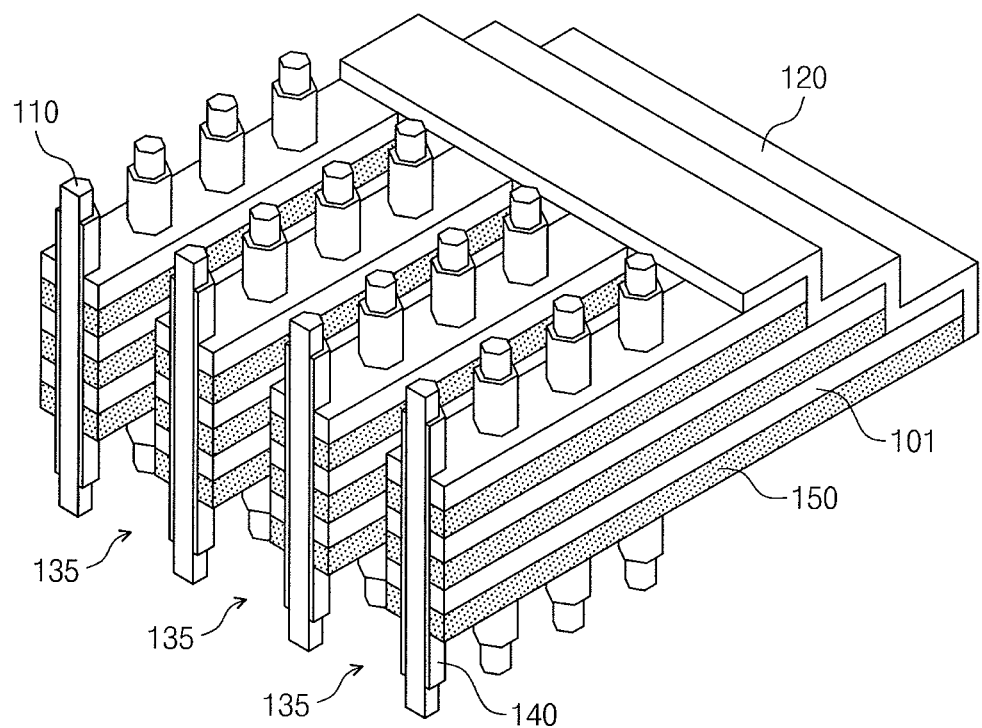
Figure 1G:
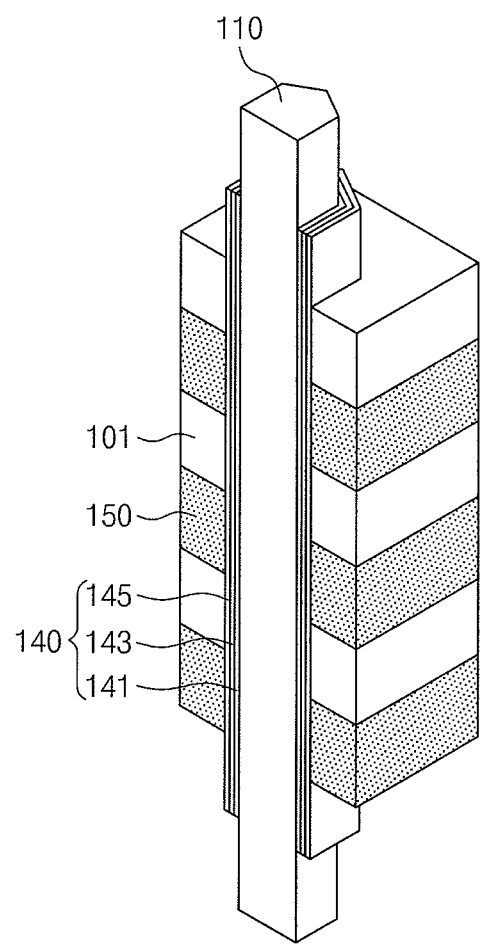

Referring to FIGS. 1F and 1G, the information storage layer 140 may have a structure that vertically extends along the sidewall of the vertical channel 110. In this configuration, since the information storage layer 140 is not formed between the insulation layers 101, the resulting vertical distance between the insulation layers 101 can be reduced, thereby reducing the entire vertical height of the semiconductor device 1. The information storage layer 140 may include a tunnel insulation layer 141 contacting the vertical channel 110, a blocking insulation layer 145 contacting the gates 150, and a charge storage layer 143 formed between the tunnel insulation layer 141 and the blocking insulation layer 145. The vertical channel 110 may have a bulk structure like that of FIG. 1C, or a macaroni structure like that of FIG. 1E.

Device Embodiment 2

Figure 1H:
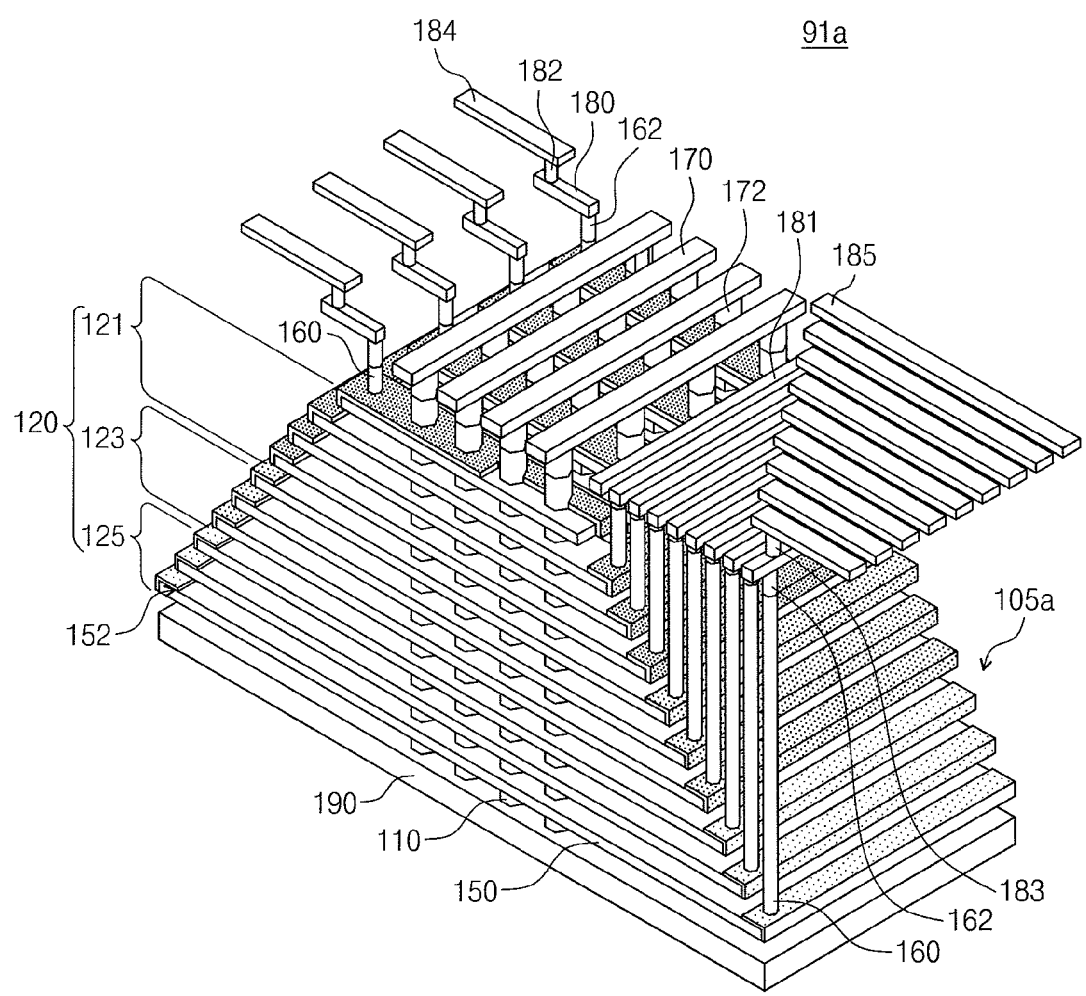
FIG. 1H is a perspective view illustrating a semiconductor device according to an embodiment of the inventive concept.

Referring to FIG. 1H, a semiconductor device 91a may include a plurality of vertical channels 110 that extend in a vertical direction relative to a semiconductor substrate 190, and a gate stack 105*a* in which gates 150 are vertically stacked along the extending direction of the vertical channel 110. The gate stack 105*a* may include etch stop layers 120 that have a vertically stacked stair-shape at two opposed sides thereof. In one example, the etch stop layers 120 may extend in a horizontal direction that is substantially in line with the direction of extension of the bit lines 170, and can be at opposite ends of conductive patterns 150 that extend in a direction that substantially intersects the direction of extension of the bit lines 170. In this example embodiment, the etch stop layer 120 covering the gate stack 105*a* has a stepped structure on two sides of the memory device. Any of the embodiments of the inventive concepts depicted herein can be applied to the configuration of the embodiment of FIG. 1H.

Device Embodiment 3

Figure 1I:
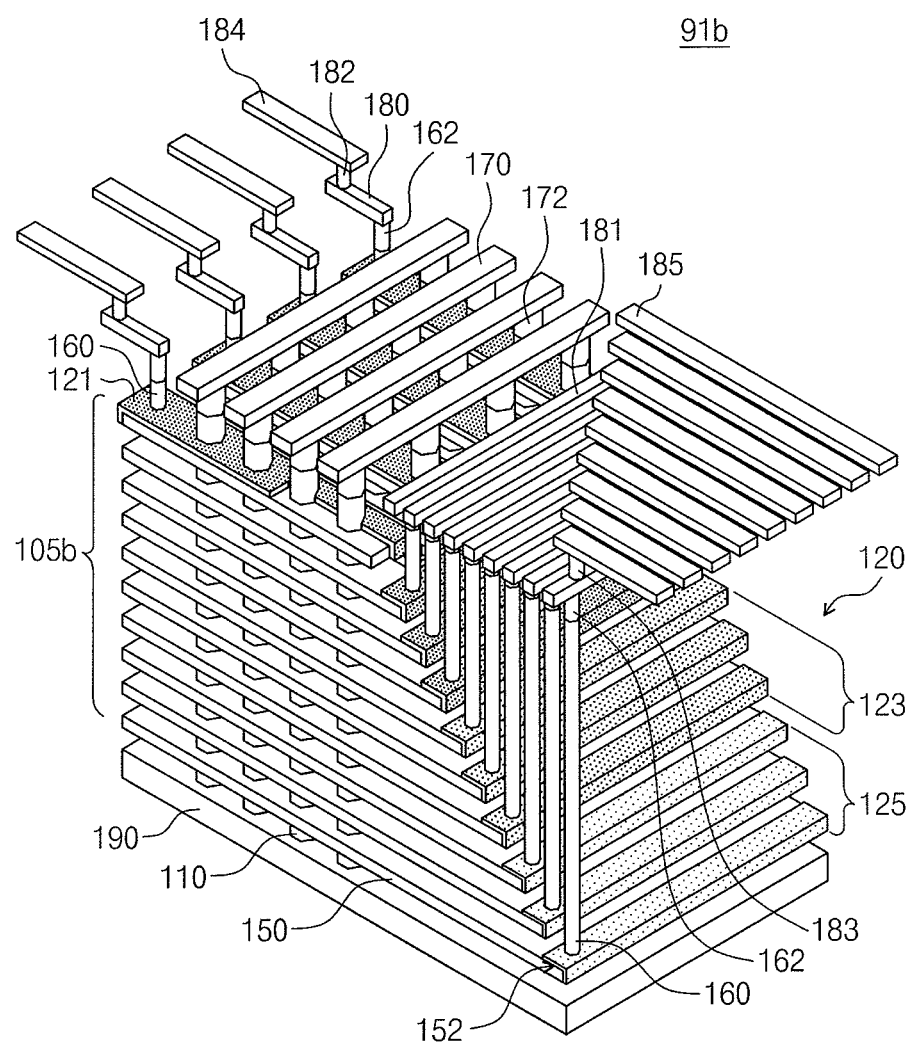
FIG. 1I is a perspective view illustrating a semiconductor device according to an embodiment of the inventive concept.

Referring to FIG. 1I, a semiconductor device 91*b* may include a gate stack 105*b* in which gates 150 are stacked along the extending direction of a vertical channel 110 over a semiconductor substrate 190. In this embodiment, the gate stack 105*a* may include etch stop layers 120 that have a vertically stacked stair-shape at one side thereof. In one example, the etch stop layers 120 may extend in a horizontal direction that substantially in line with the direction of extension of the bit lines 170, and can be at one end of the conductive patterns 150 that extend in a direction that substantially intersects the direction of extension of the bit lines 170. In this example embodiment, the etch stop layer 120 covering the gate stack 105*a* has a stepped structure on one side of the memory device. Any of the embodiments of the inventive concepts depicted herein can be applied to the configuration of the embodiment of FIG. 1H.

<Equivalent Circuit Diagram>

Figure 1J:
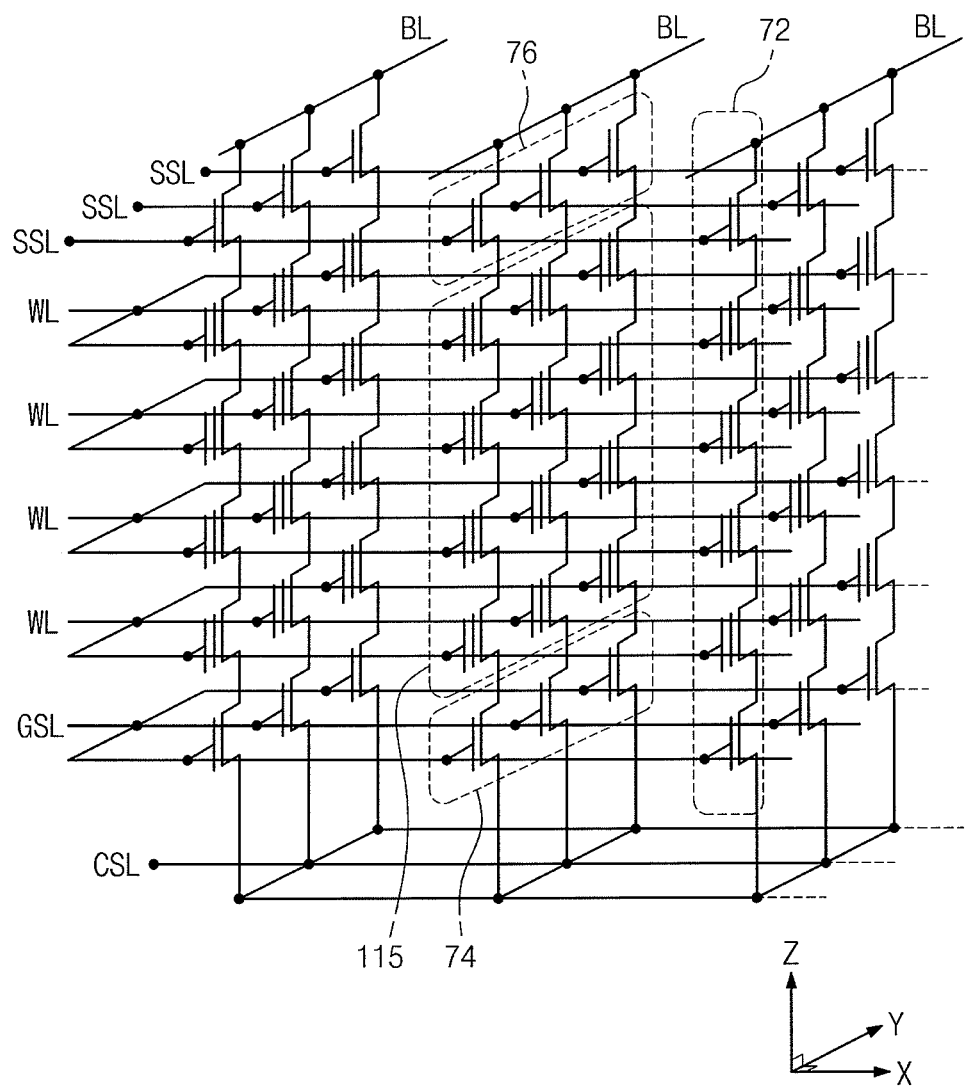
FIG. 1J is an equivalent circuit diagram illustrating a semiconductor device according to an embodiment of the inventive concept.

FIG. 1J is an equivalent circuit diagram illustrating a semiconductor device according to a first embodiment of the inventive concept.

Referring to FIG. 1J together with FIGS. 1A, 1B, in the semiconductor device 91 according to an embodiment of the inventive concept, the gate 150 forming the word line WL and the vertical channel 110 may define a memory cell 115. Also, the gate 150 forming the string selection line SSL and the vertical channel 110 may define an upper non-memory cell 76, and the gate 150 forming the ground selection line GSL and the vertical channel 110 may define a lower non-memory cell 74. A portion of the semiconductor substrate 190 may be defined as a source which corresponds to a common source line CSL. The upper non-memory cell 76, the lower non-memory cell 74, and a plurality of memory cells 115 along a common vertical channel 110 may form one cell string 72. The cell string 72 may be electrically connected to a bit line BL. A plurality of cell strings 72 may be connected in parallel to a same, common, bit line BL. The equivalent circuit diagram according to the present embodiment may not only be applied to the semiconductor device 91 of FIG. 1A, but also to all semiconductor devices disclosed in this specification.

A plurality of word lines WL may have a planar structure, respectively, and may be substantially perpendicular to the direction of extension of the cell string 72. A plurality of memory cells 115 may be three-dimensionally distributed in the plurality of word lines WL. A plurality of string selection lines SSL may be disposed to cross a plurality of bit lines BL in the X direction. Since the plurality of string selection lines SSL spaced from each other in the Y direction are electrically connected to the plurality of bit lines BL spaced from each other in the X direction, one cell string 72 may be independently selected. The ground selection line GSL may have a planar structure, and may be substantially perpendicular to the cell string 72. The ground selection line GSL may control the electrical connection between the vertical channel 110 and the semiconductor substrate 190.

In the semiconductor device 91 according to the present embodiment, a program operation may be implemented by establishing a voltage difference between a selected word line WL and the vertical channel 110 to inject electric charge into a charge storage layer. In one embodiment, electrons may be injected from the vertical channel 110 to the charge storage layer of the memory cells 115 to be programmed, for example using Fowler-Nordheim tunneling by applying a program voltage $V_{prog}$ to the selected word line WL. Since the program voltage $V_{prog}$ applied to the selected word line WL can program a memory cell pertaining to an unselected word line, an undesired programming operation can be prevented by applying a cell boosting technique.

A read operation may set, e.g., 0 V to a word line WL connected to the memory cell 115 to be read out, and set a read voltage $V_{read}$ to another word line WL. As a result, according to whether the threshold voltage $V_{th}$ of the memory cell 115 to be read out is greater or less than a 0 V voltage, it is determined whether a current is charged into a bit line BL. Data information of the memory cell 115 to be read out may be read out by detecting the current of bit line BL.

An erase operation may be performed in block units using a gate-induced leakage (GIDL) current. In one embodiment, the electric potential of the vertical channel 110 can be increased by applying an erase voltage $V_{erase}$ to the selected bit line BL and the substrate 190. In this case, the electric potential of the vertical channel 110 may be increased while being slightly delayed. Subsequently, GIDL is generated in a terminal of the gate 150 corresponding to the ground selection line. Electrons generated by GIDL may be emitted to the substrate 190, and generated holes may be emitted to the vertical channel 110. Thus, the electric potential adjacent to the erase voltage $V_{erase}$ may be delivered to the vertical channel 110 of the memory cell 115. In this case, if the electric potential of the word line WL is set to 0 V, electrons accumulated in the memory cell 115 may escape to implement data erase. An undesired erase operation may be prohibited by floating a word line of an unselected block.

The operation method of the semiconductor device 91 according to the present embodiment may be disclosed to exemplarily describe the technical spirit of the inventive concept, but the technical features of the inventive concept are not limited thereto. Since it is apparent to those skilled in the art that the modification of operation method can be easily implemented based on known technologies, it will be understood that the technical features of the inventive concept related to the operation method can be variously modified based on the known technologies.

Device Embodiment 4

Figure 2A:
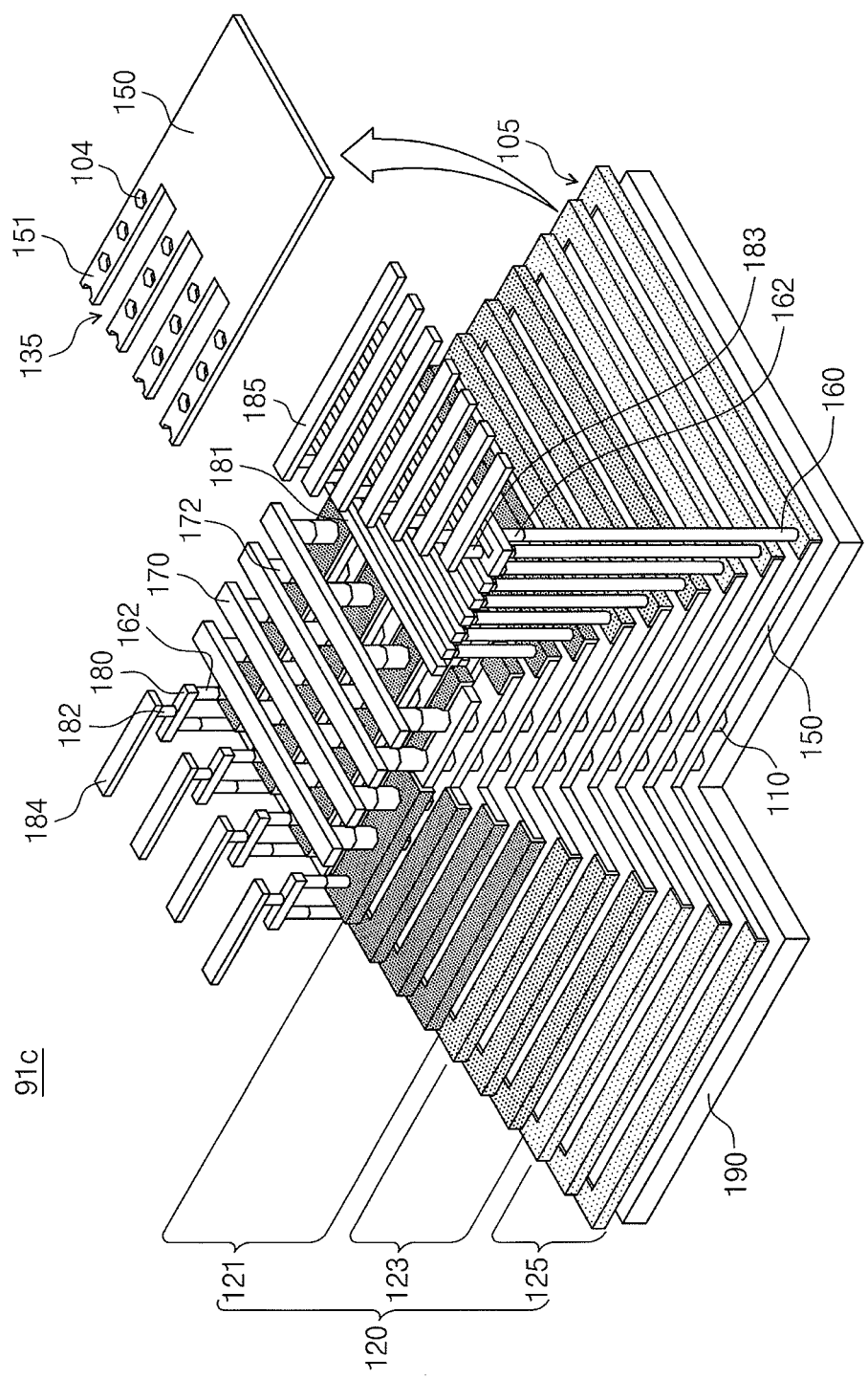
FIGS. 2A and 2B are perspective views illustrating a semiconductor device according to an embodiment of the inventive concept.
Figure 2B:
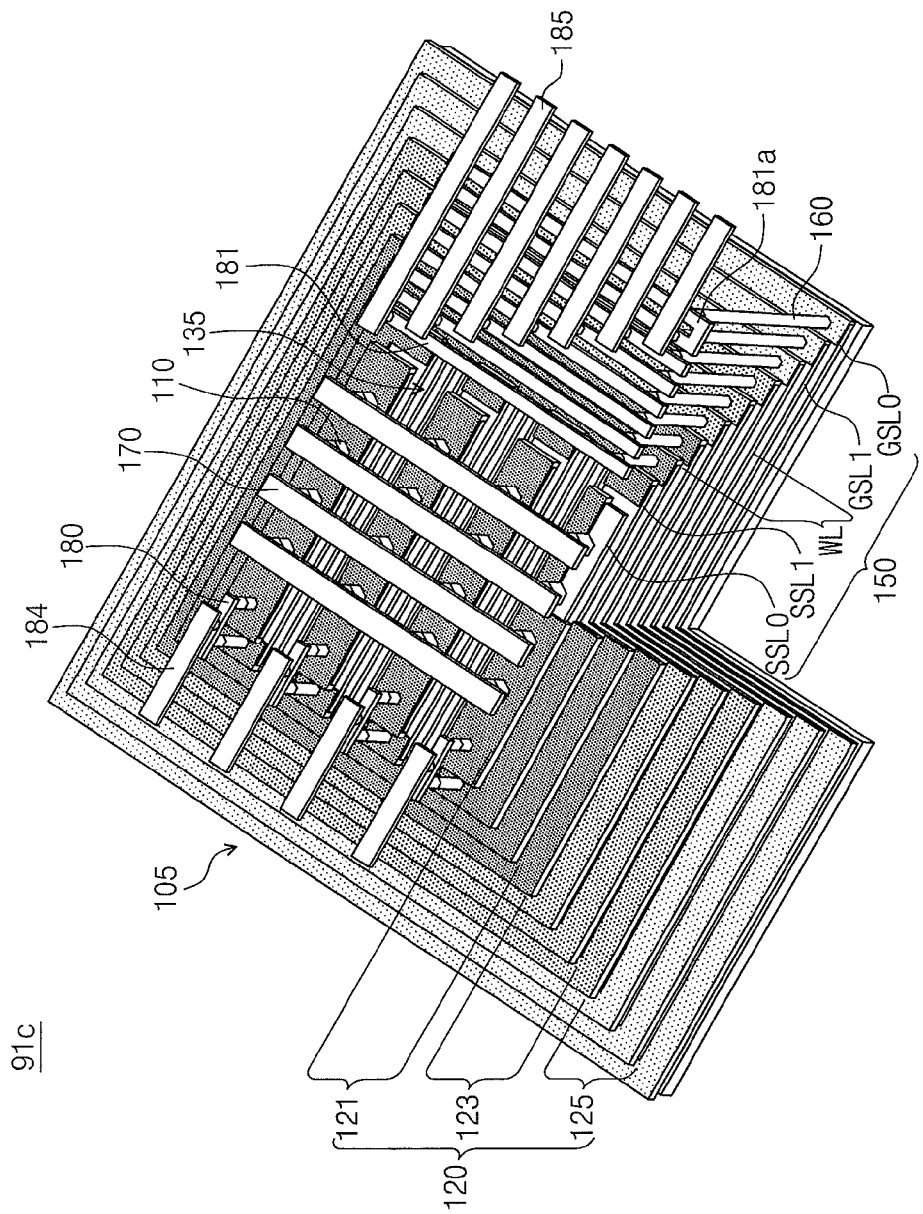

Referring to FIGS. 2A and 2B, a semiconductor device 91*c* may include a pyramid-type gate stack 105 in which gates 150 are vertically stacked along the extending direction of a vertical channel 110 over a semiconductor substrate 190. At least one of selection lines SSL and GSL may be configured to have a multi-story structure to improve the electrical characteristics of the semiconductor device 91*c*. According to the present embodiment, the gates 150 may form a first string selection line SSL0 and a second string selection line SSL1, a first ground selection line GSL0 and a second string selection line GSL1, and a plurality of word lines WL as shown in FIG. 2B.

In one embodiment, the first and second string selection lines SSL0 and SSL1 may be connected to contacts 160, respectively. These two contacts 160 may be connected to one first intermediate metal line 180 via a pad 182. Thus, the first and second string selection lines SSL0 and SSL1 may be electrically connected to each other. Since the channel length of the first and second string selection lines SSL0 and SSL1 that are electrically connected is greater than that of one string selection line, leakage current characteristics can be improved in the resulting device. Similarly, the first and second ground selection lines GSL0 and GSL1 may be connected to the contacts 160, respectively. These two contacts 160 may be connected to one second intermediate metal line 181a via a pad 183. Thus, the first and second ground selection lines GSL0 and GSL1 may be electrically connected to each other. Since the channel length of the first and second ground selection lines GSL0 and GSL1 that are electrically connected is greater than that of one ground selection line, leakage current characteristics can be improved in the resulting device.

A substantially higher voltage may be applied to the word lines WL, as compared to the voltage applied to the string selection lines SSL0 and SSL1. In this case, since a voltage drop may be generated between the word lines WL and the string selection lines SSL0 and SSL1, a word line WL most adjacent to the second string selection line SSL1 may be configured with a dummy word line to mitigate the voltage drop. Similarly, a word line WL most adjacent to the second ground selection line GSL1 may be configured with a dummy word line.

Any of the embodiments of the inventive concepts depicted herein can be applied to the configuration of the embodiment of FIGS. 2A and 2B. For example, gates 150 forming the first and second string selection lines SSL0 and SSL1 may have a line-shape, and gates 150 forming the word lines WL and the first and second ground selection lines GSL0 and GSL1 may have a plate-shape including a branch 151 divided by a word line cut 135. The etch stop layer 120 may cover the pyramid-type gate stack 105. The etch stop layer 120 may have a continuously stepped structure four sides, three sides, two sides, or one side of the device. The thickness of the etch stop layer 120 may vary according to two or more sections 121, 123 and 125.

Device Embodiment 5

Figure 3B:
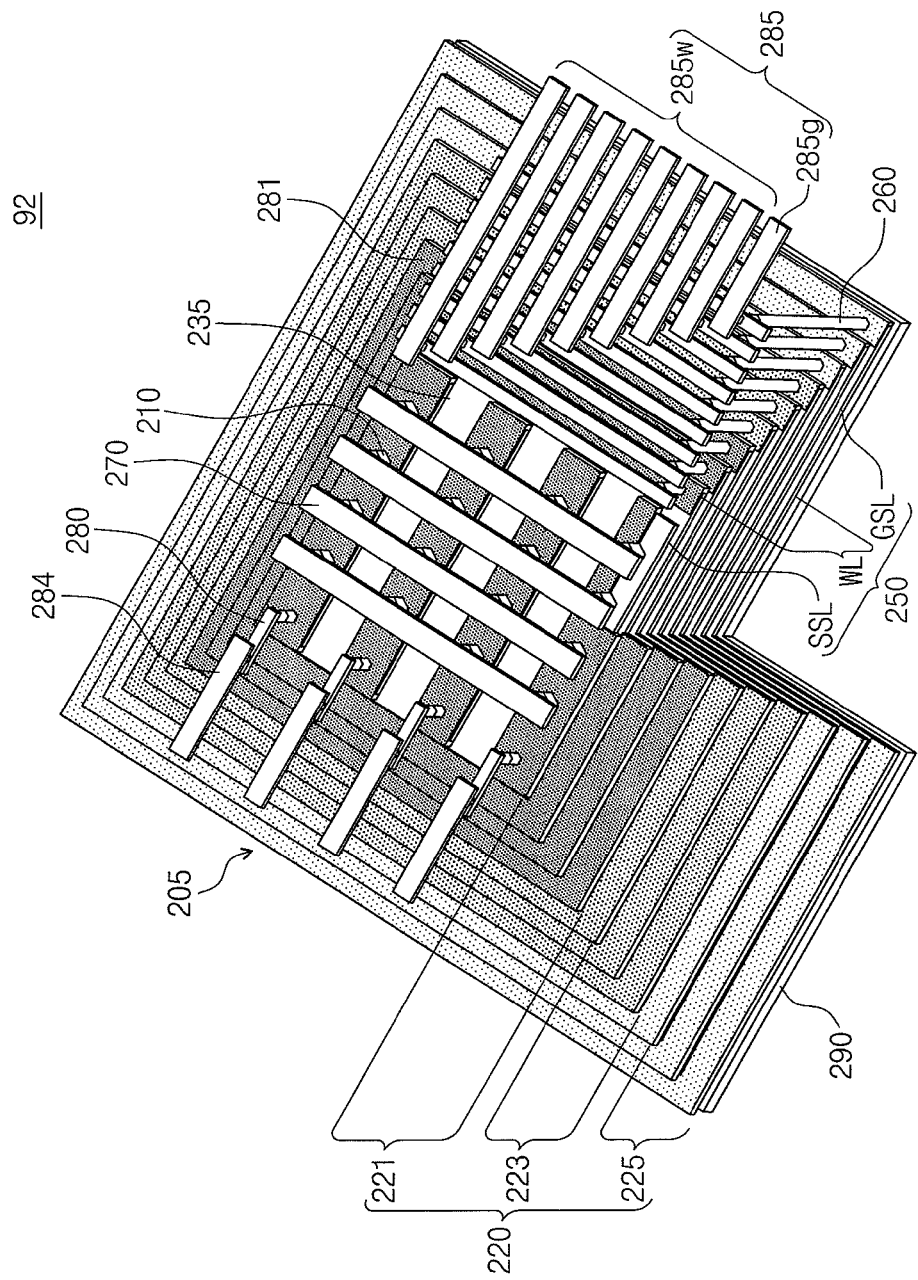

Referring to FIGS. 3A and 3B, a semiconductor device 92 may include a pyramid-type gate stack 205 including a plurality of conductive patterns or gate patterns 250 that are vertically stacked along the direction of extension of a plurality of vertical channels 210 provided on a semiconductor substrate 290. Since the gate patterns 250 may be stacked in a stepped shape, end portions of the gate patterns 250 may be exposed. The exposed portions of the gate patterns 250 may be defined as pads or contact regions 252. The semiconductor device 92 may further comprise a plurality of contacts 260 connected to the pads 252 of the gate patterns 250, a plurality of metal lines 284 and 285 electrically connected to the contacts 260 to electrically connect the gate patterns 250 to one or more driving circuits, and a plurality of bit lines 270 electrically connected to the vertical channels 210. A plurality of intermediate metal lines 280 and 281 may be further provided between the metal lines 284 and 285 and the contacts 260.

The gate patterns 250 may form a string selection line SSL, word lines WL, and a ground selection line GSL in the order from top to bottom. These lines SSL, WL and GSL may be associated with each other in series along each vertical channel 210 to form a cell string. In one embodiment, one of the gate patterns 250 forming the string selection line SSL and the gate 250 forming the ground selection line GSL may have a line shape, and the other may have a plate shape. Alternatively, both of the gate patterns 250 forming the GSL and SSL may have line shapes. Also, one or more of the gate patterns 250 forming the word line WL may have a line or plate shape. According to the present embodiment, the gate pattern 250 forming the string selection line SSL may have a line shape, and the gate pattern 250 forming the ground selection line GSL and the word line WL may have substantially rectangular plate shapes.

The contacts 260 connected to the string selection lines SSL may be connected to first metal lines 284 via pads 262, or may be connected to first intermediate metal lines 280 connected to the first metal lines 284 via pads 282 to electrically connect the string selection lines SSL to a string selection line driving circuit. The contacts 260 connected to the ground selection line GSL and the word lines WL may be connected to second metal lines 285 via pads 262, or may be connected to second intermediate metal lines 281 via pads 283 to connect the ground selection line GSL to a ground selection line driving circuit and connect the word lines WL to a word line driving circuit. The second metal line 285 may include a metal line 285g connecting the ground selection line GSL to the ground selection line driving circuit, and metal lines 285w connecting the word lines WL to the word line driving circuit.

According to the present embodiment, portions of the pyramid-type gate stack 205 may be covered with an etch stop layer 220. Accordingly, the contact regions or pads 252 may be covered with the etch stop layer 220. In one embodiment, the etch stop layer 220 may have a structure in which four sides thereof have a stepped shape, and may have a shape that surrounds the pads 252 and the four edge sides of the gate patterns 250 forming the ground selection line GSL and the word lines WL. Each of the string selection lines SSL may have a top surface and opposed side portions that are covered by the etch stop layer 220. The outermost string selection line SSL may have an outer side covered by the etch stop layer 220. As an example, the etch stop layer 220 may have a thickness that is reduced in the order of the string selection line SSL and the ground selection line GSL, for example, the portion of the etch stop later covering the string selection line SSL at an upper portion of the device can be relatively thick and the portion of the etch stop layer covering the ground selection line GSL at a lower portion of the device can be relatively thin, or not present at all. In other embodiments, the etch stop layer 220 may have substantially the same thickness irrespective of its position or can have different thicknesses according to two or more sections. According to an embodiment, the etch stop layer 220 may have different thicknesses in accordance with first, second and third sections 221, 223 and 225. For example, the etch stop layer 220 may have a greater thickness at the first section 221, a smaller thickness at the third section 225, and an intermediate thickness at the second section 223.

Figure 3C:
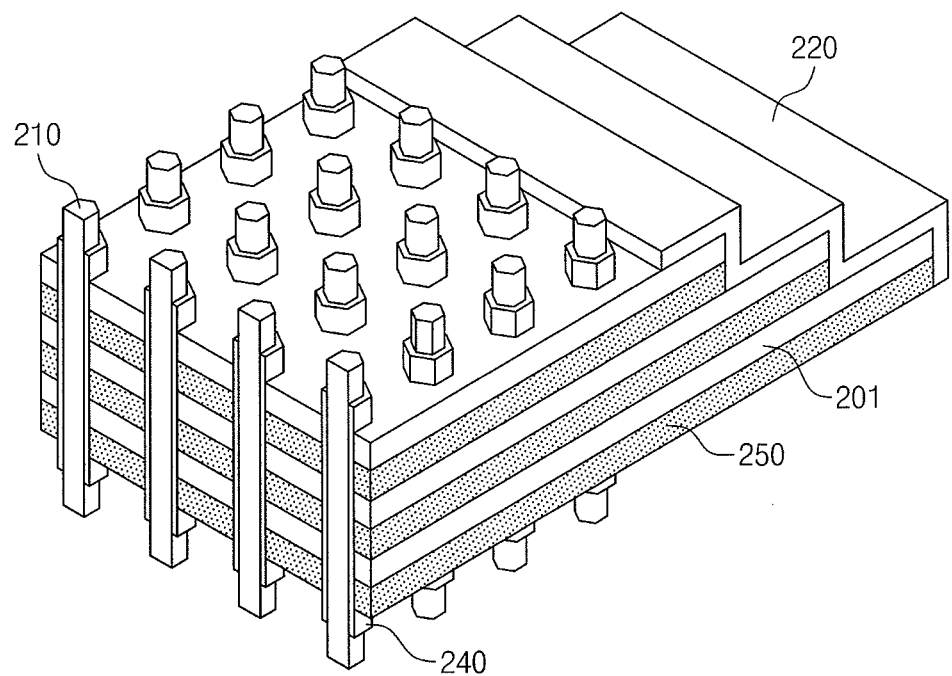
FIGS. 3C through 3E are magnified views illustrating a portion of a semiconductor device according to various embodiments of the inventive concept.
Figure 3D:
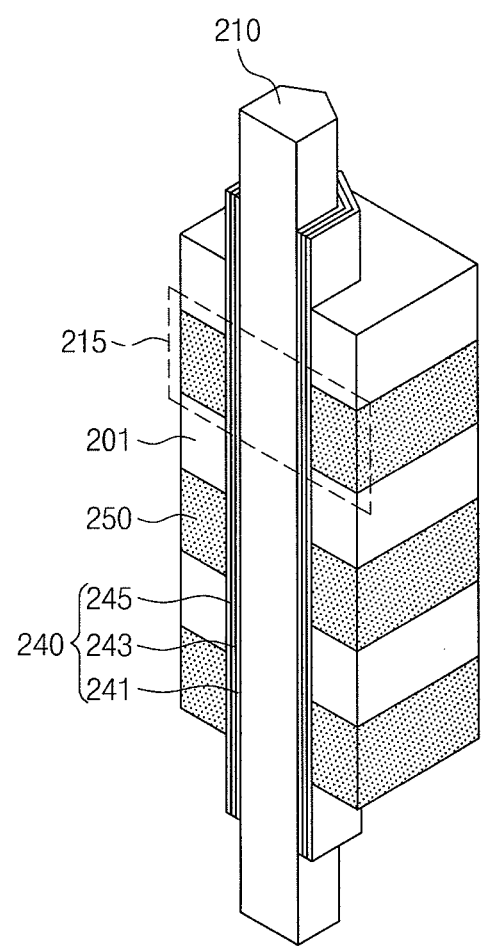

Referring to FIGS. 3C and 3D, insulation layers 201 may be disposed between the gate patterns 250. An information storage layer 240 may be configured to extend in a vertical direction along the sidewall of the vertical channel 210 in the direction of extension of the vertical channel 210. The information storage layer 240 may have a multiple-layered structure in which a tunnel insulation layer 241, a charge storage layer 243, and a blocking insulation layer 245 are sequentially stacked on the sidewall of the vertical channel 210.

Figure 3E:
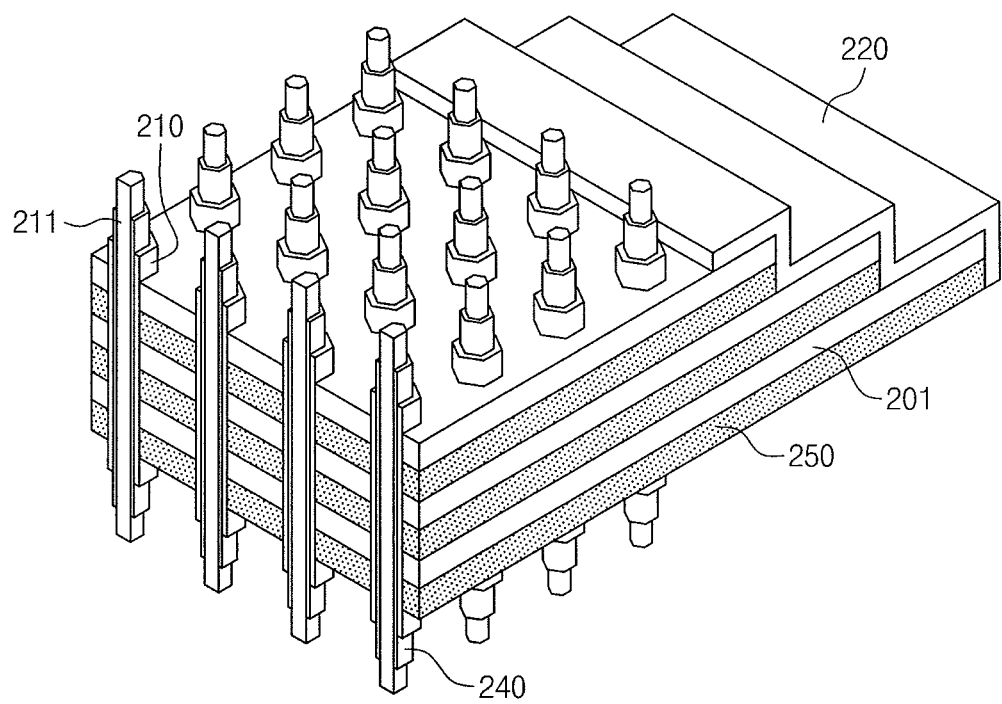

Referring to FIG. 3E, the vertical channel 210 may have a macaroni structure in which an insulator 211 fills an interior portion thereof resulting in a thin vertical channel 210 having at least the advantages described herein in connection with the embodiment of FIG. 1E.

Referring again to FIGS. 3A and 3B, the gate stack 205 may be a both-side stepped stack similarly to that of FIG. 1H, or may be a one-side stepped stack similarly to FIG. 1I. In another embodiment, the semiconductor device 92 may have a multi-step structure, e.g., at least one of the string selection line SSL and the ground selection line GSL may be two-story structure identical or similar to FIGS. 2A and 2B.

Method Embodiment 1

Figure 4A:
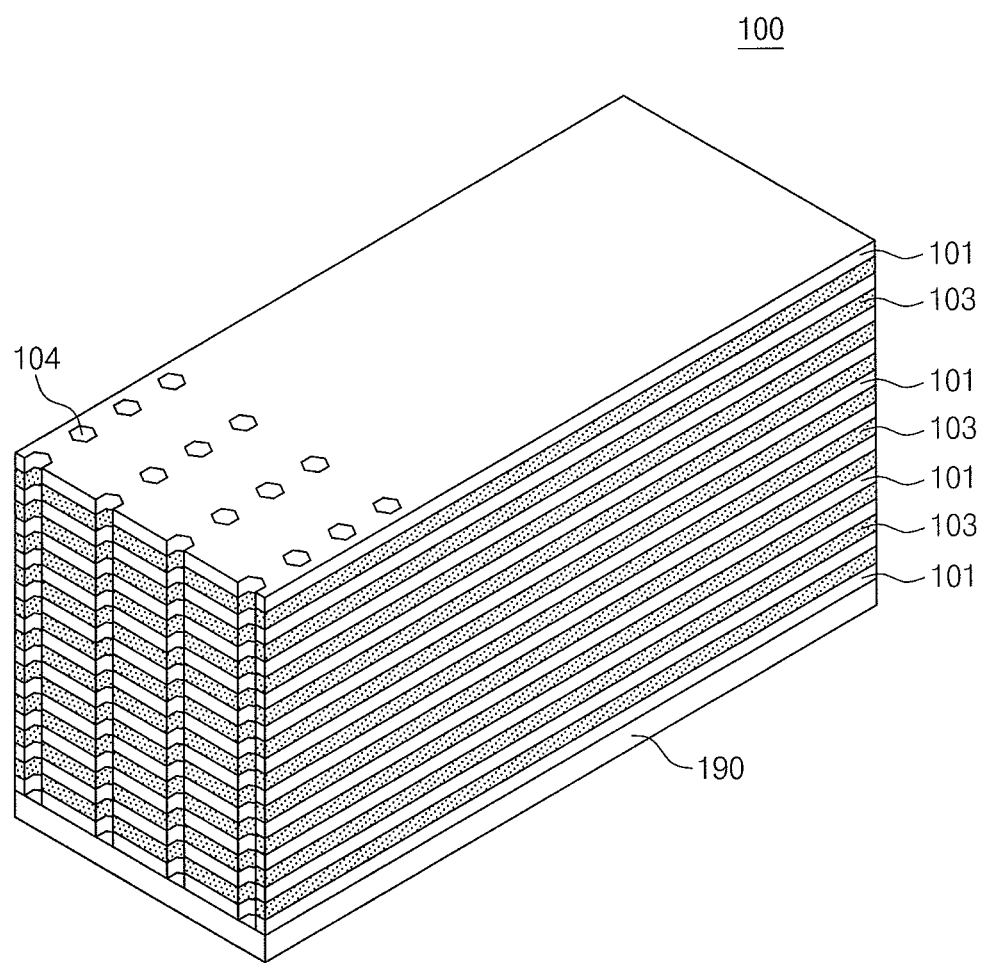
FIGS. 4A through 4I are perspective views illustrating a method for fabricating a semiconductor device according to an embodiment of the inventive concept.

Referring to FIG. 4A, a mold stack 100 may be formed on a semiconductor substrate 190. A plurality of channel holes 104 may be formed to penetrate the mold stack 100 to expose the top surface of the semiconductor substrate 190. The semiconductor substrate 190 may be a material having semiconductor characteristics, for example, a silicon wafer or a silicon-on-insulator (SOI) substrate. The mold stack 100 may be formed by alternately and repeatedly stacking a plurality of insulation layers 101 and a plurality of sacrificial layers 103. In one embodiment, the uppermost portion of the mold stack 100 may be formed of the insulation layer 101. The insulation layer 101 and the sacrificial layer 103 may comprise materials that have etch selectivity with respect to each other. For example, the insulation layer 101 may be a silicon oxide layer or a silicon nitride layer material. The sacrificial layer 103 may comprise a different material from that of the insulation layer 101, and can, for example, be selected from a silicon layer, a silicon oxide layer, a silicon nitride layer, and a silicon carbide layer. According to the present embodiment, the insulation layer 101 may be a silicon oxide layer, and the sacrificial layer 103 may be a silicon nitride layer.

Figure 4B:
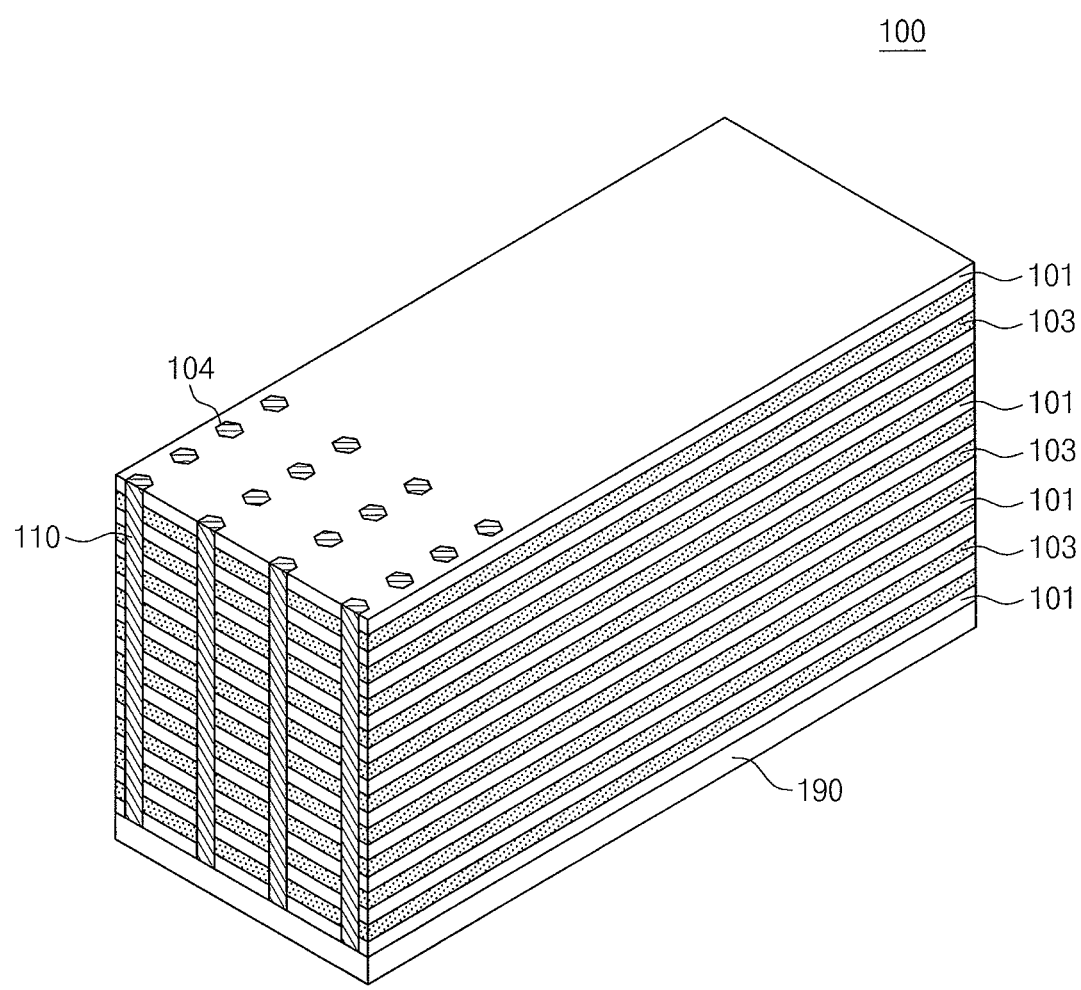

Referring to FIG. 4B, a plurality of vertical channels 110 may be formed to be connected to, or otherwise extend in a vertical direction relative to, the semiconductor substrate 190. In one embodiment, the vertical channel 110 may be formed of a semiconductor material. For example, the vertical channel 110 may be formed of a semiconductor material that is formed using epitaxial growth or chemical vapor deposition technology, and may include one of polycrystalline, monocrystalline, and amorphous structures. The vertical channel 110 may be formed with a bulk structure as shown in FIG. 1C, or a macaroni structure as shown in FIG. 1E. The vertical channel 110 may have a pillar shape that has identical or similar sectional area at upper and lower portions thereof, or may have a tapered pillar shape in which the sectional area thereof is progressively reduced from an upper portion to a lower portion thereof.

Figure 4C:
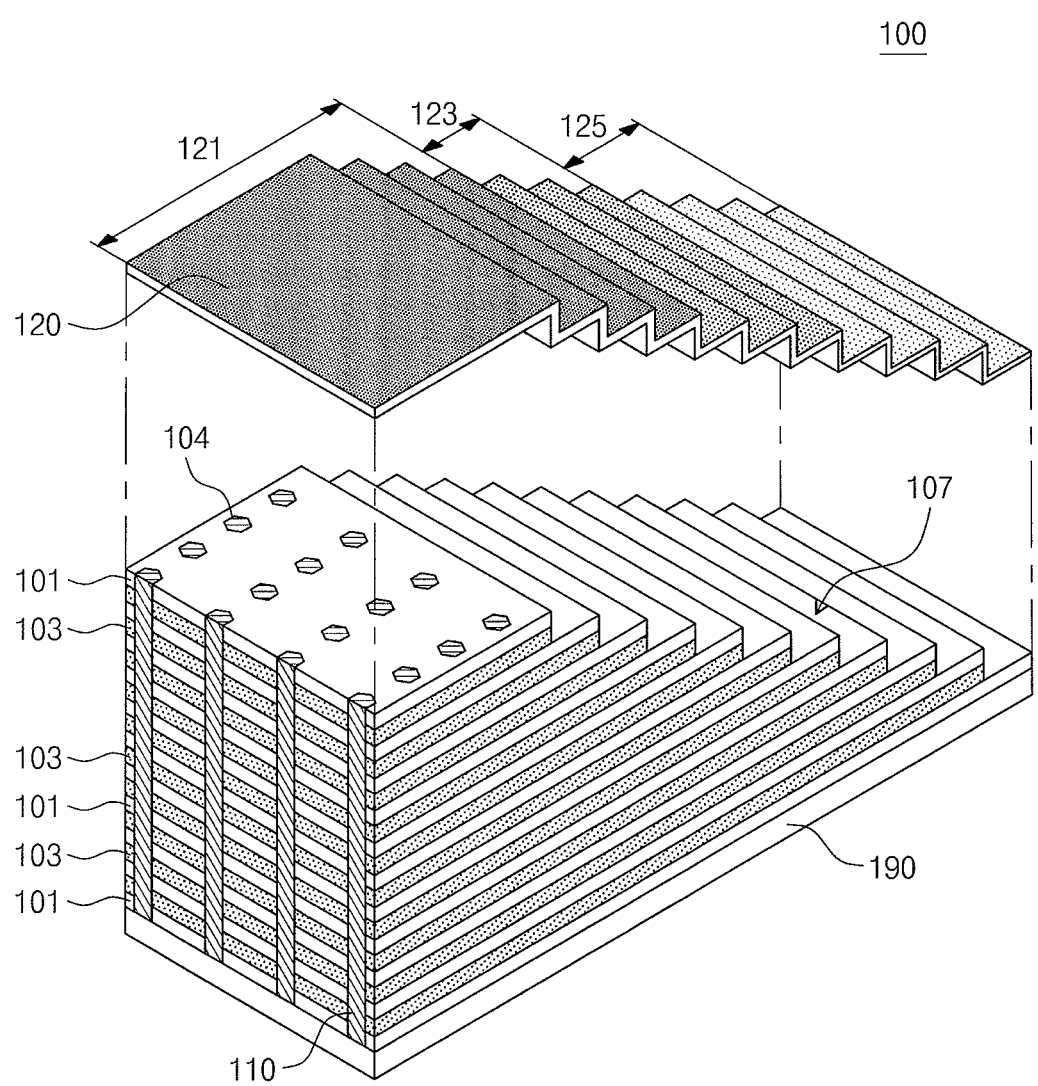

Referring to FIG. 4C, a step patterning process may be performed after the formation process of the vertical channel 110. For example, the mold stack 100 may be patterned in a stepped shape to form a step structure 107. Simultaneously, an etch stop layer 120 may be formed to cover the patterned mold stack 100. According to the present embodiment, the stack structure may be partitioned into at least two sections having different thicknesses of the etch stop layer 120, for example, three sections 121, 123 and 125. In some embodiments, the thickness of the etch stop layer 120 may vary according to the sections 121, 123 and 125; however, in other embodiments, the thickness may be uniform in all sections 121, 123 and 125. The sections 121, 123 and 125 may be introduced to apply different thicknesses of the etch stop layer 120 to the contact regions 152 of the different conductive patterns 150. The sections 121, 123 and 125 need not be limited to a specific size, and the sizes of the sections 121, 123 and 125 may vary according to the thickness distribution of the etch stop layer 120. For convenience of explanation in the present disclosure, the etch stop layer 120 may be divided into the plurality of sections 121, 123 and 125, each section corresponding to a different thickness of the etch stop layer 120.

Although it has been shown in the present disclosure that a step structure 107 is patterned at one side of the mold stack 100 to implement a simple illustration, the inventive concept is not limited thereto. The step structure 107 may be implemented at four sides, three side, two sides, or two opposed sides of the mold stack 100. The step structure 107 and the etch stop layer 120 may be implemented by sequentially etching the mold stack 100. The etch process may include a trim process that sequentially reduces a mask or an attach process that sequentially extends the mask. Hereinafter, the trim process and the attach process will be described in detail.

<Trim Process>

Figure 5A:
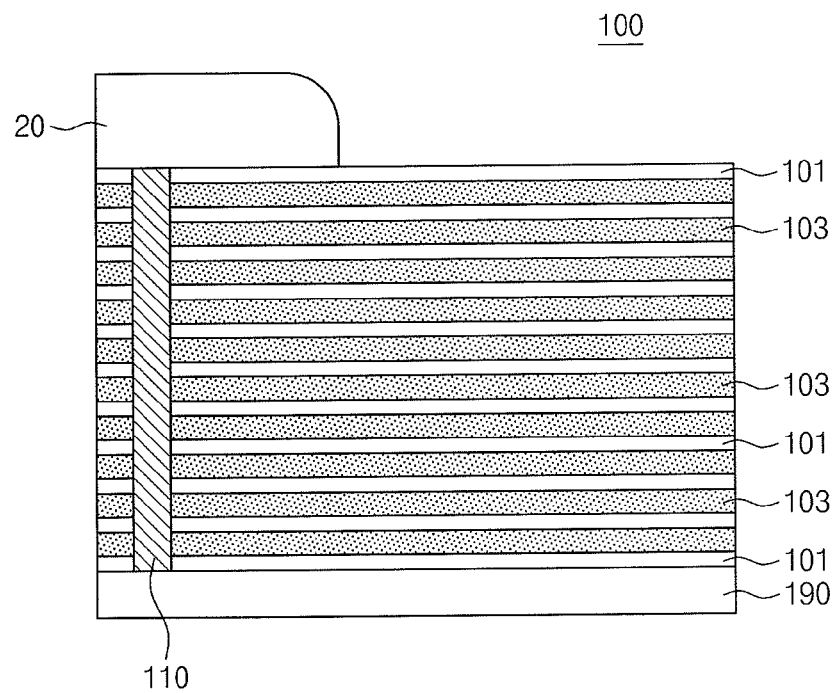
FIGS. 5A through 5U are cross-sectional views illustrating a trim process in a method for fabricating a semiconductor device according to an embodiment of the inventive concept.
Figure 5B:
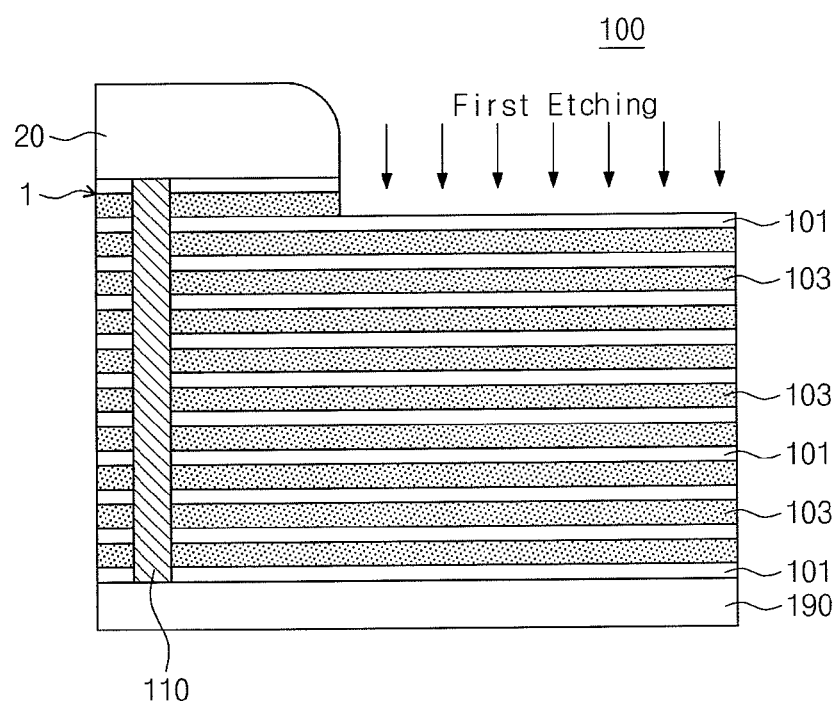
Figure 5C:
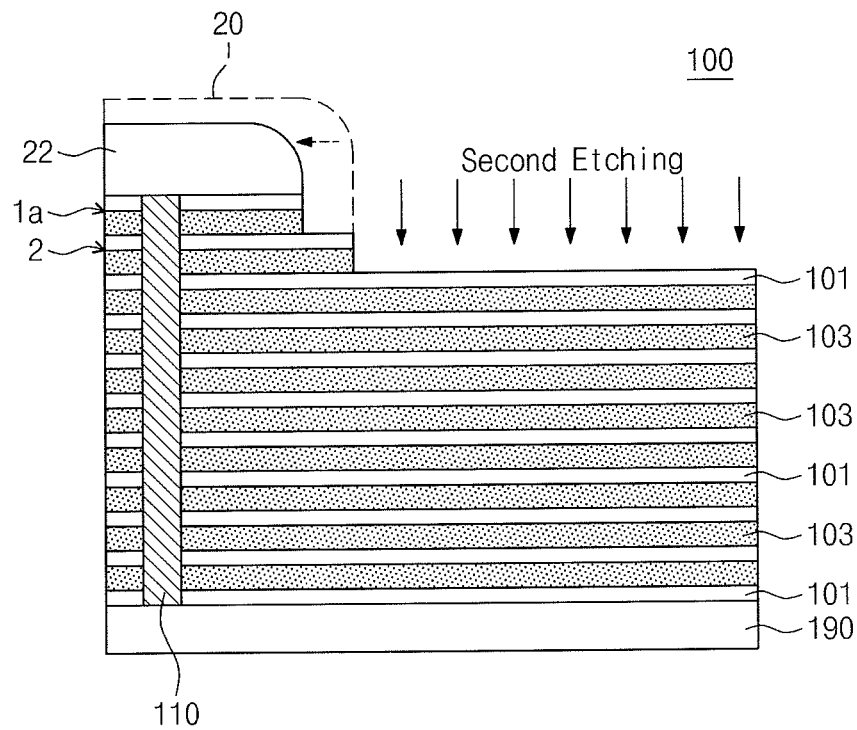
Figure 5D:
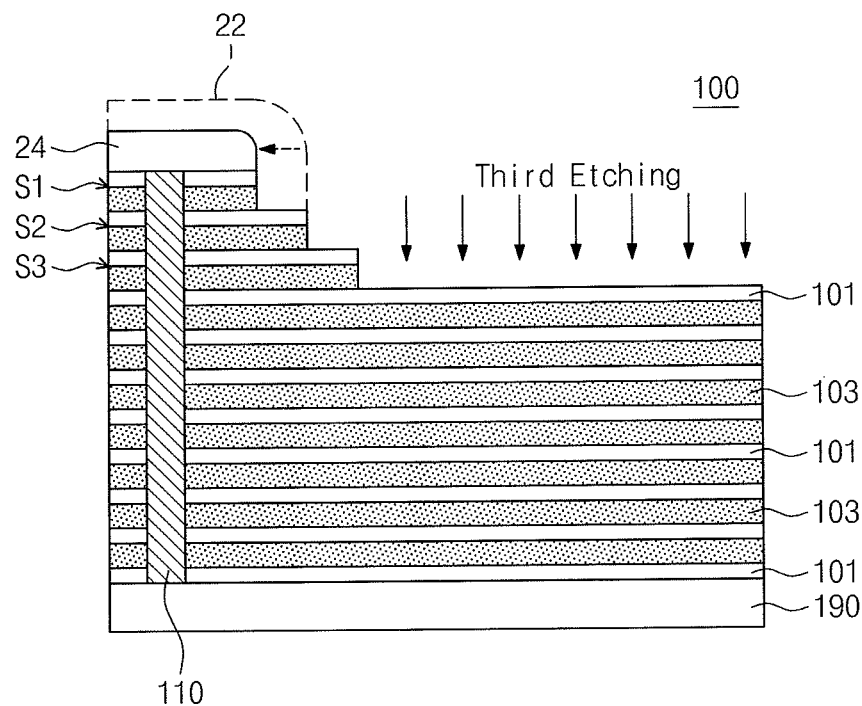
Figure 5E:
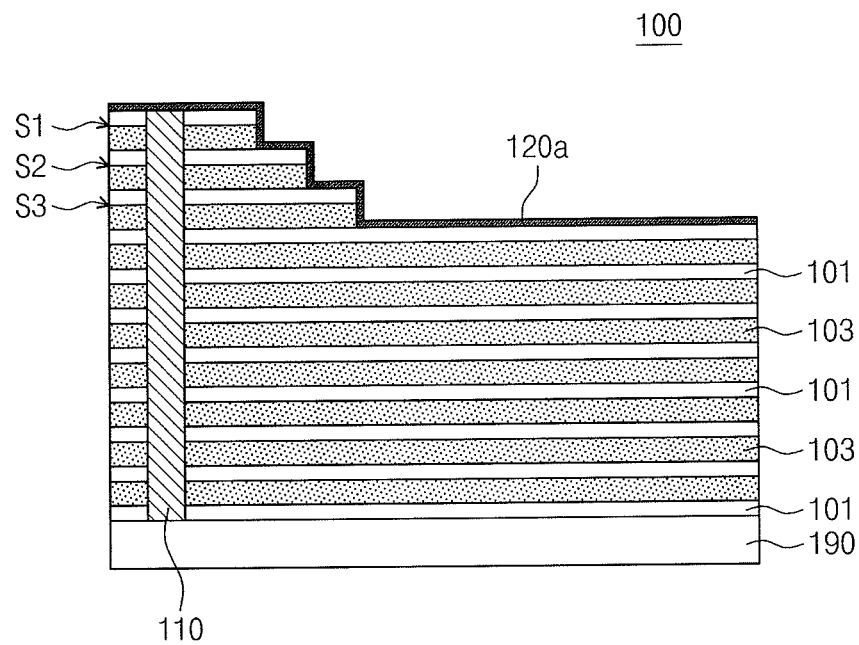
Figure 5F:
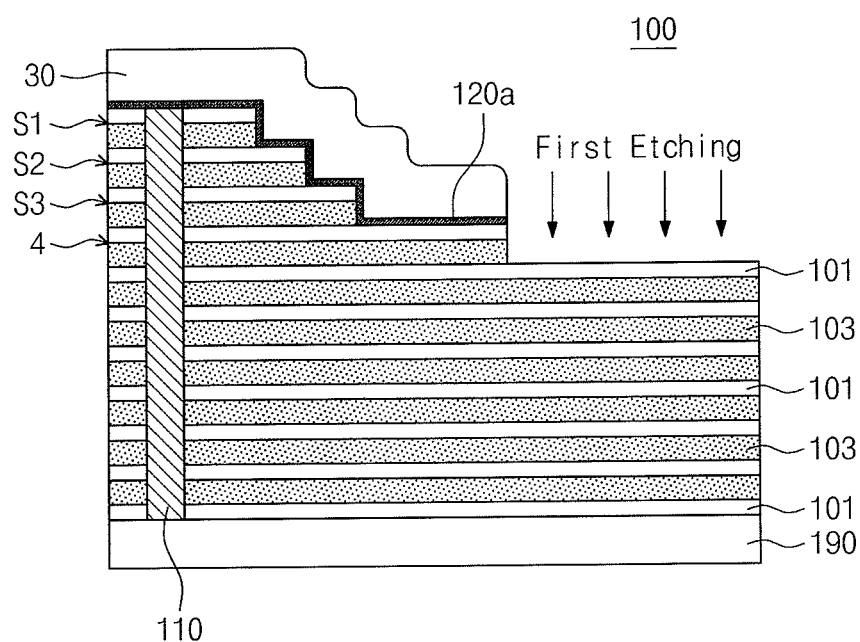
Figure 5G:
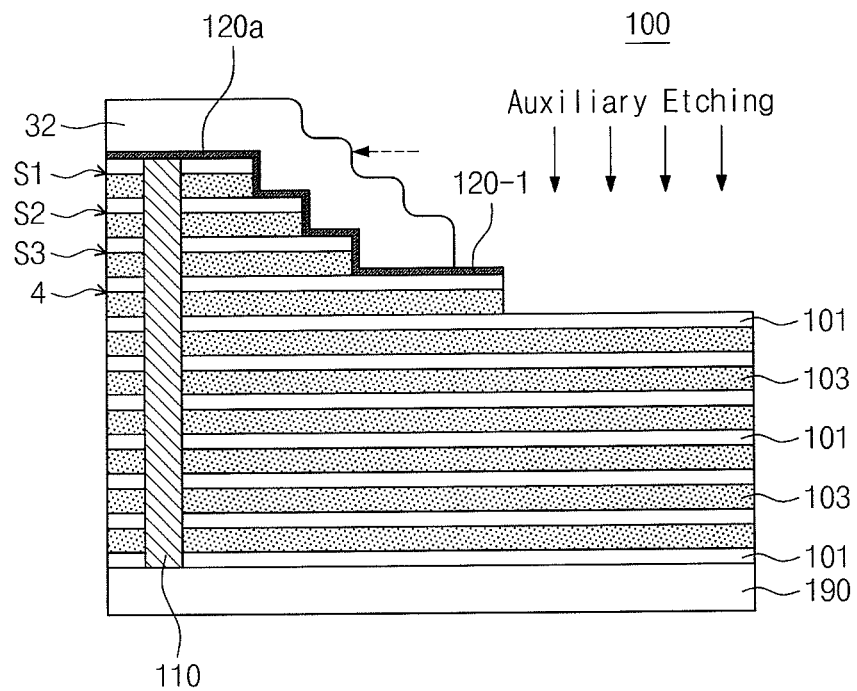
Figure 5H:
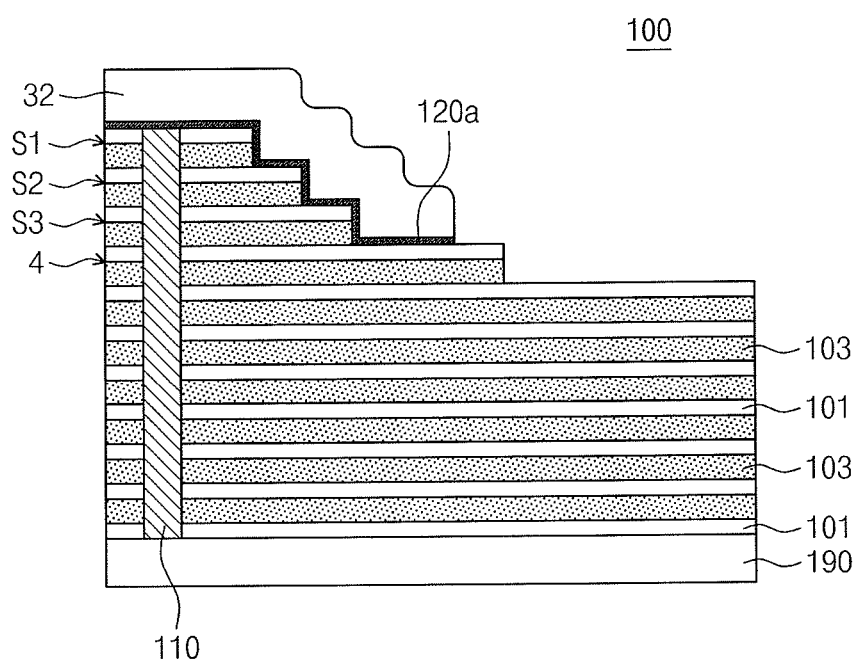
Figure 5I:
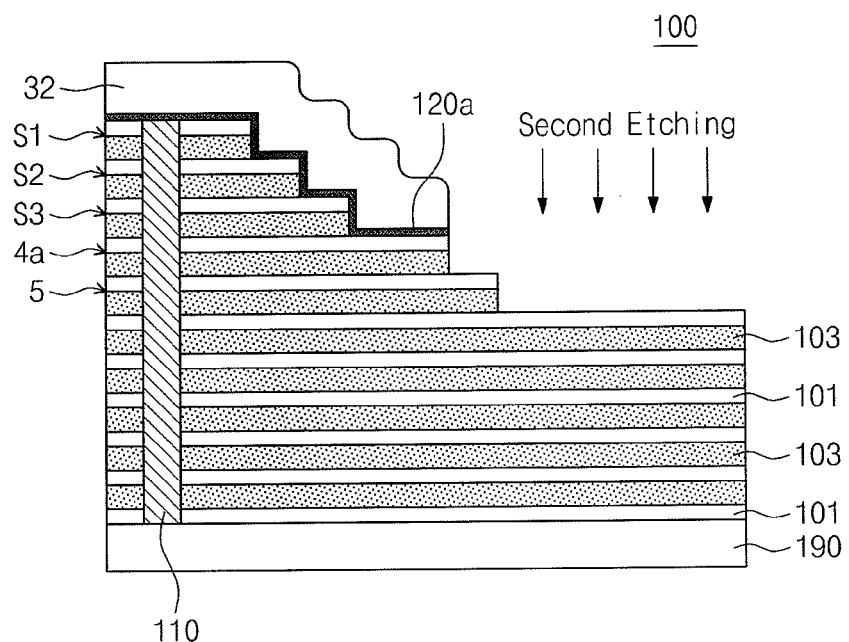
Figure 5J:
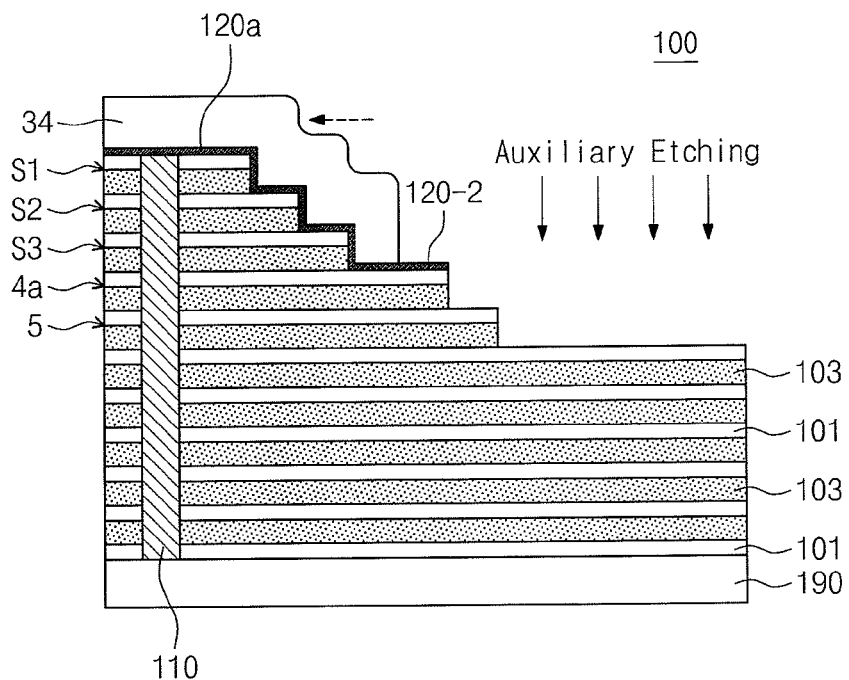
Figure 5K:
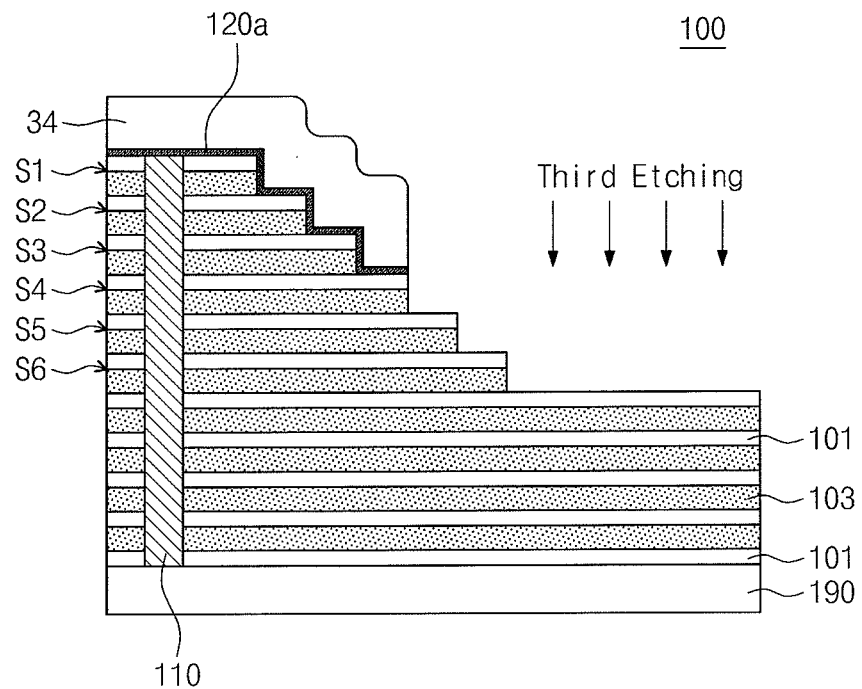
Figure 5L:
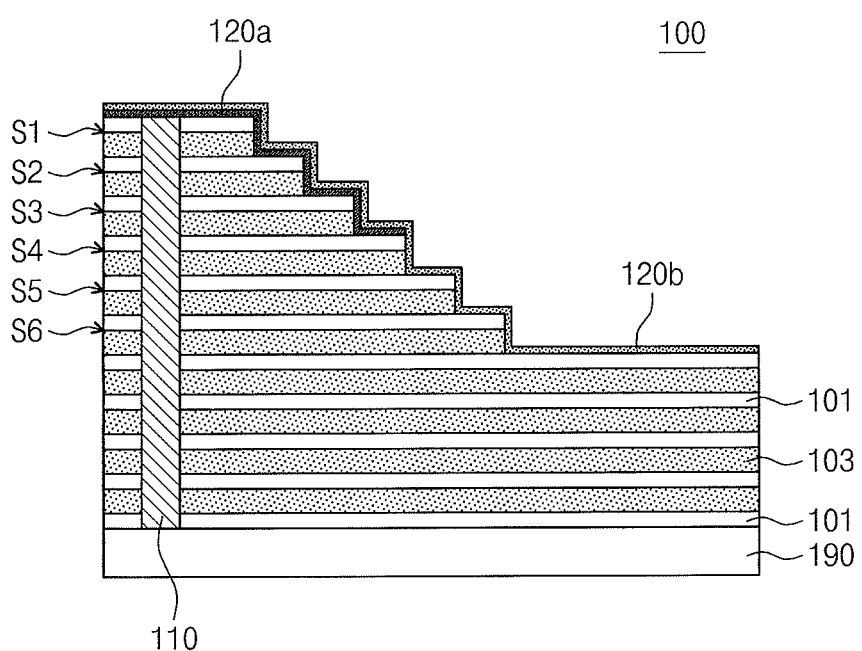
Figure 5M:
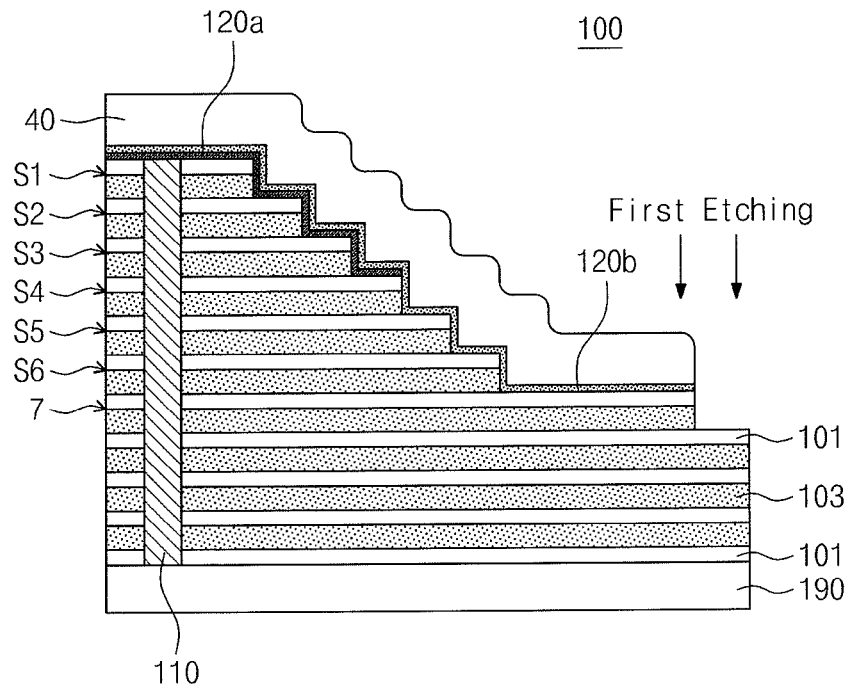
Figure 5N:
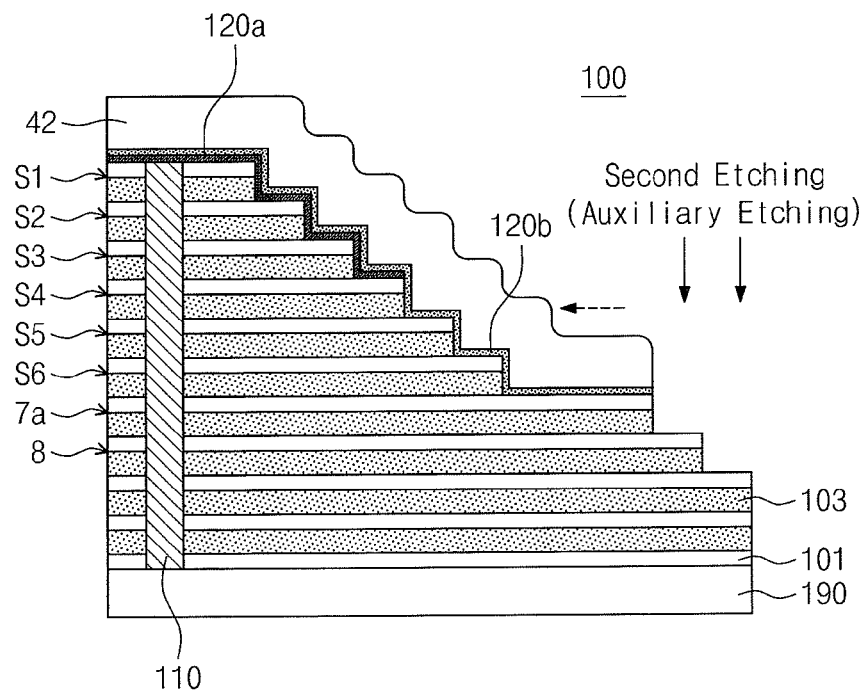
Figure 5O:
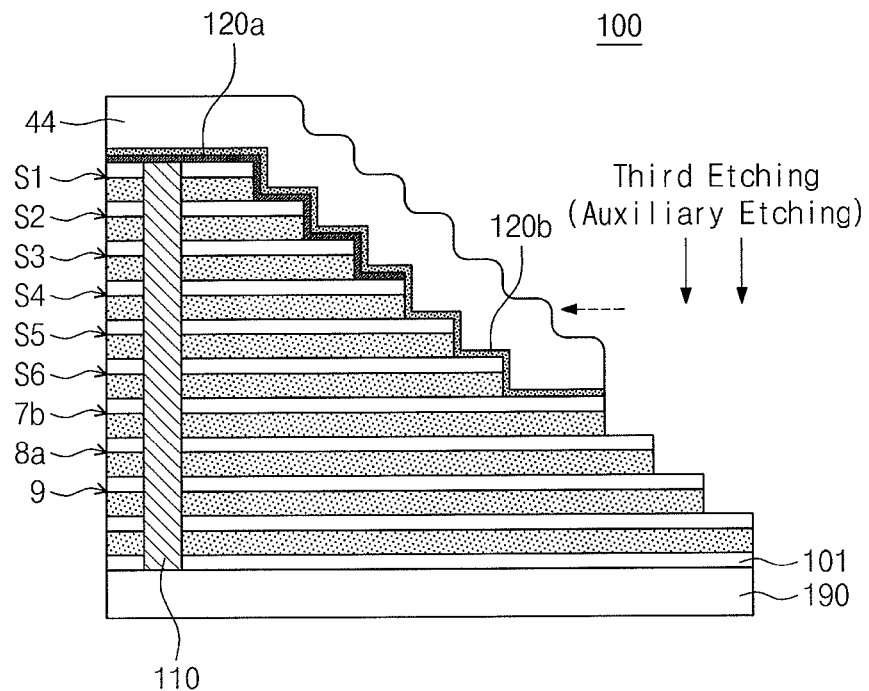
Figure 5P:
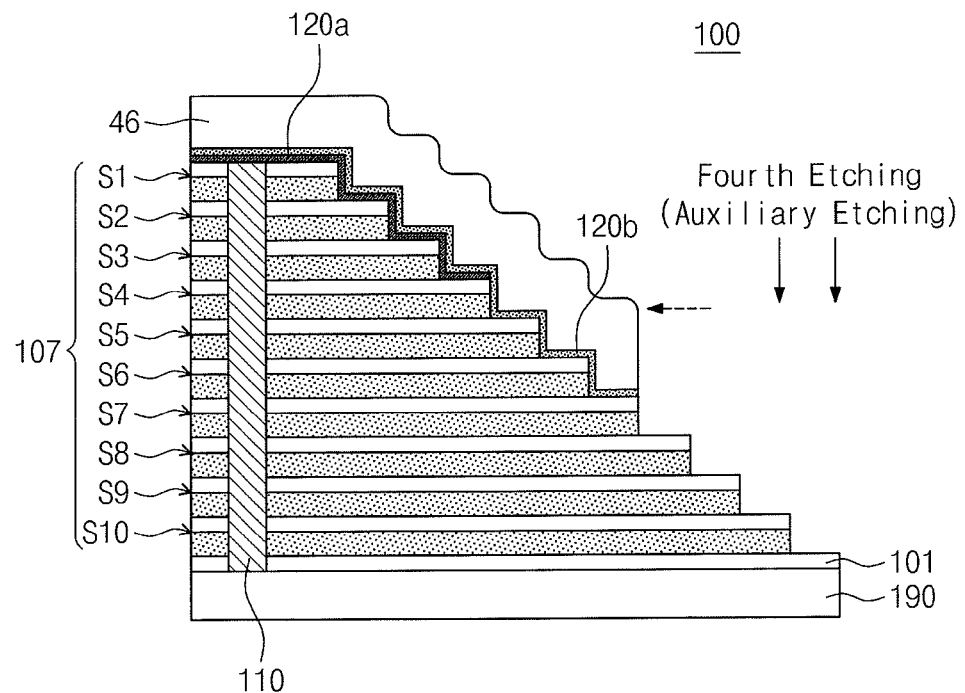
Figure 5Q:
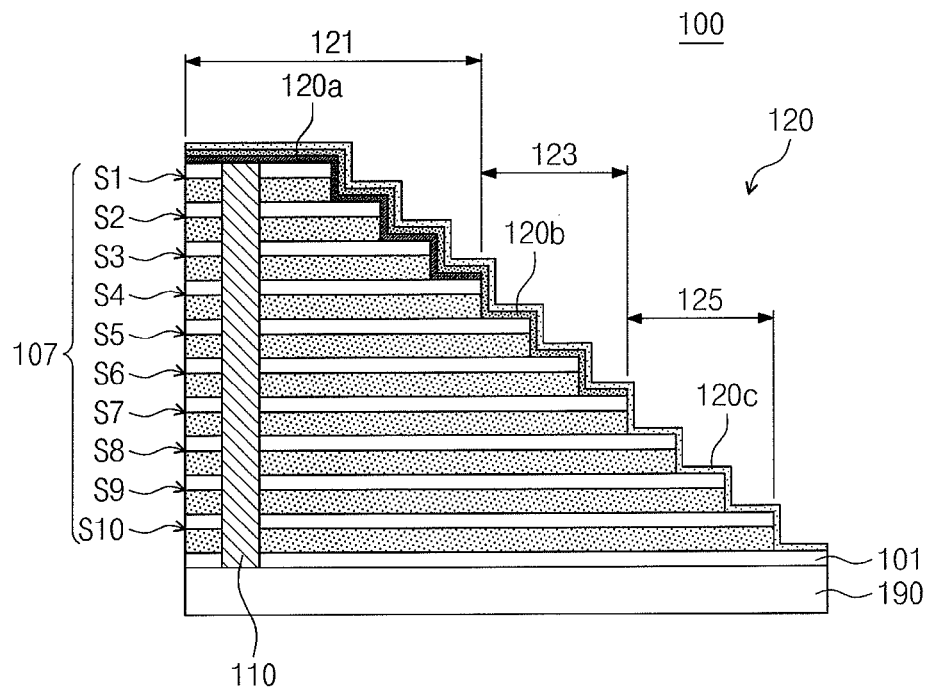
Figure 5R:
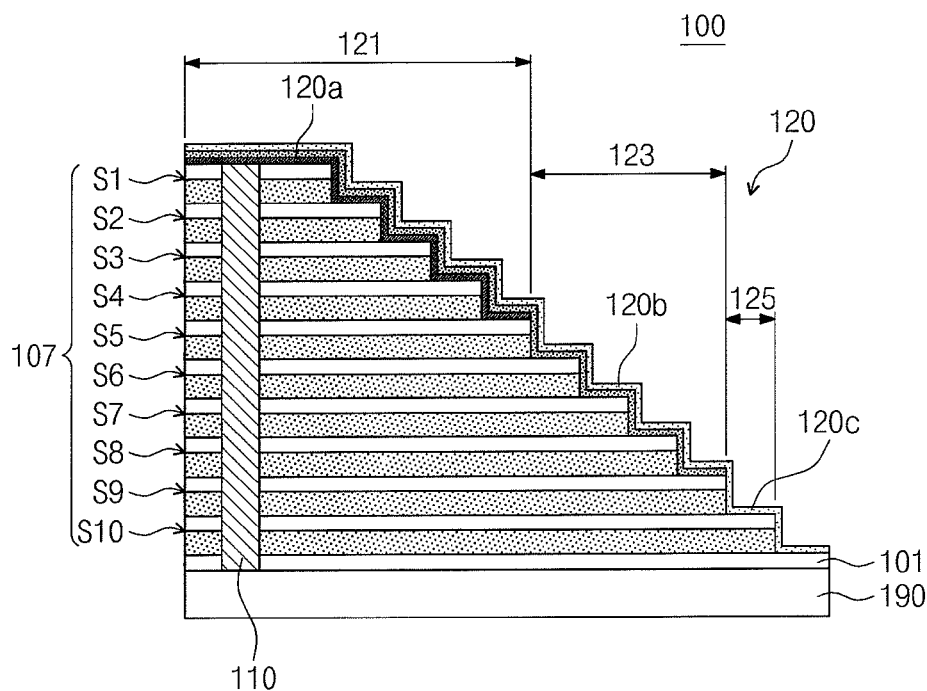
Figure 5S:
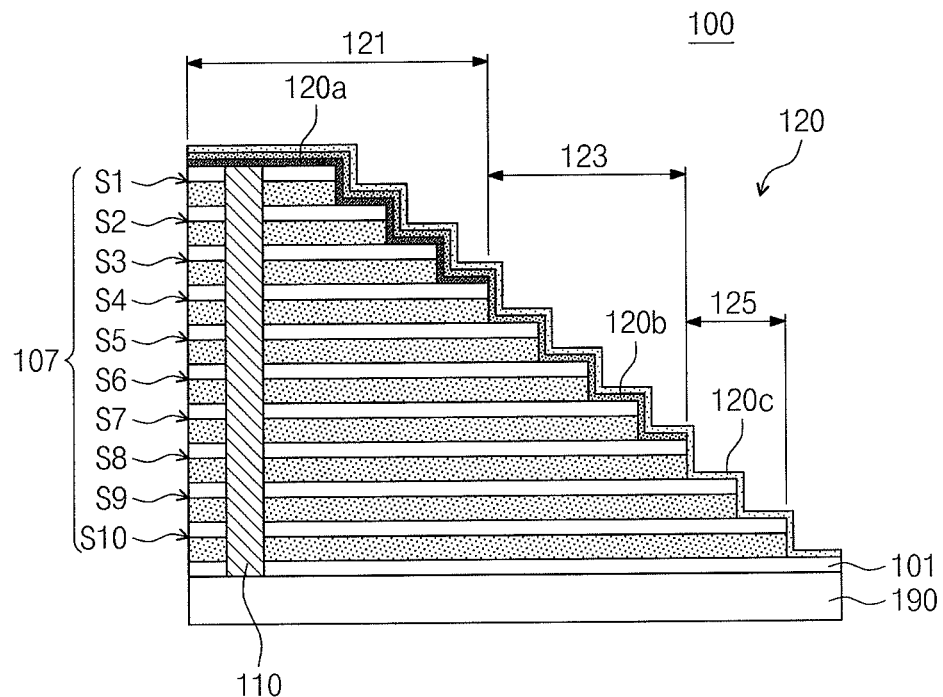
Figure 5T:
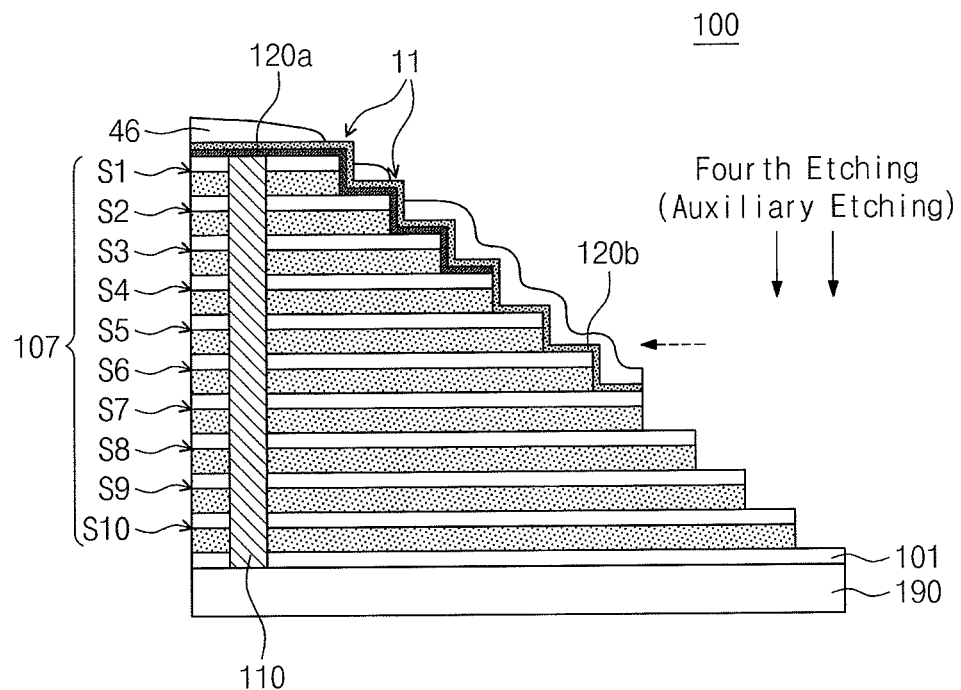
Figure 5U:
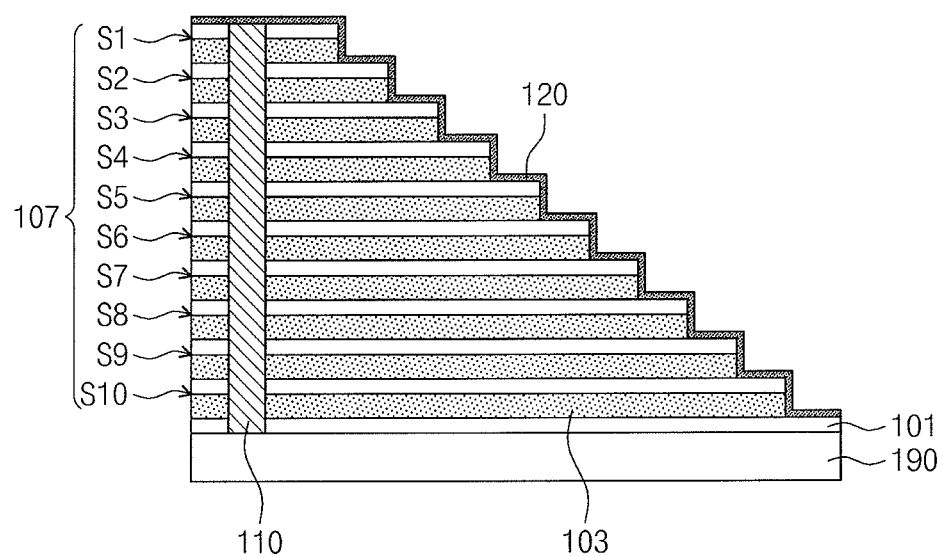

FIGS. 5A through 5U are cross-sectional views illustrating a trim process in a method for fabricating a semiconductor device according to an embodiment of the inventive concept. Referring to FIG. 5A, a first mask 20 may be formed on the mold stack 100. The first mask 20 may be formed of a material having an etch selectivity relative to both the insulation layer 101 and the sacrificial layer 103. For example, the first mask 20 may be formed by photoresist deposition and patterning. According to the present embodiment, since the trim process includes reducing the mask, the first mask 20 may be formed to have an appropriate size in consideration of the reduced size and/or the number of steps. The trim process may be performed after or before the vertical channel 110 is formed.

Referring to FIGS. 5B through 5E, trimmed masks 22 and 24 may be sequentially formed by trimming the first mask 20. Steps S1, S2 and S3 may be formed by repeatedly patterning the mold stack 100 through several etch processes using the masks 20, 22 and 24. A first etch stop layer 120a may be formed on the mold stack 100 with the steps S1 to S3. In the present disclosure, the mask trim and etch stop layer formation processes for forming one of the etch stop layer 120 (e.g., the first etch stop layer 120a) will be defined as a trim cycle. In one trim cycle, the mask trim process will not be limited to a specific number of steps.

In one embodiment, as shown in FIG. 5B, a first pattern 1 may be formed by patterning the uppermost insulation layer 101 and the sacrificial layer 103 through a first etching process using the first mask 20. For example, the first etching process may be performed by anisotropic etching technology. The first etching process may be performed until the insulation layer 101 directly under the uppermost sacrificial layer 103 is exposed.

As shown in FIG. 5C, a firstly-trimmed first mask 22 may be formed by firstly trimming (dotted arrow) the first mask 20, and then a reduced first pattern 1a may be formed by further patterning the first pattern 1 through a second etching process using the firstly-trimmed first mask 22. Along with the formation of the reduced first pattern 1a according to the second etching process, the insulation layer 101 and the sacrificial layer 103 that are not covered by the first pattern 1 may be patterned to form a second pattern 2. During the second etching process, the etched depth of the insulation layer 101 and the sacrificial layer 103 forming the first pattern 1, and the etched depth of the insulation layer 101 and the sacrificial layer 103 directly under the first pattern 1 may be identical or similar to each other to achieve completion of the step patterning process. In one embodiment, the insulation layers 101 and the sacrificial layers 103 may be formed to have the same or similar thickness during the formation of the mold stack 100, respectively, but the inventive concept is not limited thereto. In another embodiment, the insulation layers 101 and the sacrificial layers 103 may have different thicknesses that depend on their respective vertical positions in the stack. For example, the insulation layers 101 and the sacrificial layers 103 may be formed to have a greater thickness at upper and lower layers and a smaller thickness at an intermediate layer, or may be formed to have a progressively changing thickness according its vertical position in the mold stack 100. The insulation layer 101 and the sacrificial layer 103 may be formed to have the same or different thicknesses with respect to each other.

As shown in FIG. 5D, a secondly-trimmed first mask 24 may be formed by secondly trimming the firstly-trimmed first mask 22, and then the first step S1 may be formed by further patterning the reduced first pattern 1a through a third etching process using the secondly-trimmed first mask 24 as an etch mask. When the first step S1 is formed by the third etching process, the second pattern 2 may be further patterned to form the second step S2. When the second step S2 is formed by the third etching process, the insulation layer 101 and the sacrificial layer 103 directly under the second pattern 2 may be patterned to form the third pattern, that is, the third step S3.

Thus, as shown in FIGS. 5A through 5D, by the two-times mask trim process and three-times etching process, the uppermost insulation layer 101 and sacrificial layer 103 may be patterned three times to form the first step S1, and the insulation layer 101 and sacrificial layer 103 directly under the uppermost insulation layer 101 and sacrificial layer 103 may be patterned two times to form the second step S2. The insulation layer 101 and sacrificial layer 103 directly under the second step S2 may be patterned one time to form the third step S3.

Referring to FIG. 5E, the secondly-trimmed first mask 24 may be removed by, e.g., an ashing process, and then a first etch stop layer 120a may be formed on the mold stack 100 having the first to third steps S1 to S3. For example, the first etch stop layer 120a may be formed by conformally depositing a layer of insulative material having an etch selectivity with respect to the insulation layer 101 and the sacrificial layer 103. The first etch stop layer 120a may be formed to have a stepped shape along the upper profile of the mold stack 100. IN various embodiments, the first etch stop layer 120a may include one of an aluminum oxide layer, a hafnium oxide layer, a titanium oxide layer, a tantalum oxide layer, a zirconium oxide layer, a germanium oxide layer, and a combination thereof. Besides, the firs etch stop layer 120a may include a material containing silicon, for example, silicon carbide (SiC), silicon oxycarbide (SiOC), silicon carbon nitride (SiCN), or a combination thereof. According to the present embodiment, the first etch stop layer 120a may be formed by depositing an aluminum oxide layer (AlOx).

Referring to FIGS. 5F through 5L, fourth to sixth steps S4, S5 and S6 may be further formed by performing a trim cycle identically or similarly to those described with referent to FIGS. 5B through 5E, and a second etch stop layer 120b may be further formed on the mold stack 100 further including the steps S4 to S6.

In one embodiment, referring to FIG. 5F, a second mask 30 may be formed on the first etch stop layer 120a, and a fourth pattern 4 may be formed by patterning the insulation layer 101 and the sacrificial layer 103 directly under the third step S3 through a first etching process using the second mask 30.

Referring to FIG. 5G, the second mask 30 may be firstly trimmed to form a firstly-trimmed second mask 32. In this case, a portion 120-1 of the first etch stop layer 120a on the fourth pattern 4 may be exposed. If a second etching process is performed, a step structure of a desired shape may not be formed due to a poor step patterning process. For example, during the second etching process, while the insulation layer 101 and the sacrificial layer 103 directly under the fourth pattern 4 are being patterned, the insulation layer 101 and the sacrificial layer 103 forming the fourth pattern 4 may not be patterned or may be partially patterned due to the exposed portion 120-1 of the first etching stop layer 120. Alternatively, during the second etching process, while the insulation layer 101 and the sacrificial layer 103 forming the fourth pattern 4 and the exposed portion 120-1 of the first etch stop layer 120 are being patterned, a plurality of insulation layers 101 and sacrificial layers 103 directly under the fourth pattern 4 may be etched such that a step structure of a desired shape may not be formed. Therefore, as shown in FIG. 5H, the insulation layer 101 of the fourth pattern 4 may be exposed by further performing an auxiliary etching process to selectively remove the exposed portion 120-1 of the first etch stop layer 120 before the second etching process is performed. In one embodiment, when an aluminum oxide layer is selected as a first etch stop layer 120a, the first etch stop layer 120a may be selectively removed by an etchant including $NH_4OH$, e.g., mixture of $NH_4OH$, $H_2O_2$, and $H_2O$.

Referring to FIG. 5I, a reduced fourth pattern 4a may be formed by further patterning the fourth pattern 4 through the second etching process using the firstly-trimmed second mask 32. During the second etching process, the insulation layer 101 and the sacrificial layer 103 directly under the fourth pattern 4 may be patterned to form a fifth pattern 5.

Referring to FIG. 5J, a secondly trimmed second mask 34 may be formed by secondly trimming the firstly-trimmed second mask 32. The secondly trimming process may expose a portion 120-2 of the first etch stop layer 120 on the reduced fourth pattern 4a. An auxiliary etching process may be further performed to remove the exposed portion 120-2 of the first etch stop layer 120. In this auxiliary etching process, an etching environment for the reduced fourth pattern 4a and an etching environment for the fifth pattern 5 may be established identically or similarly to each other in a subsequent third etching process.

Referring to FIG. 5K, a fourth step 4 may be formed by further patterning the reduced fourth pattern 4a through a third etching process using the secondly-trimmed second mask 34. During the formation of the fourth step S4 according to the third etching process, the fifth pattern 5 may be further patterned to form a fifth step S5. In addition, the insulation layer 101 and the sacrificial layer 103 directly under the fifth pattern 5 may be patterned to form a sixth pattern, that is, a sixth step 6.

As shown in FIGS. 5F through 5K, by the two-times mask trim process and three-times etching process additionally with two-times auxiliary etching process, the insulation layer 101 and the sacrificial layer 103 directly under the first etch stop layer 120*a* may be three times patterned to form the fourth step S4, the insulation layer 101 and the sacrificial layer 103 directly under the fourth step S4 may be two times patterned to form the fifth step S5, and the insulation layer 101 and the sacrificial layer 103 directly under the fifth step S5 may be one-time patterned to form the sixth step S6.

Referring to FIG. 5L, after the secondly-trimmed second mask 34 is removed, a second etch stop layer 120*b* may be formed on the mold stack 100 in which the first to sixth steps S1 to S6 are formed. The second etch stop layer 120*b* may be formed by conformally depositing an identical or similar material to that of the first etch stop layer 120*a*, for example, an aluminum oxide layer. The second etch stop layer 120*b* may be formed to have a stepped shape covering the first etch stop layer 120*a* along the upper profile of the mold stack 100.

Referring to FIG. 5M through 5Q, seventh to tenth steps S7, S8, S9 and S10 may be further formed by performing a trim cycle identically or similarly to those described with reference to FIGS. 5F through 5K. A third etch stop layer 120*c* may be further formed on the mold stack 100 further including the steps S7 to S10. The resulting mold stack 100 may have a step structure 107. The step structure 107 may be implemented at all four sides, at three sides, at two sides, at opposed two sides, or at one side of the mold stack 100.

In one embodiment, referring to FIG. 5M, a third mask 40 may be formed on the second etch stop layer 120*b*, and then a fifth pattern 7 may be formed by patterning the insulation layer 101 and the sacrificial layer 103 directly under the second etch stop layer 120*b* through a first etching process using the third mask 40.

Referring to FIG. 5N, a firstly-trimmed third mask 42 may be formed by firstly trimming the third mask 40. A reduced seventh pattern 7*a* may be formed by further patterning the seventh pattern 7 through a second etching process using the firstly-trimmed third mask 42, and a eighth pattern 8 may be formed by patterning the insulation layer 101 and the sacrificial layer 103 directly under the seventh pattern 7. Since a portion of the second etch stop layer 120*b* may be exposed by the first mask trim process, an auxiliary etching process may be further performed before the second etching process to remove an exposed portion of the second etch stop layer 120*b*.

Referring to FIG. 5O, a secondly-trimmed third mask 44 may be formed by secondly trimming the firstly-trimmed third mask 42. A double-reduced seventh pattern 7*b* may be formed by further patterning the reduced seventh pattern 7*a* through a second etching process using the secondly-trimmed third mask 44. A reduced eighth pattern 8*a* may be formed by further patterning the eighth pattern 8, and then a ninth pattern 9 may be formed by patterning the insulation layer 101 and the sacrificial layer 103 directly under the eighth pattern 8. A portion of the second etch stop layer 120*b* may be exposed outside the third mask 44. The exposed portion of the second etch stop layer 120*b* may be removed by further performing an auxiliary etching process before a third etching process to create the same etching environment.

Referring to FIG. 5P, a thirdly-trimmed third mask 46 may be formed by thirdly trimming the secondly-trimmed third mask 44, and then a seventh step S7 may be formed by further patterning the double-reduced seventh pattern 7*b* through a fourth etching process using the thirdly-trimmed third mask 46. In addition, the reduced eight pattern 8*a* may be further patterned by the fourth etching process to form an eighth step S8, the ninth pattern 9 may be further patterned to form a ninth step S9, and the insulation layer 101 and the sacrificial layer 103 directly under the ninth pattern 9 may be patterned to form a tenth pattern, that is, a tenth step S10. The second etch stop layer 120*b* exposed outside the thirdly-trimmed third mask 46 by the third mask trimming may be removed by further performing an auxiliary etching process before the fourth etching process. Thus, a step structure 107 may be implemented at one or more sides of the mold stack 100.

As shown in FIGS. 5M through 5P, by three-times mask trim process and four-times etching process additionally with three-times auxiliary etching process, the insulation layer 101 and the sacrificial layer 103 directly under the second etch stop layer 120*b* may be patterned four times to form the seventh step S7. The insulation layer 101 and the sacrificial layer 103 directly under the seventh step S7 may be patterned three times to form the eighth step S8. The insulation layer 101 and the sacrificial layer 103 directly under the eighth step S8 may be patterned two times to form the ninth step S9. And the insulation layer 101 and the sacrificial layer 103 directly under the ninth step S9 may be patterned one time to form the tenth step S10.

Referring to FIG. 5Q, the thirdly-trimmed third mask 46 may be removed and third etch stop layer 120*c* may be formed on the mold stack 100. Therefore, an etch stop layer 120 comprising the first to third etch stop layers 120*a*, 120*b* and 120*c* may be provided on the mold stack 100 with the first to tenth steps S1 to S10. The third etch stop layer 120*c* may be formed of an identical or similar material to that of the first etch stop layer 120*a* and/or second etch stop layer 120*b*. For example, the third etch stop layer 120*c* may be formed by conformally depositing an aluminum oxide layer. The third etch stop layer 120*c* may be formed to cover the second etch stop layer 120*b* along the upper profile of the mold stack 100. The third etch stop layer 120*c* may be formed to cover the lowermost insulation layer 101.

According to an embodiment of the inventive concept, the etch stop layer 120 may have a mixed structure comprising at least one multi-layer and at least one mono-layer. The thickness of the etch stop layer 120 may be progressively reduced in the order of the first step S1 to the tenth step S10, but may be locally identical or similar. For example, the etch stop layer 120 may be divided into a triple-layer structure of greater thickness in which the first to third etch stop layers 120*a* to 120*c* are stacked in the first section 121, a bi-layer structure of intermediate thickness in which the first and second etch stop layers 120*a* and 120*b* are stacked in the second section 123, and a mono-layer structure of smaller thickness including the third etch stop layer 120*c* in the third section 125. The first section 121 may include the first to fourth steps S1 to S4. The second section 123 may include the fifth to seventh steps S5 to S7. The third section 125 may include the eighth to tenth steps S8 to S10.

As shown in FIGS. 5A through 5Q, the section and thickness distribution of the etch stop layer 120 may be obtained by two-times repeating the two-times mask trim process (and three-times etching process) and the etch stop layer formation process, and performing the three-times mask trim process (and four-times etching process) and the etch stop layer formation process. Otherwise, various examples of etch stop layers 120 may be formed by modifying the trim cycle.

In one embodiment, the etch stop layer 120 may comprise the first and second stop layers 120*a* and 120*b* except for the third etch stop layer 120*c*. In this case, a portion of the step structure 107, for example, the first to seventh steps S1 to S7 may be covered with the etch stop layer 120, but the eighth to tenth steps S8 to S10 may be exposed. In another embodiment, a fourth etch stop layer (not shown) may be further formed to cover the third etch stop layer 120c. In this case, the etch stop layer 120 may have comprise a quadruple layer, a triple layer, and a double layer in the order of the top of the mold stack 100 to the bottom of the mold stack 100.

In another embodiment, referring to FIG. 5R, the etch stop layer 120 may have a first section 121 that extends deeper into the stack as compared to the embodiment depicted in FIG. 5Q. Similarly, the second section 123 extends deeper into the stack as compared to the embodiment depicted in FIG. 5Q. For example, the first to fourth steps S1 to S4 and the first etch stop layer 120a may be formed by three-times mask trim process and four-times etching process. The fifth to eighth steps S5 to S8 and the second etch stop layer 120b may be formed by three-times mask trim process and four-times etching process. The ninth and tenth steps S9 and S10 and the third etch stop layer 120c may be formed by one-time mask trim process and two-times etching process. According to the present embodiment, the first section 121 of the etch stop layer 120 having a greater thickness may include the first to fifth steps S1 to S5. The second section 123 having an intermediate thickness may include the sixth to ninth steps S6 to S9. The third section 125 having a smaller thickness may include the tenth step S10.

In another embodiment, referring to FIG. 5S, the etch stop layer 120 may have a second section 123 that extends deeper into the stack as compared to the other embodiments depicted herein. For example, the first to third steps S1 to S3 and the first etch stop layer 120a may be formed by two-times mask trim process and three-times etching process. The fourth to seventh steps S4 to S7 and the second etch stop layer 120b may be formed by three-times mask trim process and four-times etching process. The eighth to tenth steps S8 to S10 and the third etch stop layer 120c may be formed by two-times mask trim process and three-times etching process. According to the present embodiment, the first section 121 having a relatively great thickness may include the first to fourth steps S1 to S4. The second section 123 having an intermediate thickness may include the fifth to eighth steps S5 to S8. The third section 125 having a relatively small thickness may include the ninth and tenth steps S9 and S10.

As describe above, the size of the sections 121, 123 and 125 of the etch stop layer 125 may be determined based on the number of the mask trim processes in a given trim cycle. For example, as the number of the mask trim processes increases in the first trim cycle, the first section 121 may be broadened. Also, the number of the sections 121 to 125 may be determined according to the performance number of the trim cycle. For example, as the performance number of the trim cycle increases, the number of the sections 121 to 125 may increase to extend the thickness and thickness distribution of the etch stop layer 120. For example, when the trim cycle is performed four times, an etch stop layer having four sections may be formed. When generalizing this, N-times performance of the trim cycle may form an etch stop layer 120 that can be divided into N sections. Also, the thickness of the etch stop layer 120 may be identical or similar in one section, but may vary according to N sections. In addition, as the number of the mask trim processes increases in N-th trim cycle, the width of the N-th section may increase.

The mask trim process may reduce the extent of the mask. Accordingly, when the mask margin of a mask is deficient, a portion of a step structure may be exposed to cause damage during further processing. For example, when the trimmed third mask 46 is formed by mask trimming as shown in FIG. 5P, a portion 11 of the first step S1 and/or the second step S2 may be exposed due to deficiency of the margin of the third mask 46, as shown in FIG. 5T. In this case, the sacrificial layer 103 may be damaged to allow the step structure 107 defective and make it difficult to form a pad or contact region as described below. In addition, when the vertical channel 110 is protruded from the mold stack 100, the upper portion of the vertical channel 110 may be exposed beyond the third mask 46. In this case, damage to the vertical channel may occur during a subsequent chemical mechanical polishing or etching process. This damage may occur during the mask trimming when the upper profile of the mold stack 100 has a relatively great step difference.

However, according to the present embodiment, although a portion of the step structure 107 is exposed due to undesired excessive exposure of the mask by the mask trimming, the damage of the step structure 107 can be prevented by the etch stop layer 120, thereby mitigating or eliminating associated process defects.

In another embodiment, the formation process of the etch stop layer 120 need not be performed in concurrence with the step pattern process. For example, the mold stack 100 may be patterned to have a step structure 107 without the etch stop layer 120, by omitting the process for forming the first to third etch stop layers 120a, 120b and 120c in FIGS. 5A through 5Q. Thereafter, a first etch stop layer 120a may be formed to selectively cover the first step S1 through the fourth step S4 by depositing and then patterning, for example, an aluminum oxide layer on the mold stack 100. Next, a second etch stop layer 120b may be formed to selectively cover the first step S1 to seventh step S7 and cover the first etch stop layer 102a in the first step S1 to the fourth step S4, by repeating the deposition and patterning of the aluminum oxide layer. Next, a third etch stop layer 120c may be formed to cover the first to tenth steps S1 to S10 by again repeating the deposition and patterning of the aluminum oxide layer. According to embodiments of the present inventive concepts, the etch stop layer 120 shown in FIG. 5Q may be thereby formed.

In another embodiment, the etch stop layer 120 may be formed with a mono-layer structure. For example, as shown in FIG. 5U, the insulation layers 101 and the sacrificial layers 103 may be patterned by mask trim and etching process to form the mold stack 100 having the step structure 107. Thereafter, the etch stop layer 120 having a mono-layer structure may be formed by depositing an aluminum oxide layer on the mold stack 100.

Referring again to FIG. 5Q, the etch stop layer 120 may be formed of the same or different kinds of material. For example, all of the first to third etch stop layers 120a to 120c may be formed of one of an aluminum oxide layer, a hafnium oxide layer, a titanium oxide layer, a tantalum oxide layer, a zirconium oxide layer, a germanium oxide layer, silicon carbide, silicon oxycarbide, silicon carbon nitride, and a combination thereof, for example, by depositing an aluminum oxide layer. In this case, the first to third etch stop layers 120a to 120c may be formed to have the same thickness or different thicknesses. In another embodiment, the etch stop layer 120 may be formed of materials having an etch selectivity relative to that of a silicon oxide layer and/or a silicon nitride layer. For example, the first etch stop layer 120a may be formed by depositing one of the above materials. The second etch stop layer 120b may be formed by depositing another material. The third etch stop layer 120c may be formed by depositing another material that is different from those of the first and second etch stop layers 120a, 120b.

The outermost third etch stop layer 120c may have a relatively greater etching blocking ability during formation of a contact hole 137 as described below with reference to FIG. 4J. When the control hole 137 is formed, the etch stop layer 120 may remain in the contact hole 137. Therefore, it is preferable to form the etch stop layer 120 by depositing a material that is relatively readily removed.

In one embodiment, when the first to third etch stop layers 120a to 120c are formed of the same kind of material to have different thicknesses, the third etch stop layer 120c may have a greater thickness, the first etch stop layer 120a may have a smaller thickness, and the second etch stop layer 120b may have an intermediate thickness.

In another embodiment, when the first to third etch stop layers 120a to 120c are formed of materials having different etch selectivities, the third etch stop layer 120c may be formed of a material having a greater etch selectivity, the first etch stop layer 120a may be formed of a material having a smaller etch selectivity, and the second etch stop layer 120b may be formed of a material having an intermediate etch selectivity.

<Attachment Process>

Figure 6A:
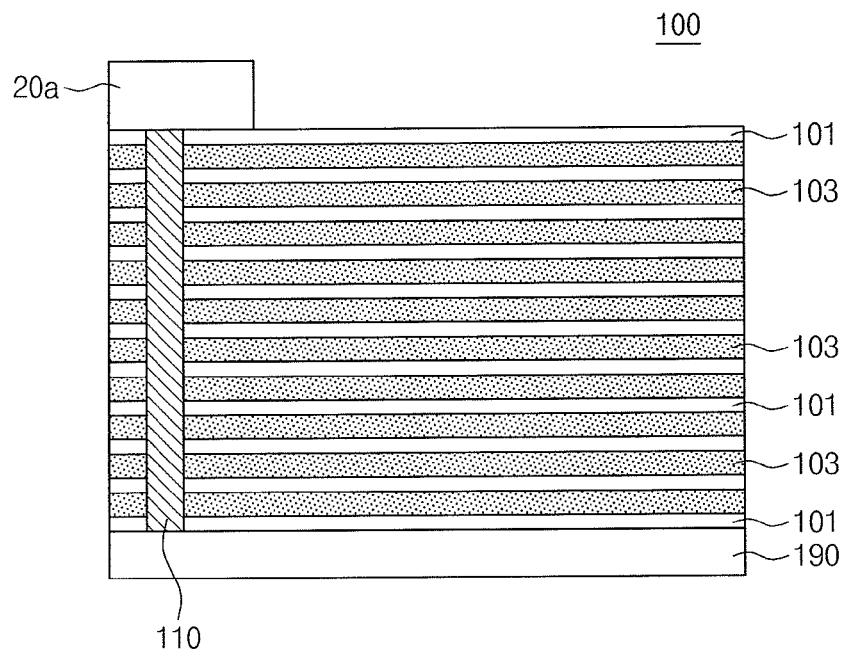
FIGS. 6A through 6J are cross-sectional views illustrating an attachment process in a method for fabricating a semiconductor device according to an embodiment of the inventive concept.

FIGS. 6A through 6J are cross-sectional views illustrating an attachment process in a method for fabricating a semiconductor device according to an embodiment of the inventive concept. Referring to FIG. 6A, a first mask 20a may be formed on the mold stack 100. The first mask 20a may be formed, for example, by deposition and patterning of a photoresist. According to the present embodiment, since an attach process operates to enlarge the size of a mask, the first mask 20a may be formed to have an appropriate size to form an uppermost step of the resulting stack. The attach process described below may be performed before or after the vertical channel 110 is formed.

Referring to FIGS. 6B through 6F, masks 22a and 24a may be sequentially formed from the first mask 20a by a polymer attach process. Steps S1, S2 and S3 may be formed by repeatedly patterning the mold stack 100 through several-times etching process using the masks 20a, 22a and 24a. A first etch stop layer 120a may be formed on the mold stack 100 with the steps S1 to S3. In the present disclosure, the mask enlargement and etch stop layer formation processes for forming one of the first to third etch stop layer 120a to 120c will be defined as an attach cycle. The mask enlargement process may be implemented by a polymer attach process that forms a spacer on the side surface of the mask through a deposition and etch process of polymer. The polymer attach process in one attach cycle will not be limited to a specific number of steps. In another embodiment, the mask enlargement process may use a material having an etch selectivity with the insulation layer 101 and the sacrificial layer 103, for example, silicon carbide, metal, metal oxide, and metal nitride.

Figure 6B:
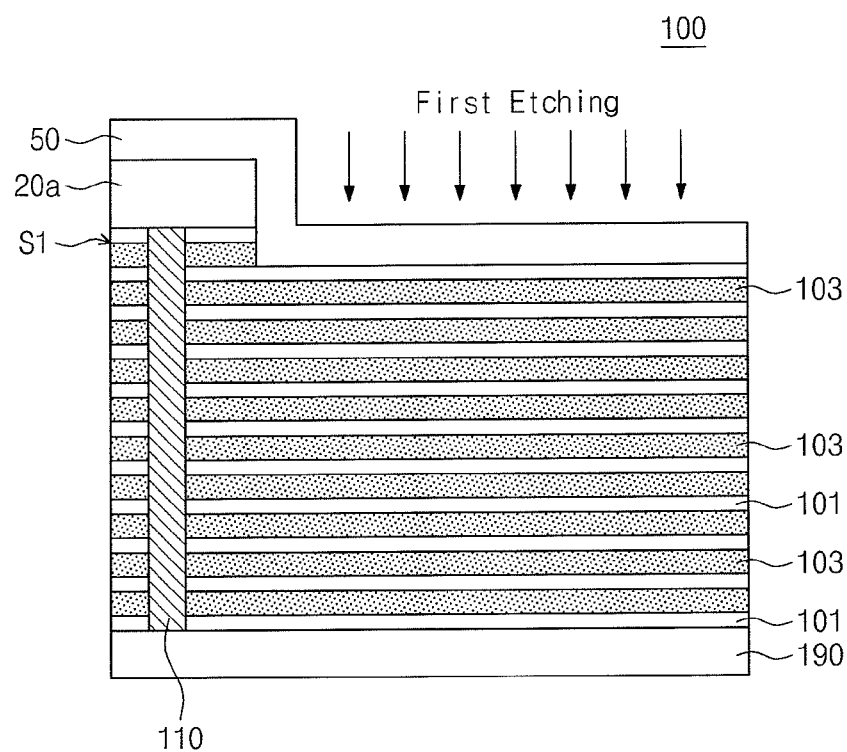

In one embodiment, referring to FIG. 6B, the first step S1 may be formed by patterning the uppermost insulation layer 101 and sacrificial layer 103 through a first etching process using the first mask 20a. Thereafter, a spacer layer 50 may be formed on the mold stack 100 to cover the first mask 20a. The spacer layer 50 may be formed, for example, by a polymer deposition process using plasma including gases including C—H—F, $N_2$, and Ar.

Figure 6C:
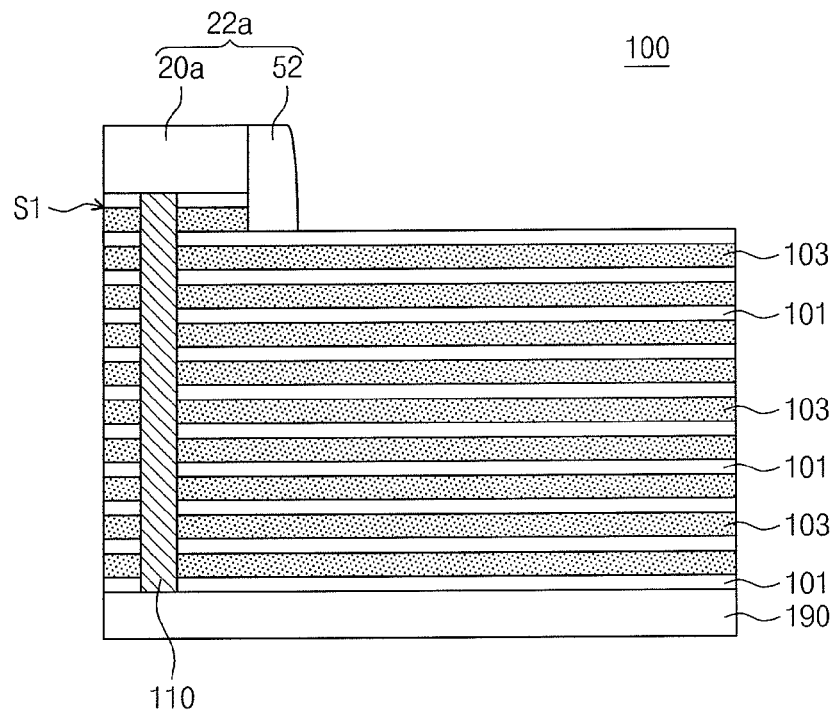

Referring to FIG. 6C, a first spacer 52 may be formed by removing a portion of the spacer layer 50 through polymer etching. The first spacer 52 may be formed on four side surfaces, three side surfaces, two side surfaces, opposed dual side surfaces, or one side surface of the first mask 20a. The first mask 20a and the first spacer 52 may form a firstly-enlarged first mask 22a. The first spacer 52 may be formed by etching the spacer layer 50 through an anisotropic etching technology using plasma including gases used in the formation of the spacer layer 50. According to the present embodiment, since the polymer deposition of FIG. 6B and the polymer etching of FIG. 6C may be performed using the same plasma, the polymer deposition and etching may be performed in-situ. When the polymer deposition and etching are performed using the same plasma in-situ, the process condition may be differently set to implement effective deposition and etching. In the polymer deposition process, the content of C and H, or C may be set higher than that of F. In the polymer etching process, the content of C and H, or C may be set lower than that of F. In one embodiment, methyl fluoride ($CH_3F$) may be provided in the polymer deposition process, and trifluoromethane ($CHF_3$), carbon tetrafluoride ($CF_4$), or a combination thereof may be provided in the polymer etching process.

Figure 6D:
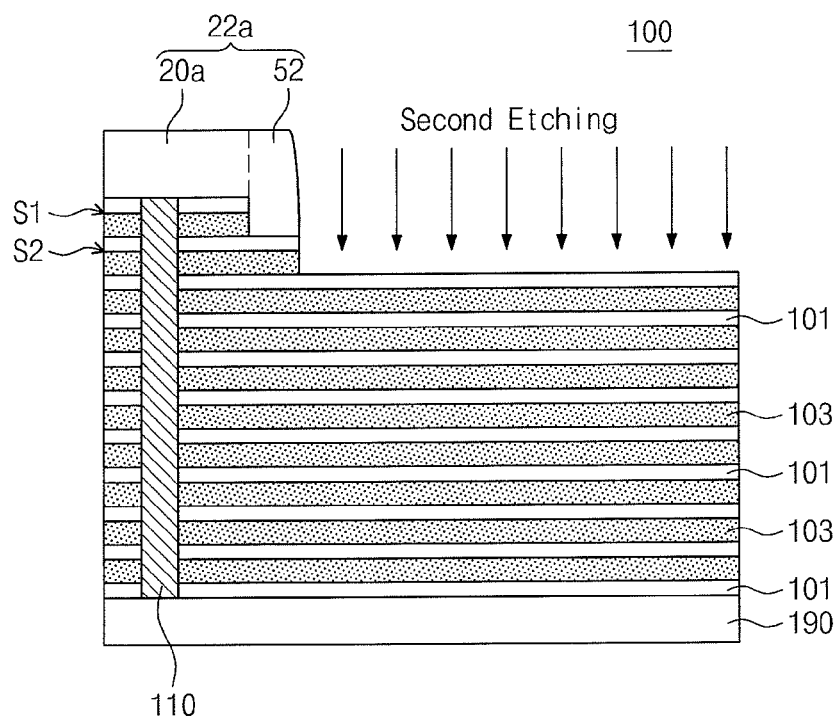

Referring to FIG. 6D, the second step S2 may be formed by patterning the insulation layer 101 and the sacrificial layer 103 directly under the first step S1 through a second etching process using the firstly-enlarged first mask 22a. When the first spacer 52 is formed on four side surfaces, three side surfaces, two side surfaces, opposed dual side surfaces, or one side surface of the first mask 20a, the second step S2 may be formed on four side surfaces, three side surfaces, two side surfaces, opposed dual side surfaces, or one side surface of the mold stack 100.

Figure 6E:
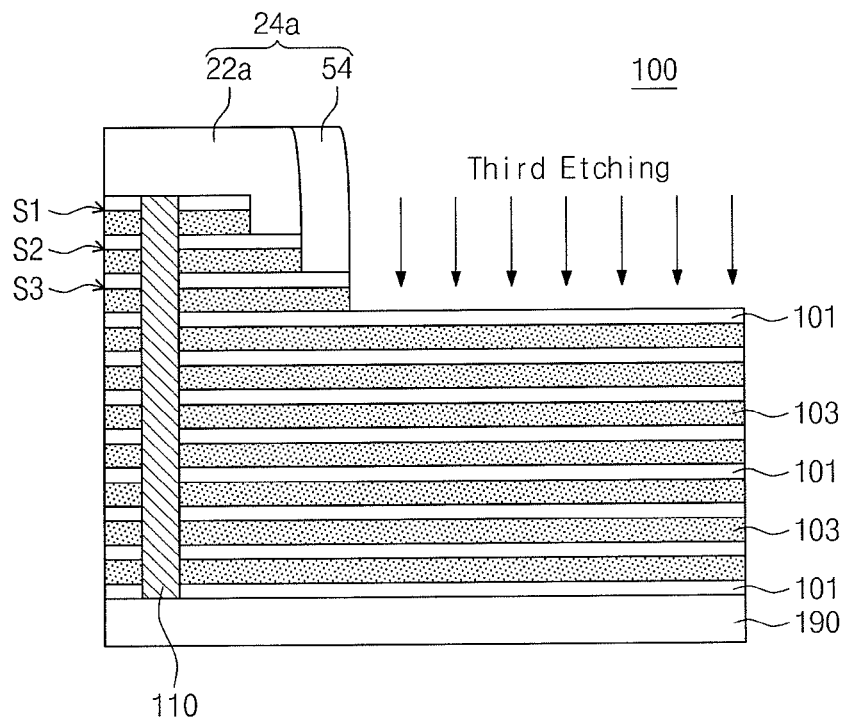

Referring to FIG. 6E, the firstly-enlarged first mask 22a may be formed into a secondly-enlarged first mask 24a. The third step S3 may be formed by patterning the insulation layer 101 and the sacrificial layer 103 directly under the second step S2 through a third etching process using the secondly-enlarged first mask 24a. The secondly-enlarged first mask 24a may be formed by attaching a second spacer 54 on at least one side surface of the firstly-enlarged first mask 22a using the polymer attach process described with reference to FIGS. 6B and 6C.

As shown in FIGS. 6B through 6E, by two-times polymer attach process and three-times etching process, the uppermost insulation layer 101 and sacrificial layer 103 may be patterned one time to form the first step S1. The insulation layer 101 and sacrificial layer 103 directly under the first step S1 may also be patterned one time to form the second step S2. The insulation layer 101 and sacrificial layer 103 directly under the second step S2 may also be patterned one time to form the third step S3. Since the mask enlargement process using the polymer attach process according to the present embodiment is attaching the spacers 52 and 54 on the side surface of the first mask 20a, the modification of the first mask 20a itself, particularly, reduction thereof, is avoided. The same goes for the spacers 52 and 54. Accordingly, since the width of the spacers 52 and 54, that is, the horizontal length, can be set uniformly by a desired degree, the size (horizontal length) of the first to third steps S1 to S3 may also be formed as intended. In addition, since different etching environments like that of FIG. 5G are not created in the attach cycle according to the present embodiment, an auxiliary etching process may be omitted.

Figure 6F:
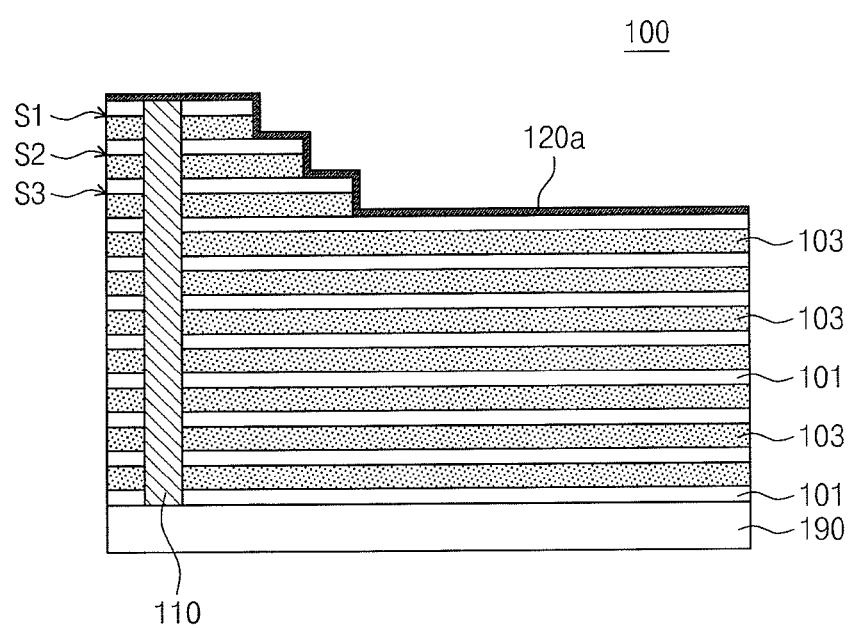

Referring to FIG. 6F, the first etch stop layer 120a may be formed on the mold stack 100 with the first to third steps S1 to S3 after the secondly-enlarged first mask 24a is removed. For example, the first etch stop layer 120a may be formed by conformally depositing an insulation layer, for example, an aluminum oxide layer having an etch selectivity with the insulation layer 101 and the sacrificial layer 103. The first etch stop layer 120*a* may be formed to have a stepped shape along the upper profile of the mold stack 100.

Figure 6G:
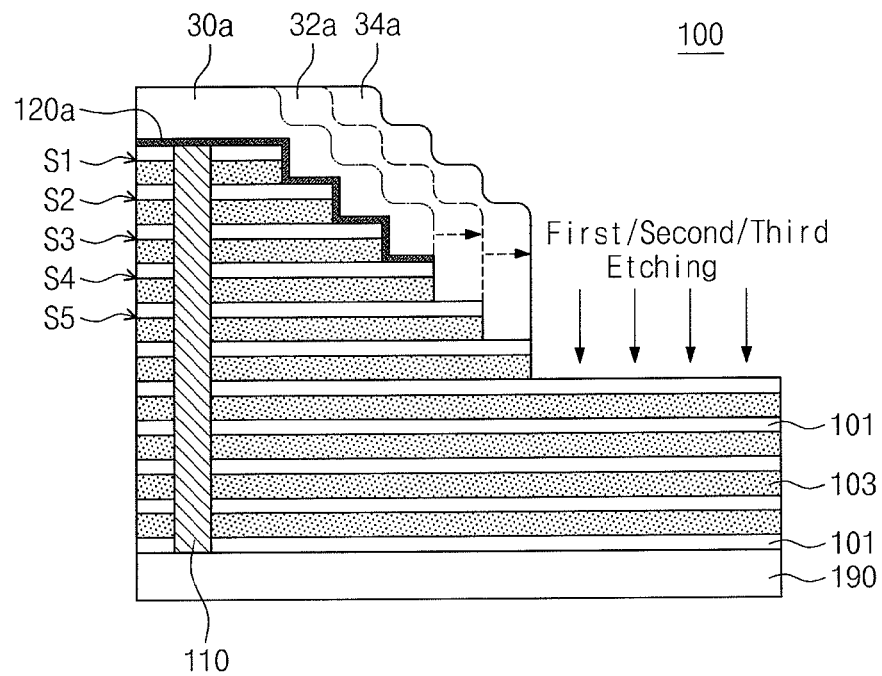
Figure 6H:
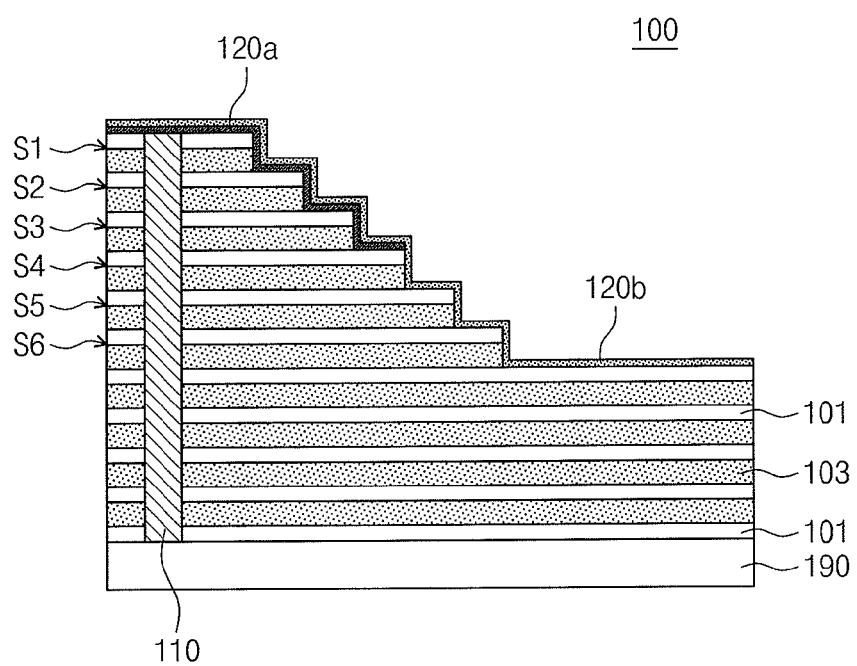

Referring to FIGS. 6G and 6H, by the attach cycle identical or similar to those described with reference to FIGS. 6A through 6F, for example, two-times polymer attach process and three-times etching process, fourth to sixth steps S4, S5 and S6 may be further formed on the mold stack 100, and a second etch stop layer 120*b* may be formed to cover the first etch stop layer 120*a*.

In one embodiment, referring to FIG. 6G, a second mask 30*a* may be formed on the mold stack 100. A fourth step S4 may be formed by patterning the insulation layer 101 and sacrificial layer 103 directly under the third step S3 through a first etching process using the second mask 30*a*. Next, a first spacer may be attached to at least one sidewall of the second mask 30*a* by the polymer attach process described in FIGS. 6B and 6C to form a firstly-enlarged second mask 32*a*. The fifth step S5 may be formed by patterning the insulation layer 101 and sacrificial layer 103 directly under the fourth step S4 through a second etching process using the firstly-enlarged second mask 32*a*. Thereafter, a second spacer may be attached to at least one sidewall of the firstly-enlarged second mask 32*a* through a polymer attach process to form a secondly-enlarged second mask 34*a*. The sixth step S6 may be formed by patterning the insulation layer 101 and sacrificial layer 103 directly under the fifth step S5 through a third etching process using the secondly-enlarged second mask 34*a*.

Referring to FIG. 6H, a second etch stop layer 120*b* may be formed on the resulting mold stack 100 including the first to sixth steps S1 to S6 after the secondly-enlarged second mask 34*a* is removed. The second etch stop layer 120*b* may be formed by conformally depositing an material identical or similar to that of the first etch stop layer 120*a*, for example, an aluminum oxide layer. The second etch stop layer 120*b* may be formed to have a stepped shape covering the first etch stop layer 120*a* along the upper profile of the mold stack 100.

Figure 6I:
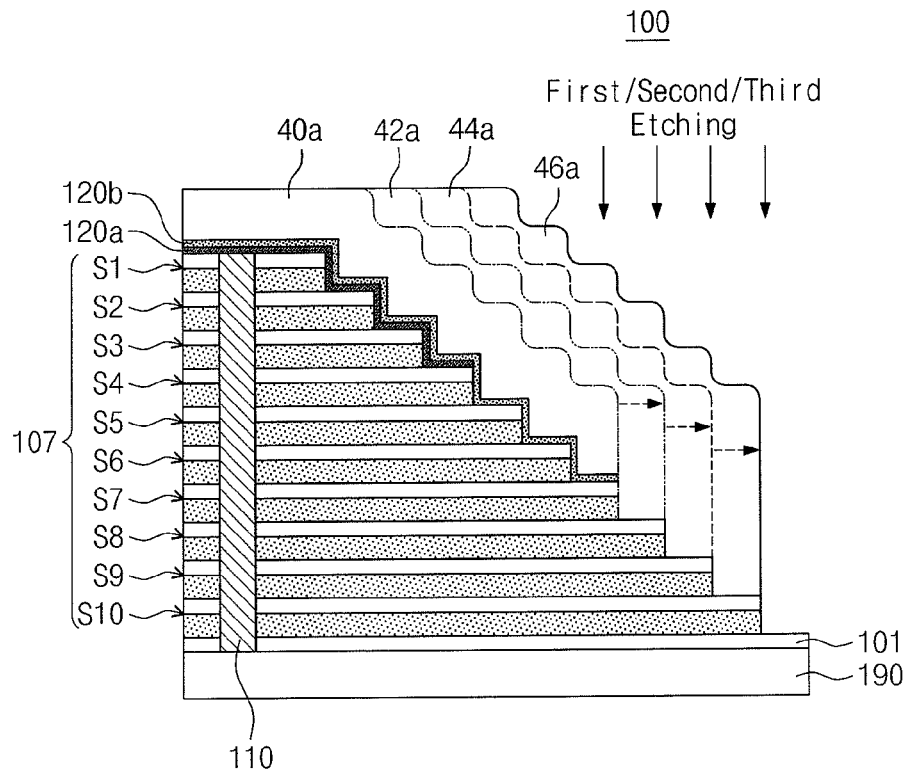
Figure 6J:
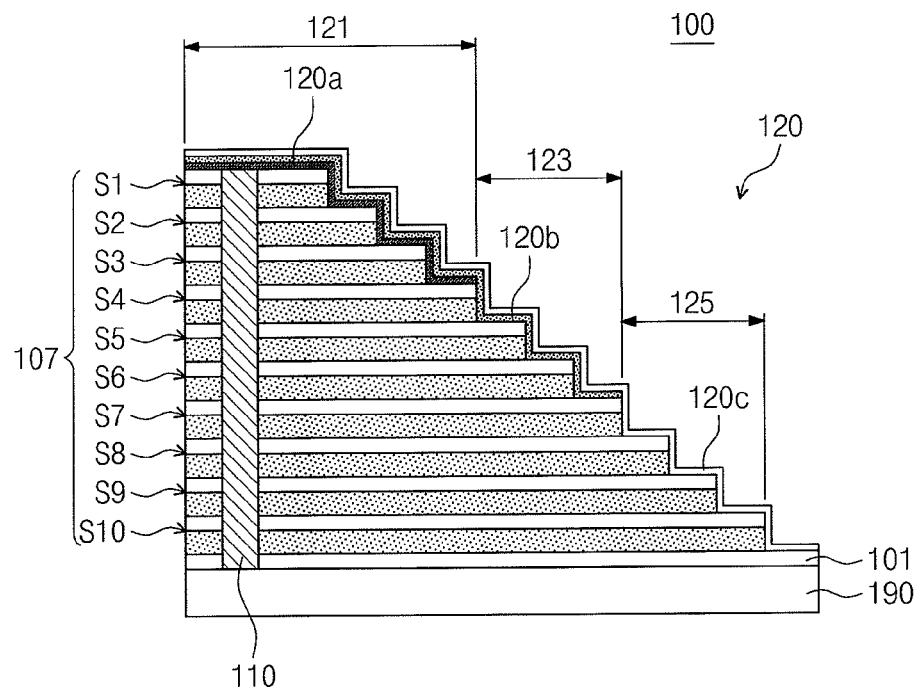

Referring to FIGS. 6I and 6J, seventh to tenth steps S7 to S10 and a third etch stop layer 120*c* covering the second etch stop layer 120*b* may be further formed on the mold stack 100 by repeating an attach cycle identically or similarly to those described with reference to FIGS. 6A through 6F. The attach cycle herein may include three-times polymer attach process and four-times etching process.

In one embodiment, referring to FIG. 6I, a third mask 40*a* may be formed on the mold stack 100, and then the seventh step S7 may be formed by patterning the insulation layer 101 and sacrificial layer 103 directly under the sixth step S6 through a first etching process using the third mask 40*a*. Next, a firstly-enlarged third mask 42*a* may be formed by attaching a first spacer to at least one sidewall of the third mask 40*a* by a polymer attach process, and then the eighth step S8 may be formed by patterning the insulation layer 101 and sacrificial layer 103 directly under the seventh step S7 through a second etching process using the firstly-enlarged third mask 42*a*. Thereafter, a second spacer may be attached to at least one sidewall of the firstly-extended third mask 42*a* through a polymer attach process to form a secondly-enlarged third mask 44*a*. The ninth step S9 may be formed by patterning the insulation layer 101 and sacrificial layer 103 directly under the eighth step S8 through a third etching process using the secondly-enlarged third mask 44*a*. Thereafter, a third spacer may be attached to at least one sidewall of the secondly-enlarged third mask 44*a* through a polymer attach process to form a thirdly-enlarged third mask 46*a*. The tenth step S10 may be formed by patterning the insulation layer 101 and sacrificial layer 103 directly under the ninth step S9 through a fourth etching process using the thirdly-enlarged third mask 46*a*. According to the present embodiment, at least one side surface of the mold stack 100 may have a stepped structure 107.

Referring to FIG. 6J, the thirdly-enlarged third mask 46*a* may be removed and then a third etch stop layer 120*c* may be formed on the mold stack 100 including the first to tenth steps S1 to S10. Therefore, the mold stack 100 may have an etch stop layer 120 thereon. The etch stop layer 120 may be divided into first to third sections 121, 123 and 125 and may have different thicknesses by the sections 121, 123, 125 in a manner similar to that described in connection with the embodiment of FIG. 5Q. The third etch stop layer 120*c* may be formed by conformally depositing a material identical or similar to that of the first etch stop layer 120*a* and/or the second etch stop layer 120*b*, for example, an aluminum oxide layer. The third etch stop layer 120*c* may be formed to cover the second etch stop layer 120*b* along the upper profile of the mold stack 100.

The section and thickness distribution of the etch stop layer 120, as described with reference to FIGS. 6A through 6J, may be obtained by two times repeating the two-times mask attach process (and three-times etching process) and the etch stop layer formation process, and performing the three-times mask attach process (and four-times etching process) and the etch stop layer formation process. Otherwise, when the trim cycle is modified, for example, when the number of the mask attach processes is increased, the etch stop layer 120 in which the first section 121 having a relatively greater thickness is extended may be obtained.

In the attach process, in a manner that is identical to, or similar to, the trim process, when the attach cycle is performed N-times, the etch stop layer 120 may be formed to have N sections. The etch stop layer 120 may have different thicknesses by N sections. Also, as the number of the polymer attach processes increases in an N-th attach cycle, the width of the N-th section may increase. Accordingly, when the attach cycle is modified, various examples of etch stop layers 120 may be formed as shown in FIGS. 5R and 5S. Also, in a manner that is different from the mask trim process, since the polymer attach process enlarges the mask, there is no possibility of margin deficiency due to mask reduction. Accordingly, damage to the step structure 107 s mitigated or eliminated.

In another embodiment, the process for forming the etch stop layer 120 may be omitted during the step patterning process forming the step structure 107 on the mold stack 100 in FIGS. 6A through 6J. The etch stop layer 120 may be formed by repeating deposition and patterning an aluminum oxide layer after forming the step structure 107 on the mold stack 100 using the step patterning process. In another embodiment, the step structure 107 may be formed by patterning the mold stack 100 through a mask enlargement and etching process, and then an aluminum oxide layer may be deposited to form the etch stop layer 120 of a mono-layer structure as shown in FIG. 5U.

Returning to FIG. 4D, a plurality of word line cuts 135 may be formed. For example, an insulation layer 130 may be formed on the mold stack 100, and then the word line cuts 135 exposing a semiconductor substrate 190 or a lowermost sacrificial layer 103 may be formed by patterning the insulation layer 130 and the mold stack 100 having the etch stop layer 120 thereon. In this case, the word line cuts 135 may be formed such that the uppermost insulation layer 101 and sacrificial layer 103 have line shapes.

Figure 4D:
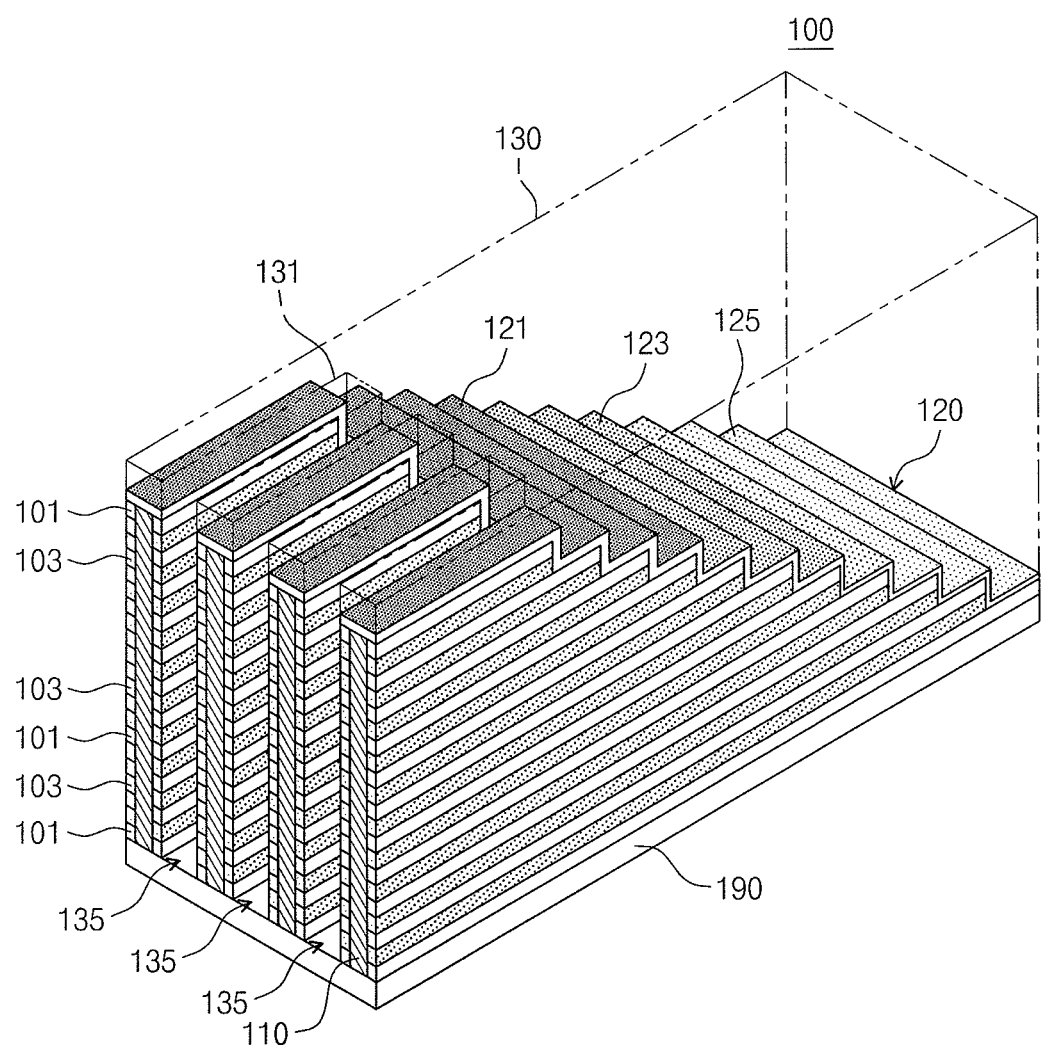
Figure 4E:
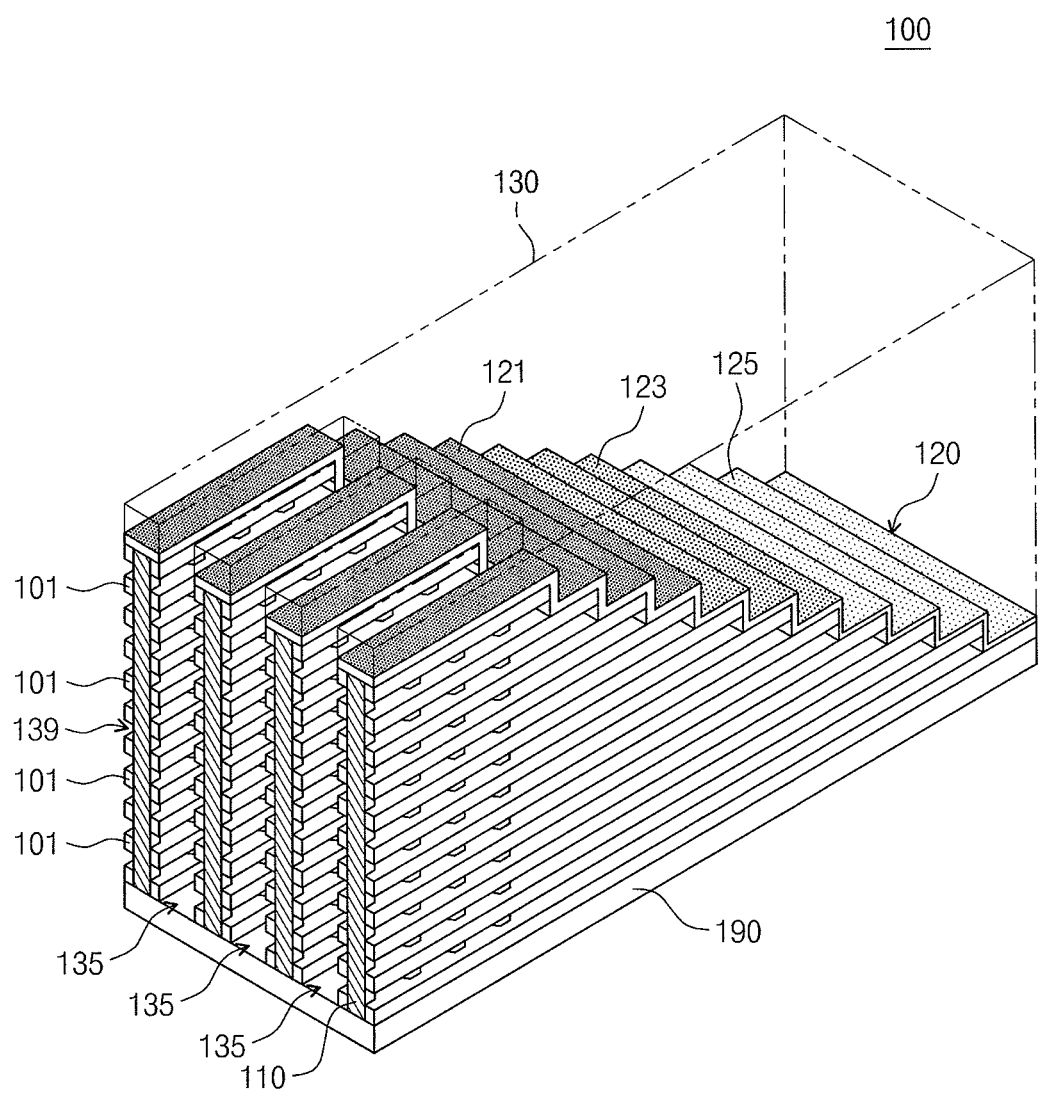

Referring to FIG. 4E, recess regions 139 may be formed between insulation layers 101 by removing insulation layers 103. The recess region 139 may use an isotropic etching process using an etchant that can selectively remove the sacrificial layers 103 with respect to the insulation layers 101. For example, when the insulation layer 101 is a silicon oxide layer and the sacrificial layer 103 is a silicon nitride layer, an etchant including phosphoric acid may be provided through the word line cuts 135 to remove the sacrificial layers 103.

Figure 4F:
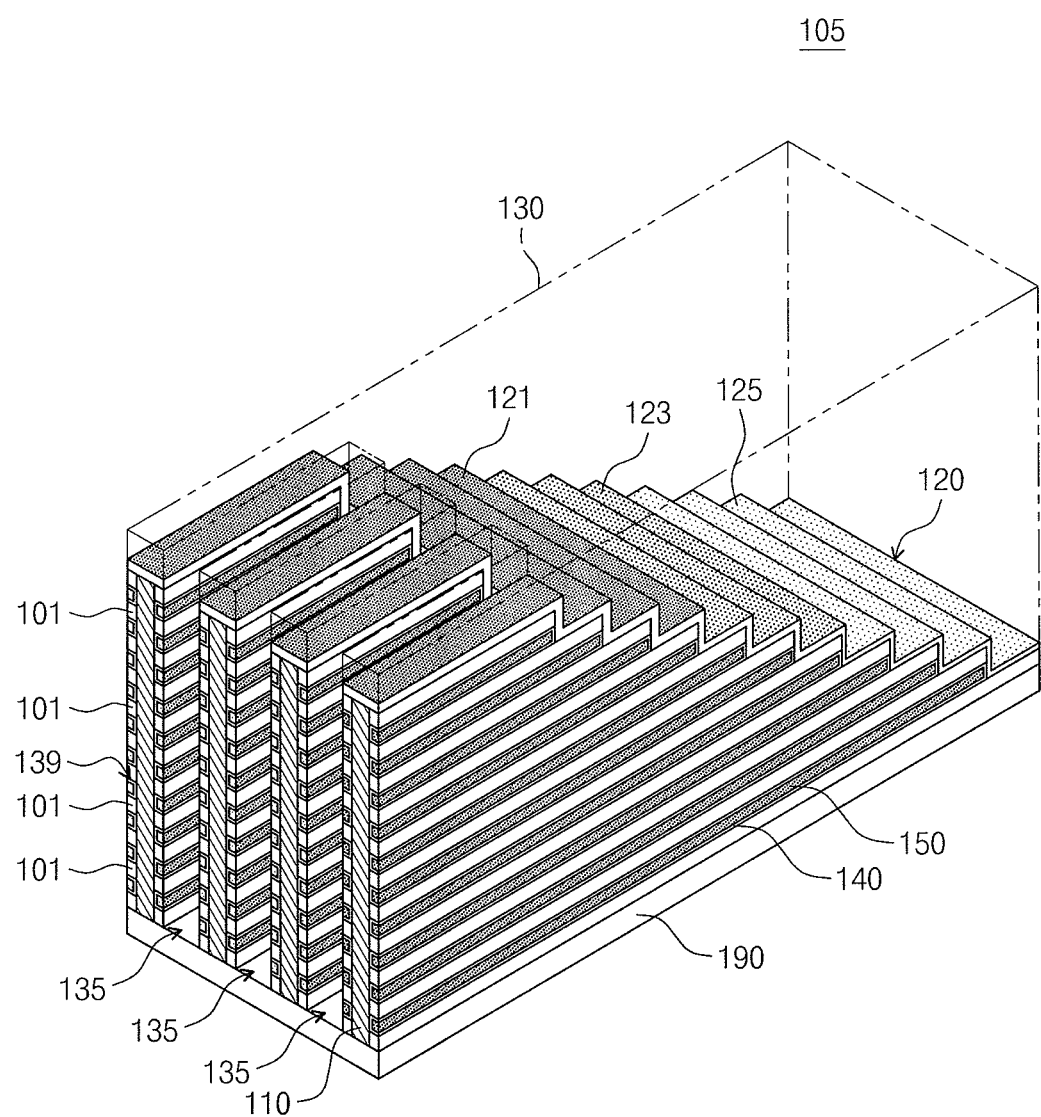

Referring to FIG. 4F, an information storage layer 140 and a gate 150 may be sequentially formed in the recess region 139 to form a gate stack 105. In one embodiment, the information storage layer 140 may be formed to substantially conformally cover the inside of the recess regions 139 in a relatively small thickness by a deposition process having excellent step coverage, e.g., chemical vapor deposition or atomic layer deposition.

The information storage layer 140, as shown in FIG. 1D, may include a tunnel insulation layer 141, a charge storage layer 143, and a blocking insulation layer 145. The tunnel insulation layer 141 may include at least one of a silicon oxide layer and a silicon nitride layer. The blocking insulation layer 145 may include at least one of a silicon oxide layer, a silicon nitride layer, and an aluminum oxide layer. The charge storage layer 143 may be one of a trap insulation layer, a floating gate, an insulation layer having conductive nanodots. For example, the tunnel insulation layer 141 may include a silicon oxide layer. The blocking insulation layer 145 may include a silicon oxide layer or an aluminum oxide layer. The charge storage layer 143 may include a silicon nitride layer.

The gates 150 may be formed to fill the recess regions 139 covered by the information storage layers 140. In one embodiment, the recess region 139 and the word line cuts 135 may be filled with a conductive material. The conductive material filling the word line cuts 135 may be selectively removed by an anisotropic etching process to form the gates 150. The gates 150 may be vertically spaced from each other by the insulation layers 101, and may have a vertically stacked step structure. The material used to form the gates 150 may include at least one of doped silicon, tungsten, metal nitride, and metal silicide. In one embodiment, the gates 150 may be formed of tungsten, titanium nitride, and a combination thereof.

According to embodiments of the present inventive concepts, since the gate 150 is formed by a replacement process that fills the recess region 139 formed by removing the sacrificial layer 103, the material of the gate 150 can be selectively chosen. For example, in a structure where the presently described replacement process is not applied, there may be a limitation in forming the gate 150 of a metal material. For example, when the mold stack 100 is formed of insulation layers and metal layers stacked vertically, there may be a difficulty in obtaining a desired shape during the formation of a vertical channel 104 or patterning of a step structure 107.

Figure 4G:
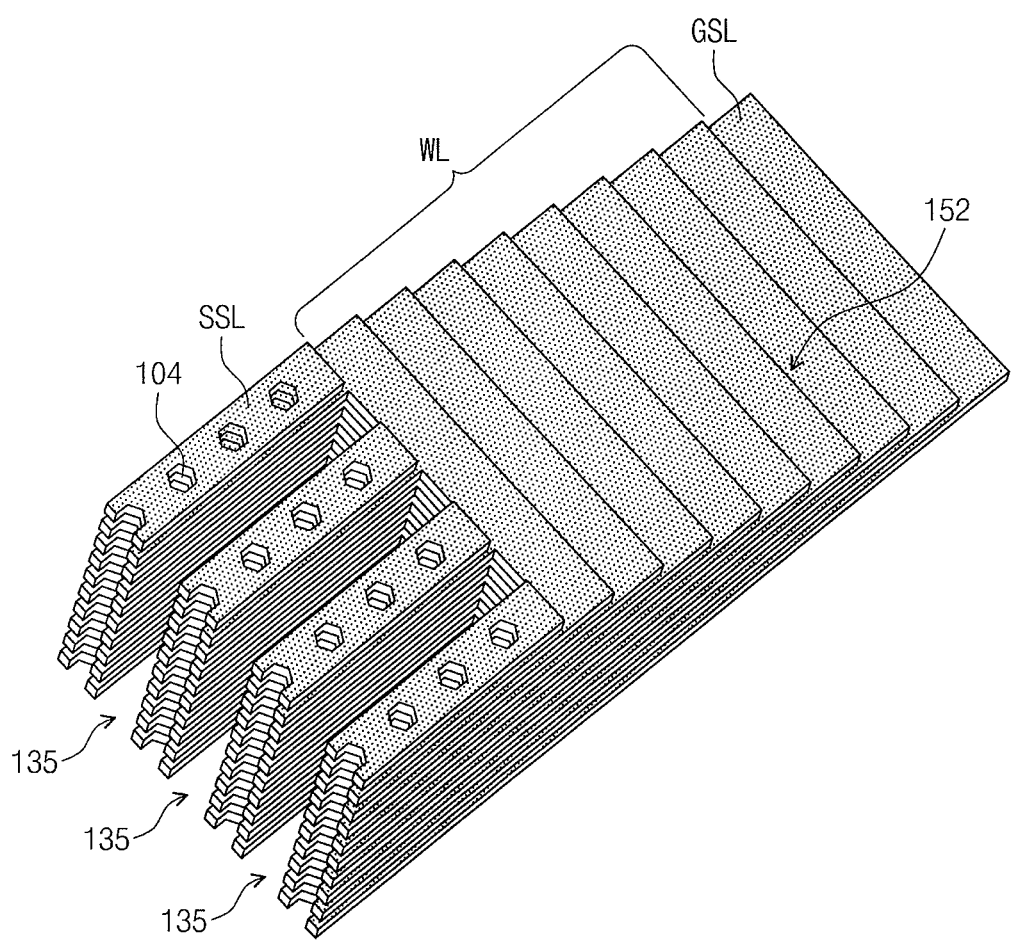

The gates 150 formed by the replacement process according to the present embodiment, as shown in FIG. 4G, may be formed in a stepped shape. A pad or contact region 152 may be defined in connection with each of the conductive patterns of the gates 150. In one example embodiment, the contact region 152 is an exposed portion of a gate 150, which is not covered by a neighboring upper gate 150 so that the contact region of the neighboring lower gate extends in a horizontal direction beyond the contact region of the neighboring upper gate. The pad or contact region 152 may provide a region to which a contact (160 of FIG. 4I) is connected in a subsequent process. In some embodiments, the uppermost gates 150 may form string selection lines SSL. The lowermost gates 150 may form a ground selection line GSL. Gates 150 between the GSL and SSL may form word lines WL.

Figure 4H:
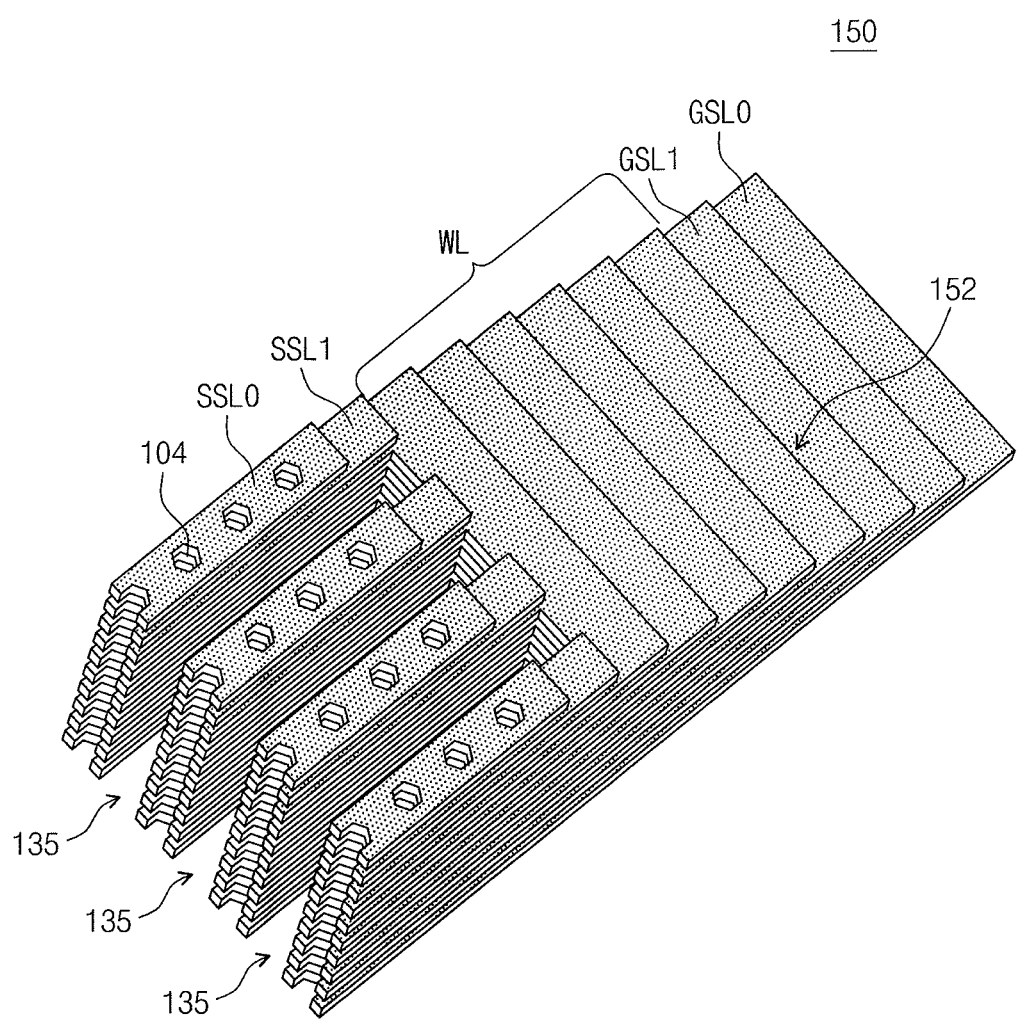

In another embodiment, when a word line cut 135 is formed such that the uppermost insulation layer 101 and sacrificial layer 103, and the insulation layer 101 and sacrificial layer 103 thereunder are separated from each other, as in the embodiment of FIG. 4D, the gates 150 may be formed as shown in FIG. 4H. In this case, a two-layered string selection lines SSL0 and SSL1 may be formed. Furthermore, two-layered ground selection lines GSL0 and GSL1 may be formed by electrically connecting lowermost two gates 150.

Figure 4I:
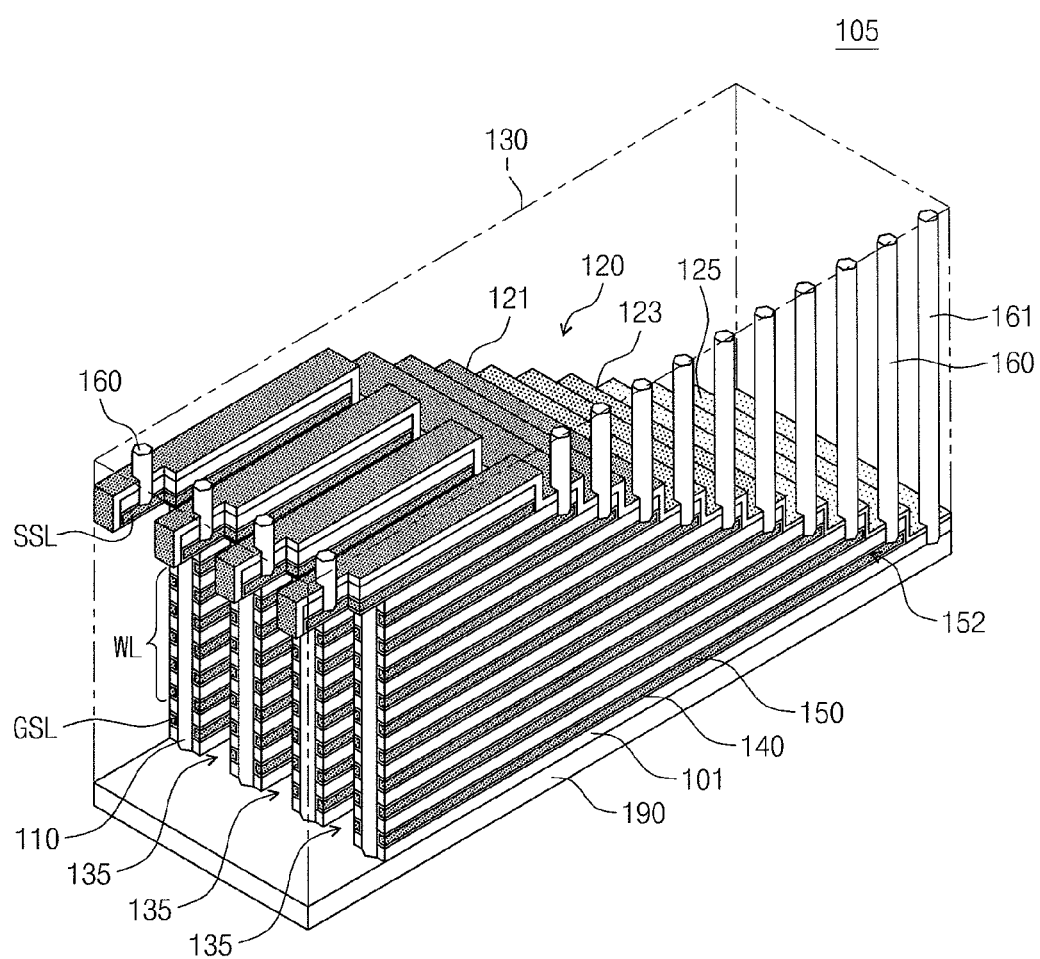

Referring to FIG. 4I, the word line cut 135 may be filled with an insulator, and a plurality of contacts 160 may be formed to be connected to the contact regions 152 of the gates 150 through the insulation layer 130. Selectively, a contact 161 may be further formed to be connected to a common source line formed in the semiconductor substrate 190. In order to facilitate the understanding of the inventive concept, the uppermost gate 150 forming the string selection line SSL is shown further laterally extended in FIG. 4I. In order to form the contacts 160 and 161, a plurality of contact holes may be formed to expose the pads 152 and the semiconductor substrate 190 by patterning the insulation layer 130. In this case, since the depths of the contact holes are different from each other, process defects can occur during their formation. This will be described with reference to FIGS. 4J and 4K.

Figure 4J:
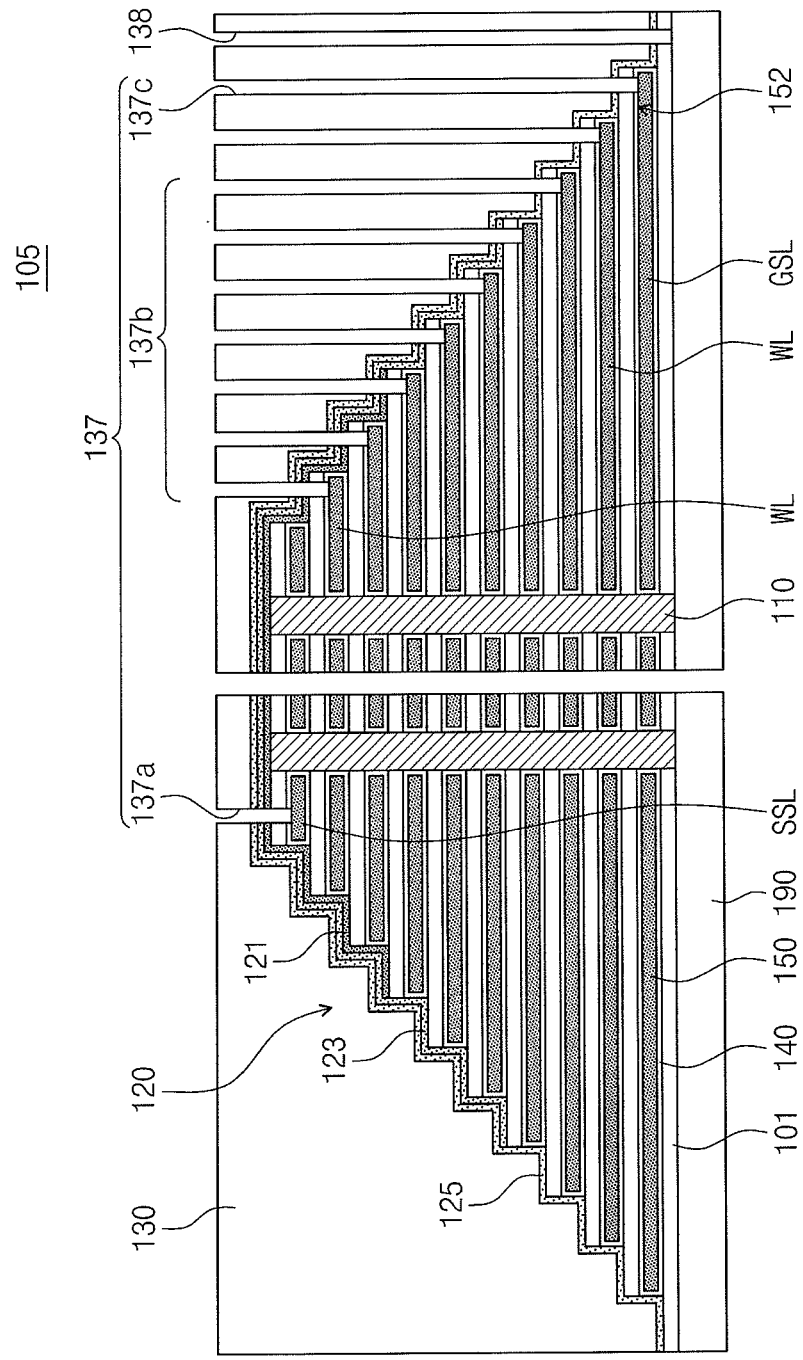
FIGS. 4J and 4K are cross-sectional views illustrating a method for fabricating a semiconductor device according to an embodiment of the inventive concept.
Figure 4K:
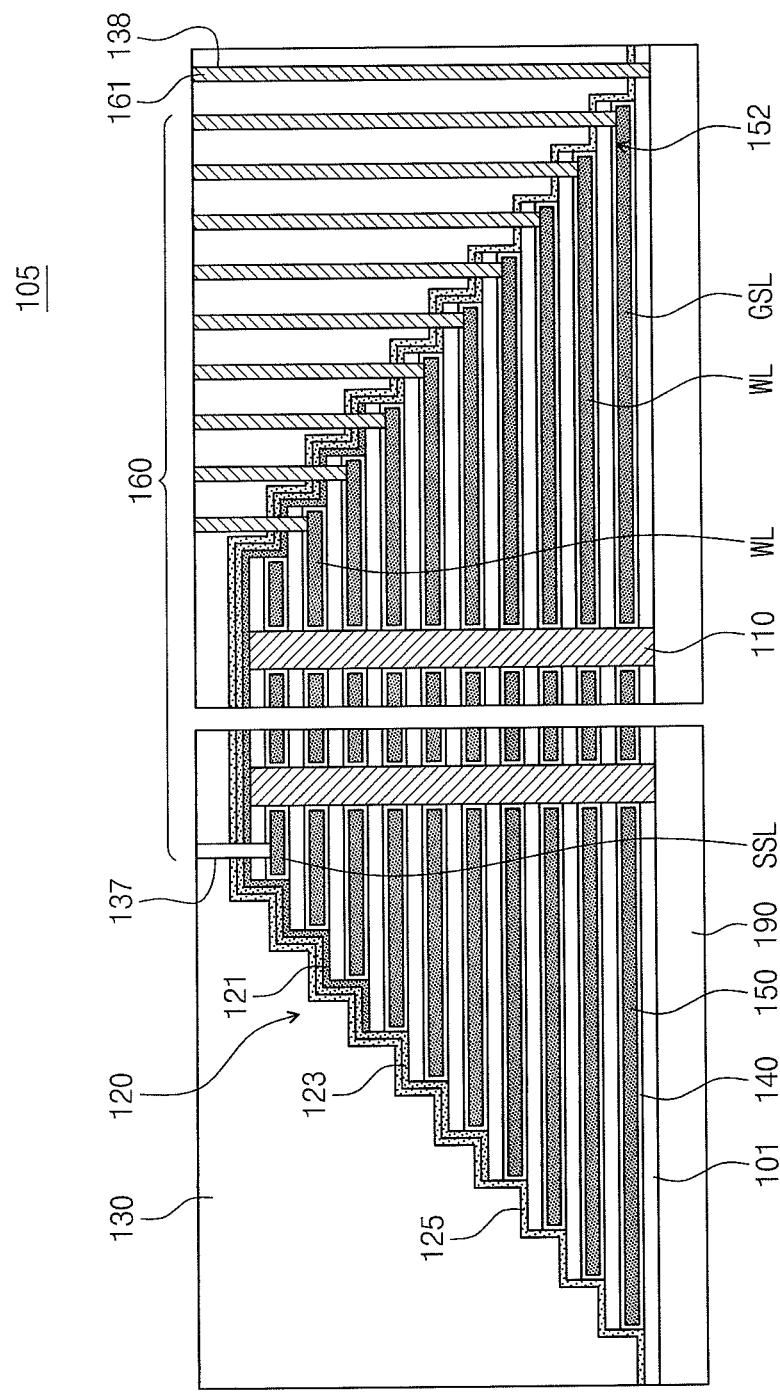

FIGS. 4J through 4K are cross-sectional views illustrating a method for fabricating a semiconductor device according to an embodiment of the inventive concept. In order to facilitate the understanding of the inventive concept, a step structure is illustrated at the right and left sides of the gate stack 105

Referring to FIG. 4J, a plurality of contact holes 137 may be formed to expose pads 152 by patterning the insulation layer 130, for example, by an anisotropic etching process. By-products such as materials of the etch stop layer 120 and the insulation layer 130 may remain in the contact hole 137. These by-products may be removed by an isotropic or anisotropic etching process. For convenience, the contact holes 137 may be grouped into a first contact hole 137a exposing a string selection line SSL, a second contact hole 137b exposing a word line WL, and a third contact hole 137c exposing a ground selection line GSL. Since the gates 150 are patterned in a step structure, the depths of the contact holes 137 may be different from each other. In one embodiment, the first contact hole 137a may have a smaller depth, the second contact hole 137b may have an intermediate depth, and the third contact hole 137c may have a greater depth. Accordingly, while the third contact hole 137c is being formed during an etching process of the insulation layer 130, the first contact hole 173a may continue to etch, eventually penetrate, the uppermost gate 150 to thereby be extended to the gate 150 thereunder. When a contact is formed in the first contact hole 137a that has been undesirably deepened by over-etching, there is a possibility that vertically adjacent gates 150 that are intended to be electrically insulated from each other are instead shorted. Although some of the contact holes 137 are formed at separate locations or times, the over-etching may not be fundamentally overcome. This limitation may be more seriously considered when the step number of the gates 150 increases and/or when a fourth contact hole 138 exposing the semiconductor substrate 190 is formed.

According to the present embodiment, since the etch stop layer 120 covers the pads 152, the over-etching limitation may be solved. According to an embodiment of the inventive concept, since the etch stop layer 120 includes a first section 121 of greater thickness, a second section 123 of intermediate thickness, and a third section 125 of smaller thickness in the order from the uppermost contact regions to the lowermost contact regions, different degrees of over-etching of the contact holes 137 having various depths may be effectively mitigated or eliminated. For example, since the third section 125 has a smaller thickness, the third contact hole 137c can fully reach the contact region 152 of the lowermost gate 150.

Referring to FIG. 4K, a plurality of contacts 160 connected to the gates 150 may be formed by filling the contact holes 137 with conductive materials such as copper or tungsten. A contact 161 connected to the semiconductor substrate 190 may be further formed. The semiconductor device 91 of FIG. 1A may be formed by forming a bit line connected to the vertical channel 110 and the metal line connected to the contact 160. In another embodiment, if the gates 150 has the same structure as FIG. 4H, the semiconductor device 91c of FIG. 2A may be formed.

Method Embodiment 2

Figure 7A:
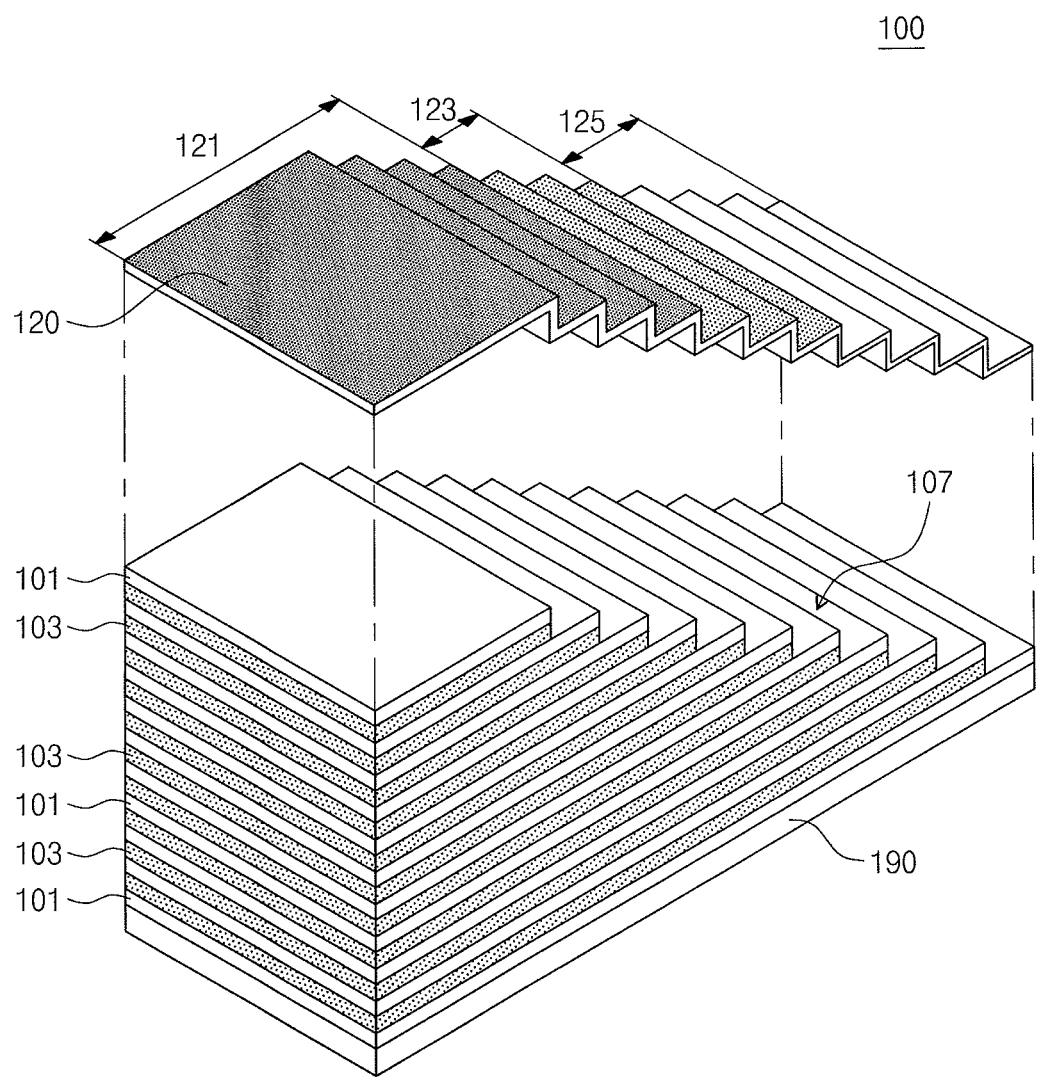
FIGS. 7A through 7C are perspective views illustrating a method for fabricating a semiconductor device according to an embodiment of the inventive concept.
Figure 7B:
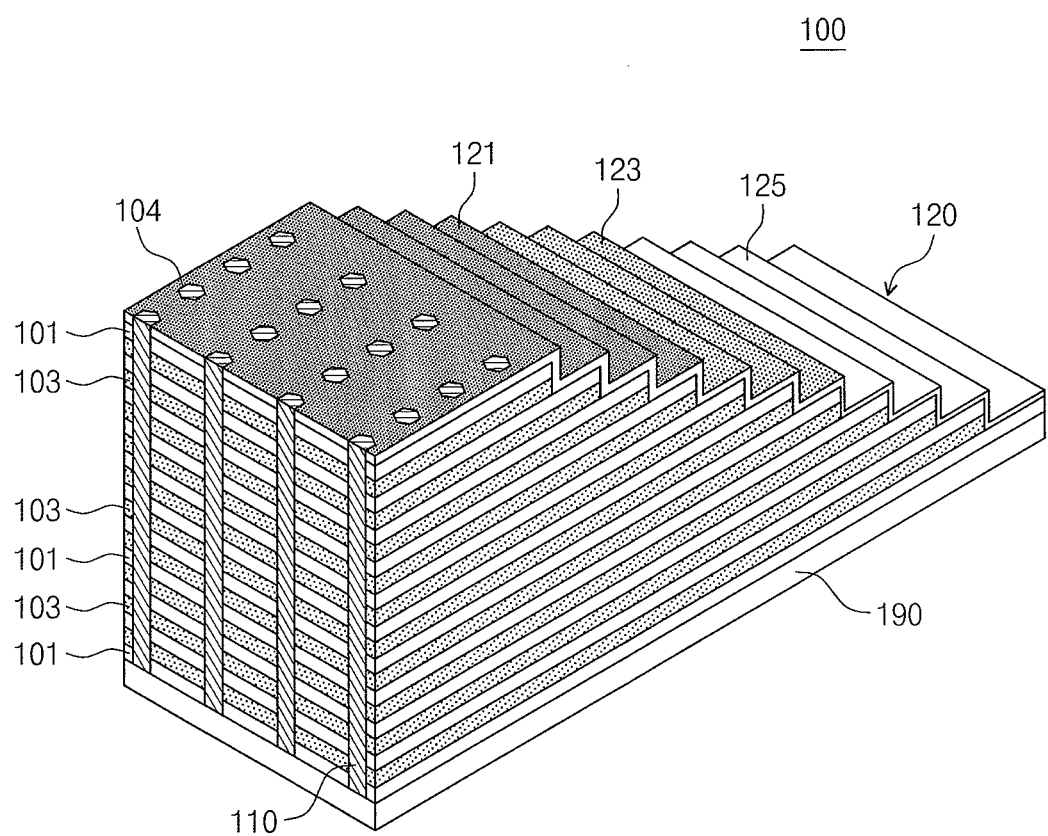
Figure 7C:
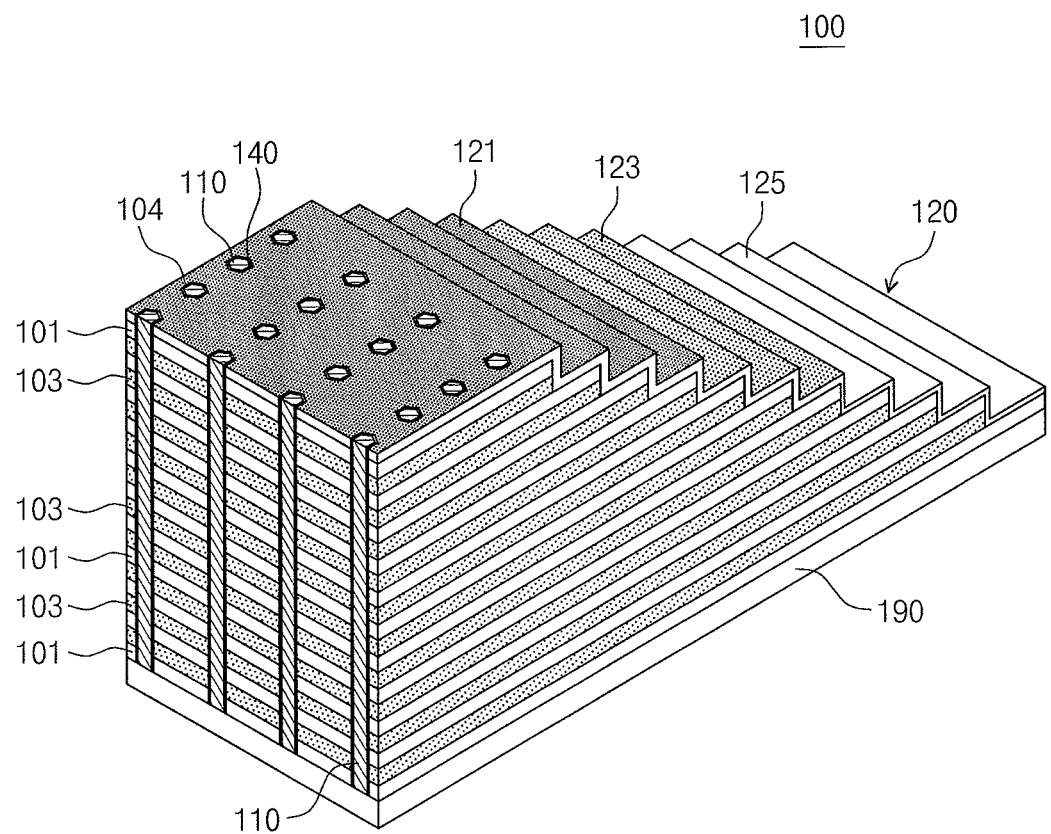

FIGS. 7A through 7C are perspective views illustrating a method for fabricating a semiconductor device according to an embodiment of the inventive concept. Referring to FIG. 7A, a mold stack 100, in which insulation layers 101 and sacrificial layers 103 are alternately and sequentially stacked, may be formed. The mold stack 100 may be patterned to form a step structure 107 on at least one side surface thereof. An etch stop layer 120 may be formed on the mold stack 100. The etch stop layer 120 may comprise a first section 121 of greater thickness, a second section 123 of intermediate thickness, and a third section 125 of smaller thickness in the order from an uppermost contact region 152 to a lowermost contact region 152. The step structure 107 and the etch stop layer 120 may be formed, for example, by the trim process described with reference to FIGS. 5A through 5T or the attach process described with reference to FIGS. 6A through 6J.

Referring to FIG. 7B, a plurality of vertical channels 110 may be formed after the step patterning process. In one embodiment, a channel hole 104 may be formed to vertically penetrate the first section 121 of the etch stop layer 120, the insulation layers 101, and the sacrificial layers 103, and then the channel hole 104 may be filled with a conductor to form the vertical channel 110 connected to the semiconductor substrate 190. Next, identically or similarly to the manner described with reference to FIGS. 4D through 4K, a word line cut process, a replacement process, and a contact process may be performed to form the semiconductor device 91 of FIG. 1A or the semiconductor device 91c of FIG. 2A.

In another embodiment, as shown in FIG. 7C, the information storage layer 140 may be formed on the sidewall of the channel hole 104, and then the vertical channel 110 may be formed. The information storage layer 140 may extend in the vertical direction along the sidewall of the vertical channel 110. The information storage layer 140, as shown in FIG. 1G, may include the tunnel insulation layer 141, the charge storage layer 143, and the blocking insulation layer 145. As shown in FIG. 1F, since a region that the information storage layer 140 occupies is unnecessary between the insulation layers 101, the height of the mold stack 100 may be reduced. Accordingly, the size of the semiconductor device can be reduced. The process for forming the information storage layer 140 in the channel hole 104 may also be applied to embodiments described with reference to FIGS. 4A through 4K.

Method Embodiment 3

Figure 8A:
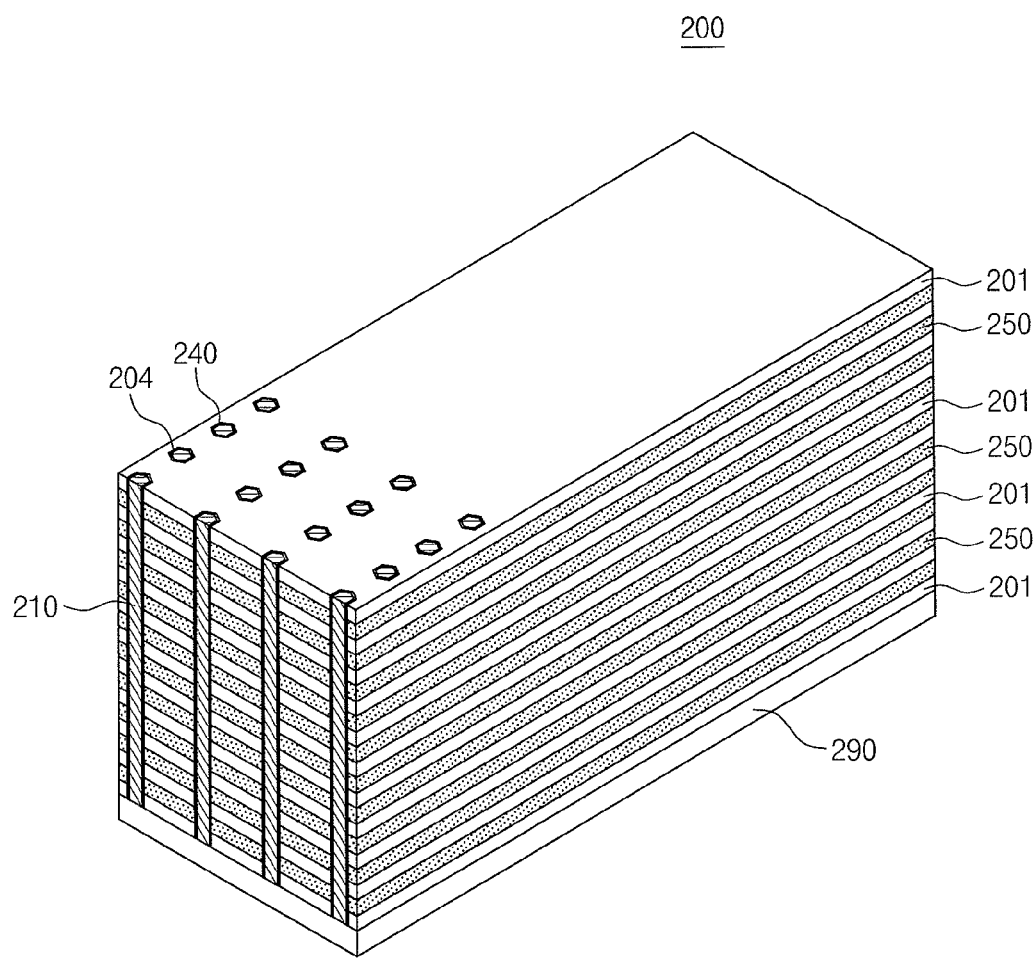
FIGS. 8A through 8F are perspective views illustrating a method for fabricating a semiconductor device according to an embodiment of the inventive concept.

FIGS. 8A through 8F are perspective views illustrating a method for fabricating a semiconductor device according to an embodiment of the inventive concept. Referring to FIG. 8A, a mold stack 200, in which a plurality of insulation layers 201 and conductive layers 250 are alternately and repeatedly stacked on a semiconductor substrate 290, may be formed. A plurality of channel holes 204 may be formed to vertically penetrate the mold stack 200 to expose the top surface of the semiconductor substrate 290. In one embodiment, the insulation layer 201 may be formed by depositing a silicon oxide layer or a silicon nitride layer, and the conductive layer 203 may be formed by depositing a silicon layer. An information storage layer 240 and a vertical channel 210 may be formed in the channel hole 204. The information storage layer 240, as shown in FIG. 3D, may include a charge storage layer, and may be formed to have a multi-layer structure that is vertically extended along the vertical channel 210. The vertical channel 210, as shown in FIG. 3C, may be formed to have a silicon bulk structure like FIG. 3C, or a macaroni structure like that shown in FIG. 3E.

Figure 8B:
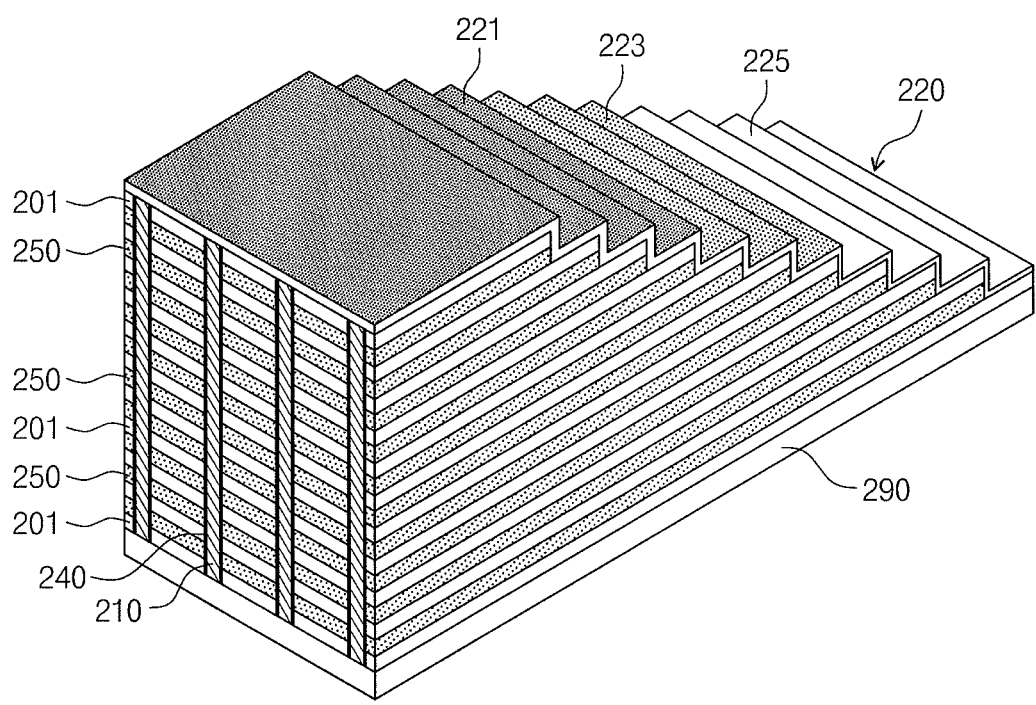

Referring to FIG. 8B, a step pattern process may be performed after the vertical channel formation process. For example, the mold stack 200 may be patterned to form a gate stack 205 in which conductive layers 250 are stacked in a stepped shape. Also, an etch stop layer 220, which covers the gate stack 205 and is divided into a first section 221 of greater thickness, a second section 223 of intermediate thickness, and a third section 225 of smaller thickness, may be formed. The step patterning process for forming the gate stack 205 and the process for forming the etch stop layer 220 may be formed, for example, by the trim process described with reference to FIGS. 5A through 5T or the attach process described with reference to FIGS. 6A through 6J.

Figure 8C:
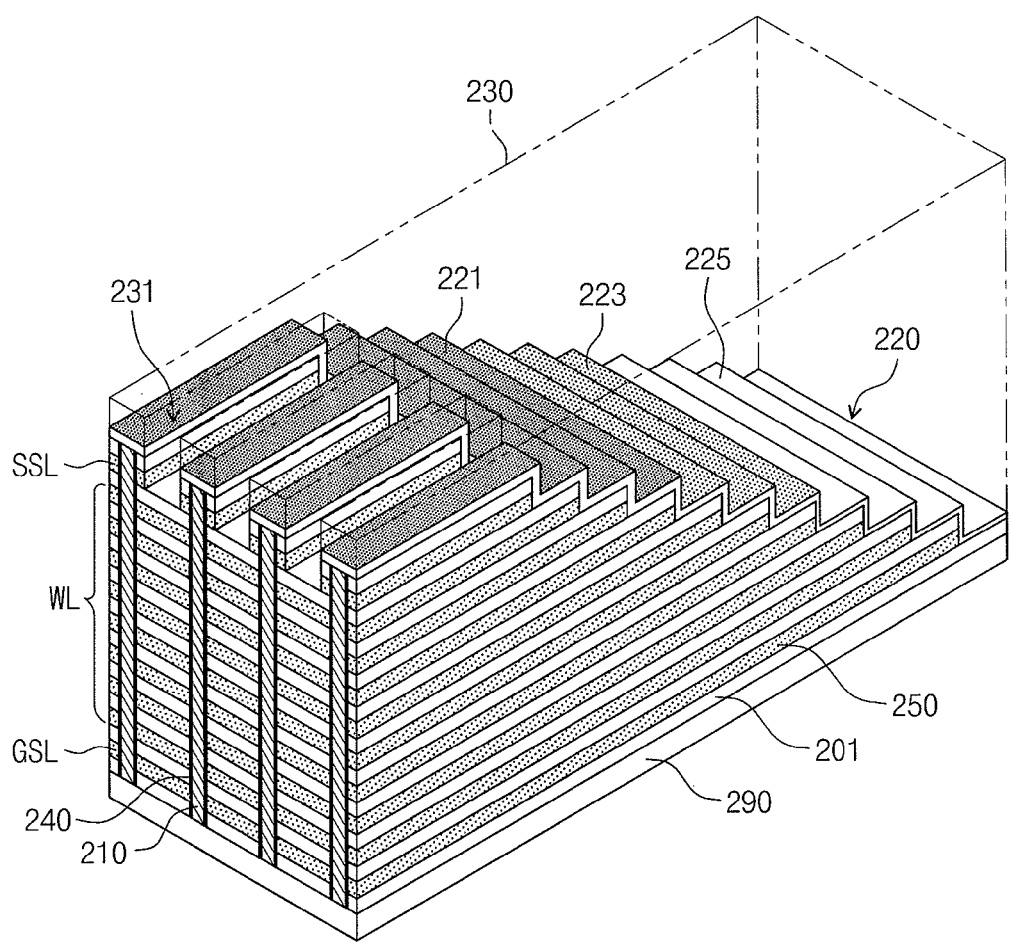

Referring to FIG. 8C, an insulation layer 230 may be formed on the gate stack 205, and then the gate stack 205 may be patterned, for example, by an anisotropic etching process to form the uppermost insulation layer 201 and conductive layer 250 (hereinafter, referred to as gate) in a line shape. The uppermost gate 250 may form a string selection line SSL of a line shape that is separated by an isolation region 231. The isolation region 231 may be filled with an insulator. When the uppermost insulation layer 201 and gate 250 are patterned, the first section 221 of the etch stop layer 220 may be patterned together. In another embodiment, the uppermost insulation layer 201 and gate 250, and the insulation layer 201 and conductive layer 250 thereunder may be patterned in a line shape.

Figure 8D:
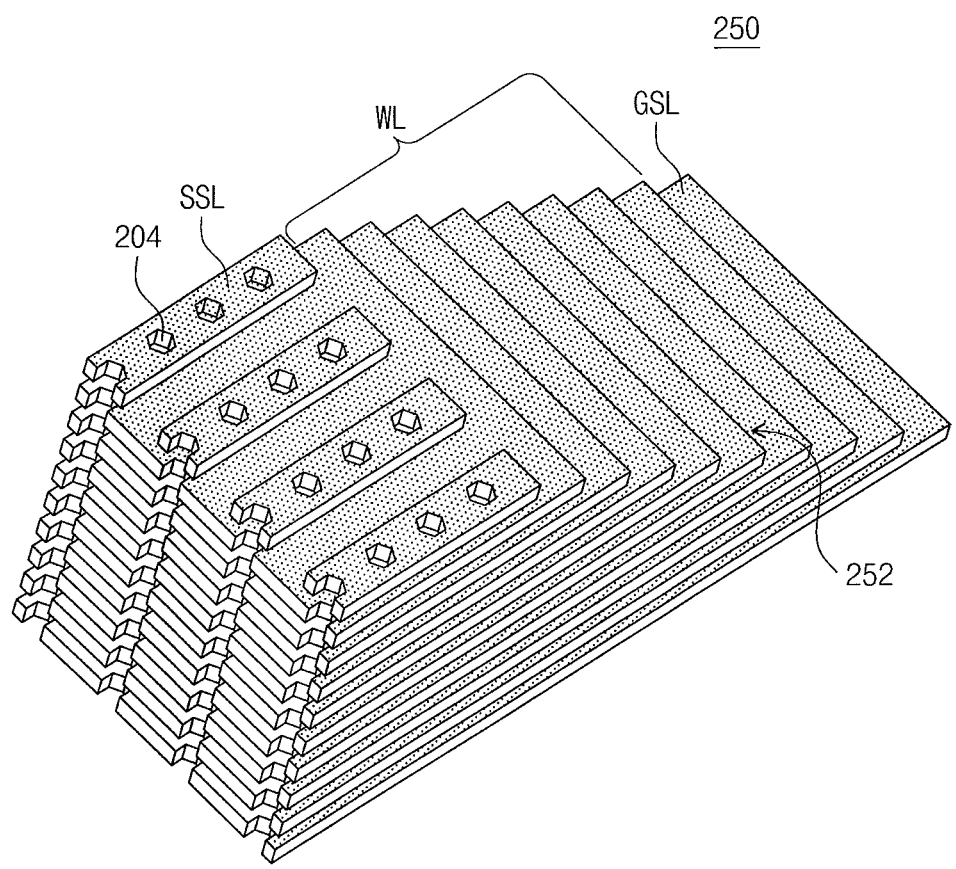
Figure 8E:
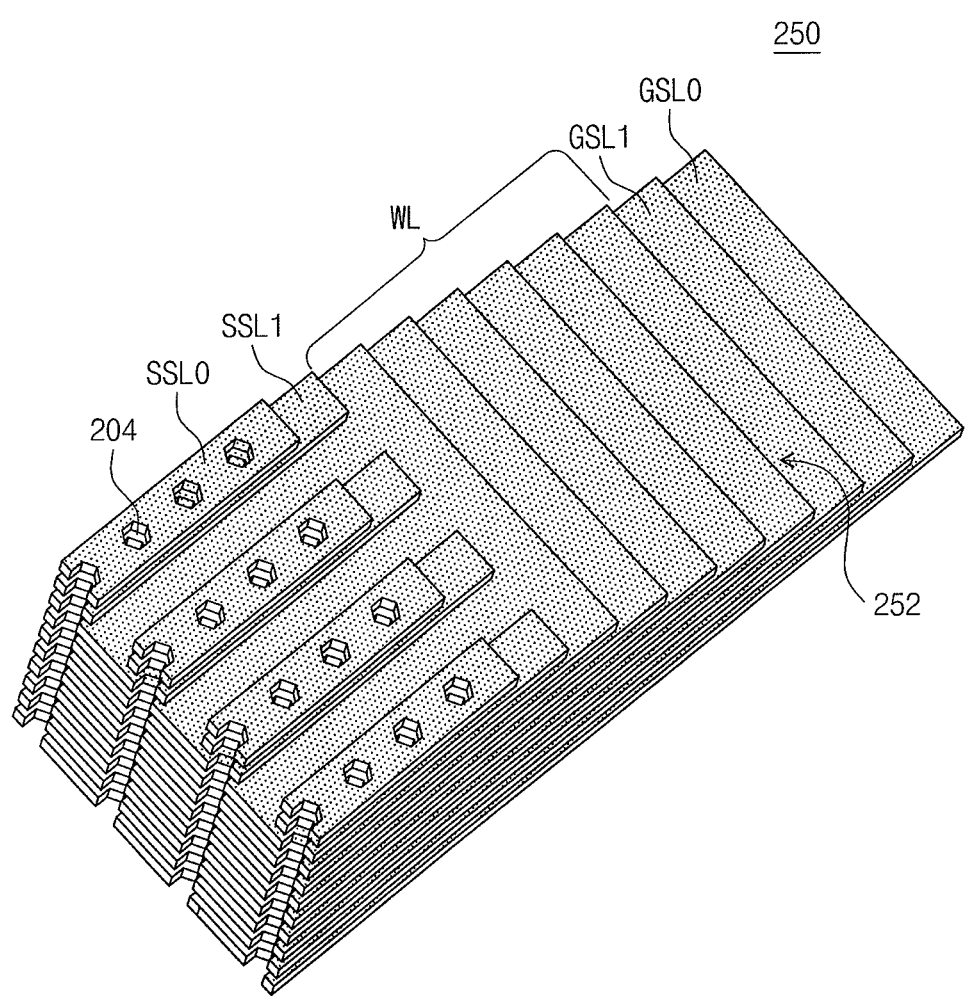

According to the example of the former, the gates 250 having pads, or contact regions 252, in which word lines WL are stacked in a stepped shape between one-layered string selection line SSL and one-layered ground selection line GSL, may be obtained as shown in FIG. 8D. According to the example of the latter, the gates 250 having pads, or contact regions, 252, in which word lines WL are stacked in a stepped shape between two-layered string selection line SSL0 and SSL1 and two-layered ground selection line GSL0 and GSL1, may be obtained, as shown in FIG. 8E.

Figure 8F:
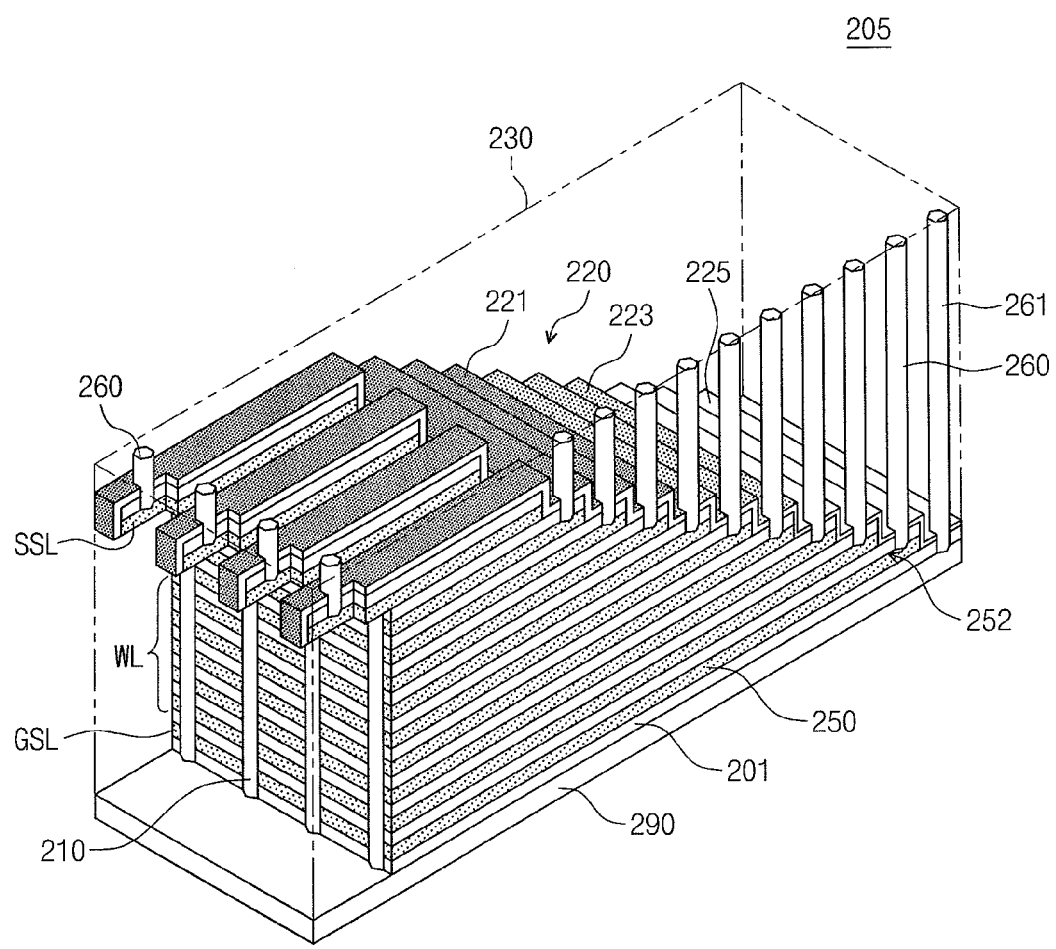

Referring to FIG. 8F, contacts 260 may be further formed to penetrate the insulation layer 230 to be connected to the pads 252 of the gates 250, and contacts 251 may be further formed to be selectively connected to the semiconductor substrate 290. When the contact holes are formed before the formation of the contacts 260 and 261, over-etching due to a depth difference may be effectively blocked by the etch stop layer 220 having different thickness distribution as described in FIGS. 4J and 4K. When bit lines and metal lines are further formed, a semiconductor device 92 identical or similar to that of FIG. 3A may be formed.

Method Embodiment 4

Figure 9A:
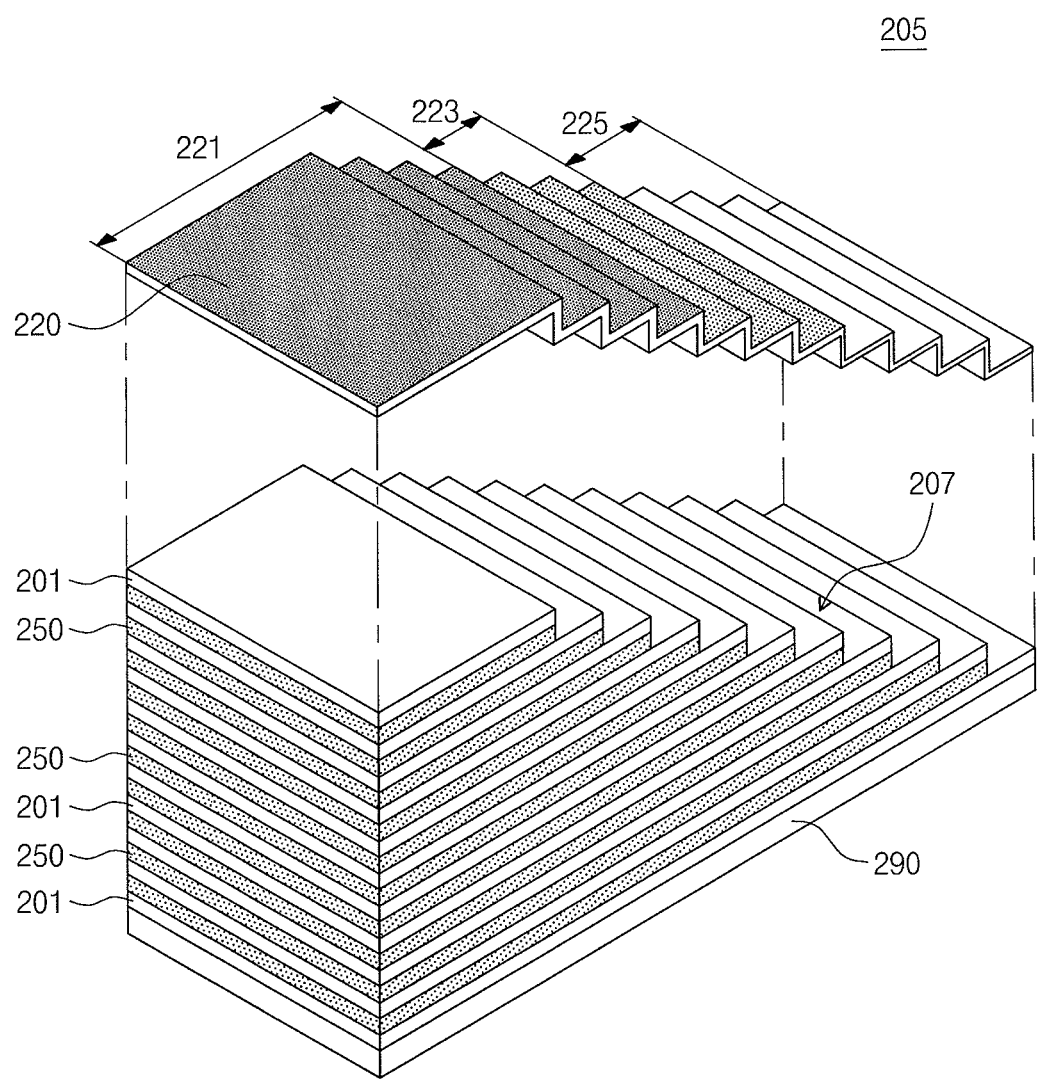
FIGS. 9A and 9B are perspective views illustrating a method for fabricating a semiconductor device according to an embodiment of the inventive concept.
Figure 9B:
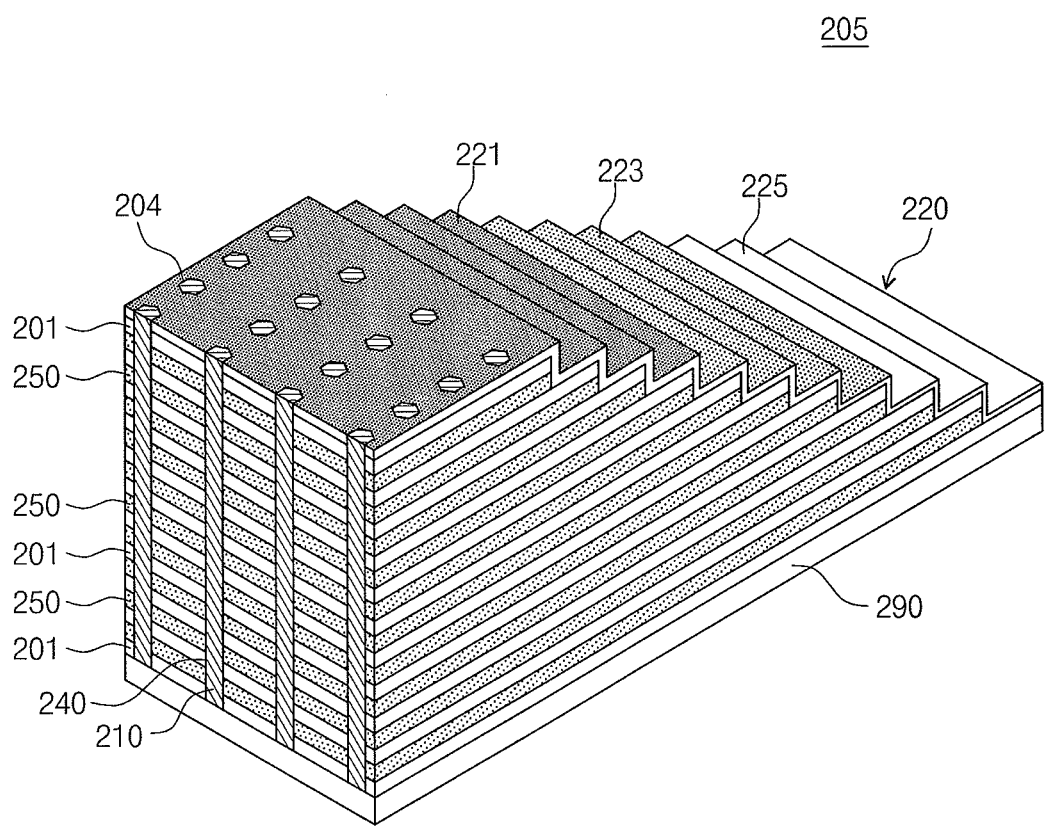

FIGS. 9A and 9B are perspective views illustrating a method for fabricating a semiconductor device according to an embodiment of the inventive concept. Referring to FIG. 9A, a plurality of insulation layers 201 and conductive layers 250 may be alternately and repeatedly stacked on a semiconductor substrate 290 to form a gate stack 205 having a step structure 207 on at least one side surface thereof may be formed. An etch stop layer 220 may be formed to cover the step structure 207. The etch stop layer 220 may be divided into a first section 221 of greater thickness, a second section 223 of intermediate thickness, and a third section 225 of smaller thickness. The step structure 207 and the etch stop layer 220 may be formed, for example, by the trim process described with reference to FIGS. 5A through 5T or the attach process described with reference to FIGS. 6A through 6J.

Referring to FIG. 9B, a vertical channel 210 may be formed after the step patterning process. In one embodiment, a plurality of channel holes 204 may be formed to penetrate the gate stack 205 covered with the etch stop layer 220 and expose the top surface of the semiconductor substrate 290. A plurality of vertical channels 210 may be formed in the channel holes 204, and information storage layers 240 may be formed to extend along the longitudinal direction of the vertical channels 210. Thereafter, identical or similarly to the processes described with reference to FIGS. 8C through 8F, a string selection line isolation process and a contact process may be performed to form a semiconductor device 92 of FIG. 3A.

<Application>

Figure 10A:
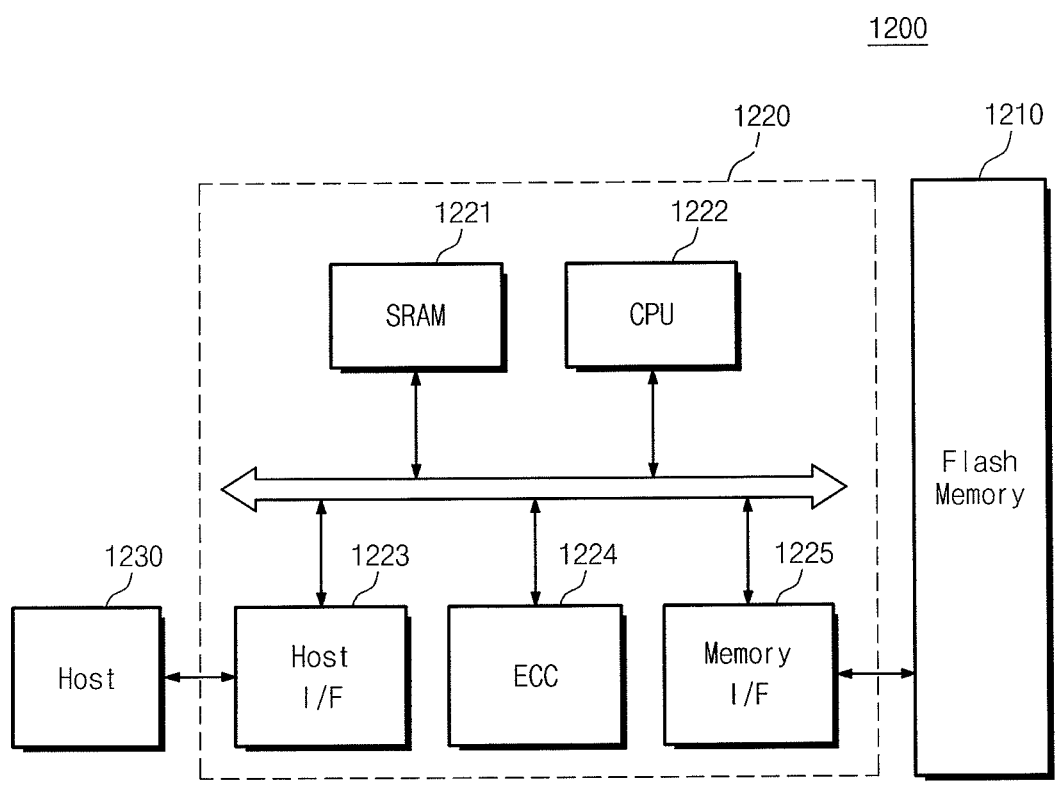
FIGS. 10A and 10B are block diagrams illustrating an application of a semiconductor device according to an embodiment of the inventive concept.

FIG. 10A is a block diagram illustrating a memory card including a semiconductor device according to an embodiment of the inventive concept.

Referring to FIG. 10A, a memory card 1200, which is to support high-capacity data storage ability, may include a flash memory 1210. The flash memory 1210 may include a semiconductor device, for example, a vertical NAND flash memory device according to an embodiment of the inventive concept.

The memory card 1200 may include a memory controller 1220 for controlling overall data exchanges between a host 1230 and a flash memory 1210. An SRAM 1221 may be used as an operating memory of a CPU 1222. A host interface 1223 may include a data exchange protocol of the host 1230 connected to the memory card 1200. An error correction code (ECC) 1224 may detect and correct an error included in data read from the flash memory 1210. A memory interface 1225 may interface with the flash memory 1210. The CPU 1222 may perform overall control operations for the data exchange of the memory controller 1220. Although not shown, the memory card 1200 may further include a ROM storing code data for interfacing with the host 1230.

Figure 10B:
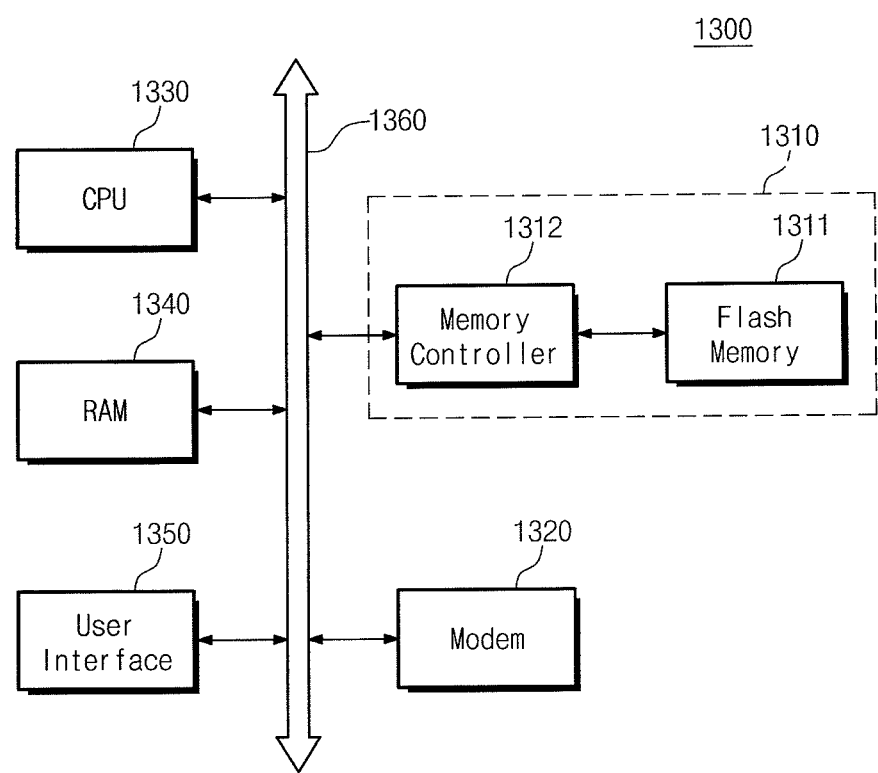

FIG. 10B is a block diagram illustrating an information processing system including a semiconductor device according to an embodiment of the inventive concept.

Referring to FIG. 10B, the information processing system 1300 according to an embodiment of the inventive concept may include a flash memory system 1310 including a semiconductor device according to the present embodiment, for example, a vertical NAND flash memory device. The information processing system 1300 may include mobile devices or computers.

In one embodiment, the information processing system 1300 may include a flash memory system 1310, and a modem 1320, a CPU 1330, a RAM 1340, and a user interface 1350 that are electrically connected to a system bus 1360, respectively. The flash memory system 1310 may store data processed by the CPU 1330 or data input from an external location. The information processing system 1300 may be provided to memory cards, solid state disks, camera image sensors, and other application chipsets. The flash memory system 1310 may be configured in solid state disks. In this case, the information processing system 1300 can store large-capacity data stably and reliably in the flash memory system 1310.

According to embodiments of the inventive concept, since word line pads, or contact regions of conductive patterns of the device, are covered by an etch stop layer having a different thickness distribution that is related to the relative depths of the pads, the risk of over-etching can be inherently prevented due to its different thicknesses. Accordingly, a process defect can be avoided, thereby improving device yield. Also, since the thickness of the etch stop layer becomes thicker as the height thereof increases, a word line pad process can be stably implemented even though the number of steps of a vertical cell increases.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of fabricating a memory device comprising:
providing a plurality of insulation layers on a substrate extending in a horizontal direction;
providing a plurality of conductive layers, each of at least two of the conductive layers between a neighboring lower insulation layer and a neighboring upper insulation layer;
providing a plurality of vertical channels of semiconductor material extending in a vertical direction through the plurality of insulation layers and the plurality of conductive layers;
providing a gate insulating layer between each of the at least two of the conductive layers and the vertical channels that insulates the at least two of the conductive layers from the vertical channels;
etching the at least two of the conductive layers to form at least two conductive patterns and conductive contact regions of the at least two of the conductive patterns, the conductive contact regions of the at least two of the conductive patterns being in a stepped configuration so that a contact region of a neighboring lower conductive pattern extends in the horizontal direction beyond a contact region of a neighboring upper conductive pattern; and providing an etch stop layer on the conductive contact regions, the etch stop layer having a first portion on a first one of the plurality of conductive patterns and having a second portion on a second one of the plurality of conductive patterns, wherein the first portion is of a thickness that is greater than a thickness of the second portion.

2. The method of claim 1 wherein etching each conductive layer comprises:

providing a first mask on the plurality of conductive layers and the plurality of insulation layers;

a first etching step comprising etching a first one of a plurality of the conductive layers using the first mask as an etch mask;

a first trimming step comprising trimming the first mask to expose an upper portion of the first one of the plurality of the conductive layers; and a second etching step comprising etching the first one of the plurality of the conductive layers and a second one of the plurality of the conductive layers using the trimmed first mask as an etch mask.

3. The method of claim 2 further comprising repeating the first trimming step and the second etching step to thereby etch further conductive layers of the plurality of conductive layers lying below the first one and the second one of the conductive layers.

4. The method of claim 2 further comprising:

providing a first etch stop layer on a first set of the conductive layers etched by the trimming and second etching steps;

providing a second mask on the first etch stop layer;

a third etching step comprising etching a third one of a plurality of the conductive layers using the second mask as an etch mask;

a second trimming step comprising trimming the second mask to expose an upper portion of the third one of the plurality of the conductive layers; and a fourth etching step comprising etching the third one of the plurality of the conductive layers and a fourth one of the plurality of the conductive layers using the trimmed first mask as an etch mask.

5. The method of claim 4 further comprising repeating the second trimming step and the fourth etching step to thereby etch further conductive layers of the plurality of conductive layers lying below the third one and the fourth one of the plurality of conductive layers.

6. The method of claim 5 further comprising: providing a second etch stop layer on the first etch stop layer and on a second set of the conductive layers etched by the second trimming and fourth etching steps.

7. The method of claim 6:

wherein portions of the first etch stop layer and second etch stop layer remain on the conductive contact regions of the first set of the conductive layers to provide the first portion of the etch stop layer; and wherein portions of the second etch stop layer remain on the conductive contact regions of the second set of the conductive layers to provide the second portion of the etch stop layer.

8. The method of claim 1 wherein etching each conductive layer comprises:

providing a first mask on the plurality of conductive layers and the plurality of insulation layers;

a first etching step comprising etching a first one of the plurality of the conductive layers using the first mask as an etch mask;

a first applying step comprising applying a first sidewall to the first mask and the first one of the plurality of conductive layers etched by the first etching step to form a second mask; and a second etching step comprising etching a second one of the plurality of the conductive layers lying below the first one of the plurality of conductive layers using the second mask as an etch mask.

9. The method of claim 8 further comprising repeatedly applying a sidewall to a most recent mask and to a most recently etched one of the plurality of conductive layers and etching an underlying one of the plurality of conductive layers using the sidewall and the most recent mask as an etch mask.

10. The method of claim 8 further comprising:

providing a first etch stop layer on a first set of the conductive layers etched by the first applying and second etching steps;

providing a second mask on the first etch stop layer;

a third etching step comprising etching a third one of the plurality of the conductive layers using the second mask as an etch mask;

a second applying step comprising applying a sidewall to the second mask and the third one of the plurality of conductive layers etched by the third etching step to form a third mask; and a fourth etching step comprising etching a fourth one of the plurality of the conductive layers lying below the third one of the plurality of conductive layers using the third mask as an etch mask.

11. The method of claim 10 further comprising repeatedly applying a sidewall to a most recent second mask and to a most recently etched one of the plurality of conductive layers and etching an underlying one of the plurality of conductive layers using the sidewall and the most recent second mask as an etch mask.

12. The method of claim 11 further comprising: providing a second etch stop layer on the first etch stop layer and on a second set of the conductive layers etched by the second applying and fourth etching steps.

13. The method of claim 12:

wherein portions of the first etch stop layer and second etch stop layer remain on the conductive contact regions of the first set of the conductive layers to provide the first portion of the etch stop layer; and wherein portions of the second etch stop layer remain on the conductive contact regions of the second set of the conductive layers to provide the second portion of the etch stop layer.

14. The method of claim 1 wherein the first one of the plurality of conductive patterns is at a layer above a layer of the second one of the plurality of conductive patterns.

15. The method of claim 1 wherein providing the etch stop layer comprises providing the first portion of the etch stop layer to include multiple layers and providing the second portion of the etch stop layer to include one or more layers, the number of layers of the second portion being fewer in number than the number of layers of the first portion.

16. The method of claim 1 further comprising:

providing an upper insulator on the conductive contact regions of the conductive patterns; and providing a plurality of vertical interconnects, each vertical interconnect contacting one of the conductive contact regions of the conductive patterns through the upper insulator and through the etch stop layer.

17. The method of claim 16 wherein the plurality of vertical interconnects contact conductive interconnect lines comprising word lines of the memory device.

18. The method of claim 1 wherein providing a plurality of the conductive layers comprises providing the conductive patterns of intermediate layers between an uppermost conductive pattern of the plurality of conductive patterns and a lowermost conductive pattern of the plurality of conductive patterns to each form a continuous plate.

19. The method of claim 1 wherein providing the plurality of conductive layers comprises providing the conductive patterns of intermediate layers between an uppermost conductive pattern of the plurality of conductive patterns a lowermost conductive pattern of the plurality of conductive patterns to each include a plurality of line portions that are connected to each other, each line portion being parallel to other line portions.

20. The method of claim 1 wherein providing a plurality of vertical channels precedes etching each conductive layer to form the conductive patterns.

21. The method of claim 1 wherein providing a plurality of vertical channels is performed subsequent to etching each conductive layer to form the conductive patterns.

22. The method of claim 1 wherein providing a conductive insulating layer comprises:

prior to providing the plurality of conductive layers:
providing a plurality of sacrificial layers on the substrate, each sacrificial layer between a neighboring lower insulation layer and a neighboring upper insulation layer;
providing the plurality of vertical channels extending in the vertical direction through the plurality of insulation layers and the plurality of sacrificial layers;
providing the plurality of vertical openings through the insulation layers and sacrificial layers between the vertical channels;
providing a first etching process to remove remaining portions of the sacrificial layers exposed by the vertical opening, the first etching process exposing portions of outer sidewalls of the plurality of vertical channels;
providing the conductive insulating layer on the outer sidewalls of the vertical channel; and
providing the plurality of conductive layers in the channel recesses of the vertical channel.

23. The method of claim 1 wherein providing the plurality of conductive layers comprises:
forming the conductive patterns of intermediate layers between an uppermost conductive pattern of the plurality of conductive patterns and a lowermost conductive pattern of the plurality of conductive patterns to each form a continuous plate; and
etching an uppermost conductive pattern of the plurality of conductive patterns to include a plurality of line portions that are connected to each other, each line portion being parallel to other line portions.

* * * * *